United States Patent
Roumi et al.

(10) Patent No.: US 9,658,292 B2
(45) Date of Patent: May 23, 2017

(54) SYSTEMS AND METHODS FOR DETECTING ABNORMALITIES IN ELECTRICAL AND ELECTROCHEMICAL ENERGY UNITS

(71) Applicant: California Institute of Technology, Pasadena, CA (US)

(72) Inventors: Farshid Roumi, Pasadena, CA (US); Jamshid Roumi, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 197 days.

(21) Appl. No.: 14/211,381

(22) Filed: Mar. 14, 2014

(65) Prior Publication Data

US 2014/0272500 A1    Sep. 18, 2014

Related U.S. Application Data

(60) Provisional application No. 61/782,657, filed on Mar. 14, 2013, provisional application No. 61/782,558, filed on Mar. 14, 2013.

(51) Int. Cl.
| | |
|---|---|
| *H01M 10/48* | (2006.01) |
| *G01R 31/36* | (2006.01) |
| *H01M 10/42* | (2006.01) |
| *G01R 29/08* | (2006.01) |
| *G01R 31/02* | (2006.01) |

(Continued)

(52) U.S. Cl.
CPC ....... *G01R 31/3627* (2013.01); *G01R 31/028* (2013.01); *G01R 31/3606* (2013.01); *H01M 10/4257* (2013.01); *H01M 10/48* (2013.01); *G01R 19/16542* (2013.01); *G01R 29/0814* (2013.01); *G01R 31/025* (2013.01); *G01R 31/3679* (2013.01); *H01G 11/14* (2013.01); *H01M 2010/4271* (2013.01)

(58) Field of Classification Search
None
See application file for complete search history.

(56) References Cited

U.S. PATENT DOCUMENTS

| | | | |
|---|---|---|---|
| 5,146,170 | A | 9/1992 | Ishikawa et al. |
| 5,298,346 | A | 3/1994 | Gyenes |
| 5,821,759 | A | 10/1998 | Scaman et al. |

(Continued)

FOREIGN PATENT DOCUMENTS

JP    2002008631 A    1/2002

OTHER PUBLICATIONS

International Preliminary Report on Patentability, International Patent Application PCT/US14/27577, Sep. 15, 2015, 25 pages.

(Continued)

*Primary Examiner* — Patrick Ryan
*Assistant Examiner* — Wyatt McConnell
(74) *Attorney, Agent, or Firm* — Lathrop & Gage LLP

(57) ABSTRACT

A method for abnormality detection in an energy unit includes passively detecting an abnormality in an energy unit by detecting electromagnetic radiation generated by the abnormality, the energy unit comprising at least one of an electrical energy unit and an electrochemical energy unit. A method for detecting an abnormality in an energy unit includes (a) applying a signal to the energy unit, (b) performing a plurality of measurements, at a respective plurality of different locations within the energy unit, of a response of the energy unit to the signal, and (c) processing the plurality of measurements to identify the abnormality.

19 Claims, 34 Drawing Sheets

(51) Int. Cl.
  *H01G 11/14* (2013.01)
  *G01R 19/165* (2006.01)

(56) References Cited

U.S. PATENT DOCUMENTS

| | | | |
|---|---|---|---|
| 6,229,305 B1 | 5/2001 | Logue | |
| 6,285,185 B1 | 9/2001 | Asjes | |
| 6,462,551 B1 | 10/2002 | Coates et al. | |
| 6,526,361 B1 | 2/2003 | Jones et al. | |
| 6,841,291 B2 | 1/2005 | Minamiura | |
| 7,088,075 B2 | 8/2006 | Baba et al. | |
| 7,834,620 B2 | 11/2010 | Kejik et al. | |
| 8,058,876 B2 | 11/2011 | Cernasov et al. | |
| 8,179,139 B2 | 5/2012 | Kawasumi et al. | |
| 8,334,699 B2 | 12/2012 | Asakura et al. | |
| 8,618,775 B2 | 12/2013 | Hermann et al. | |
| 2006/0061365 A1 | 3/2006 | Lee | |
| 2008/0042654 A1 | 2/2008 | Kato | |
| 2008/0272742 A1 | 11/2008 | Hart et al. | |
| 2009/0140742 A1 | 6/2009 | Koch et al. | |
| 2010/0036285 A1 | 2/2010 | Govari et al. | |
| 2010/0253373 A1 | 10/2010 | Kawashima | |
| 2010/0324746 A1 | 12/2010 | Jeong | |
| 2011/0060538 A1 | 3/2011 | Fahimi et al. | |
| 2011/0074432 A1 | 3/2011 | Tinnemeyer | |
| 2011/0187377 A1 | 8/2011 | Boysen et al. | |
| 2011/0316553 A1 | 12/2011 | Taguchi et al. | |
| 2012/0019238 A1 | 1/2012 | Eichardt et al. | |
| 2012/0077095 A1 | 3/2012 | Roumi et al. | |
| 2012/0107680 A1 | 5/2012 | Amiruddin et al. | |
| 2012/0148880 A1 | 6/2012 | Schaefer et al. | |
| 2012/0316814 A1 | 12/2012 | Rahaman et al. | |
| 2013/0017432 A1 | 1/2013 | Roumi | |
| 2013/0057288 A1 | 3/2013 | Ogata et al. | |
| 2013/0069661 A1 | 3/2013 | Rich et al. | |
| 2013/0162258 A1 | 6/2013 | Patin et al. | |
| 2013/0189592 A1 | 7/2013 | Roumi et al. | |
| 2013/0224632 A1 | 8/2013 | Roumi | |
| 2013/0229156 A1 | 9/2013 | Brandon et al. | |
| 2013/0253715 A1 | 9/2013 | Cho et al. | |
| 2013/0295439 A1 | 11/2013 | Masarapu et al. | |
| 2015/0171398 A1 | 6/2015 | Roumi | |
| 2015/0180000 A1 | 6/2015 | Roumi | |
| 2016/0013463 A1 | 1/2016 | Roumi et al. | |

OTHER PUBLICATIONS

International Search Report and Written Opinion, International Patent Application PCT/US14/27577, Jul. 18, 2014, 27 pages.

Kim et al. (Jun. 9-10, 2009) "Lithium-Ion Battery Safety Study Using Multi-Physics Internal Short-Circuit Model," *National Renewable Energy Laboratory*. In; The $5^{th}$ Intl. Symposium on Large Lithium-Ion Battery Technology and Applications in Conjunction with ABBC09. Long Beach, California.

Keyser et al. (Jan.-Sep. 2010) "Numerical and Experimental Investigation of Internal Short Circuits in a Li-Ion Cell," In; 2011 DOE Hydrogen and Fuel Cells Program, and Vehicle Technologies Program Annual Merit Review and Peer Evaluation.

U.S. Appl. No. 14/975,336, filed Dec. 18, 2015.

Extended European Search Report dated Oct. 12, 2016, corresponding to European Patent Application No. 14768974.9.

SYSTEMS AND METHODS FOR DETECTING ABNORMALITIES IN ELECTRICAL AND ELECTROCHEMICAL ENERGY UNITS

CROSS REFERENCE TO RELATED APPLICATION

The present application claims the benefit of priority from U.S. Provisional Application No. 61/782,558, filed Mar. 14, 2013, and U.S. Provisional Application No. 61/782,657, filed Mar. 14, 2013, both of which are incorporated herein by reference in their entireties.

BACKGROUND

This invention is in the field of electrical and electrochemical devices for storing or harnessing energy. This invention relates generally to management of such devices to reduce the severity of consequences of abnormalities occurring or existing in the devices. Batteries are a prominent example of a type device to which this invention relates.

As battery technology development has progressed, the use of batteries, particularly rechargeable batteries, as a power source has increased substantially. Batteries are used as power sources for a wide array of devices including relatively low-power devices, such as consumer electronics devices, and higher-power devices, such as electric cars. Lithium ion batteries are the most widely used form of rechargeable battery. An Achilles heel of lithium ion batteries is the risk of an electrical short developing inside a lithium ion battery cell and the consequences associated therewith. An electrical short may cause rapid heating of the battery cell. In the matter of seconds, the local temperature at the location of the short may rise to temperatures sufficient to set the battery on fire. This is particularly worrisome in the case of high-capacity lithium ion battery systems, such as those used in electric cars. To reduce the danger associated with electrical shorts and other abnormalities in lithium ion batteries, some battery systems use a battery management system for monitoring the state of charge and/or the state of health of the battery system. Monitoring is typically based upon measurements of properties such as the terminal voltage of the battery system and/or the temperature of the battery system.

SUMMARY

The present invention provides methods and systems for detecting abnormalities in energy devices, such as electrochemical cells, capacitors, solar panels, and arrays, units and systems comprising such energy devices, to ensure the energy devices possess an adequate state of safety or state of health such that continued operation of the energy devices does not result in the development of a dangerous, hazardous or otherwise unsafe condition. If such an abnormality is detected, safety measures can be undertaken to take the energy device exhibiting the abnormality offline or otherwise place the energy device in a safe or inert condition, such as by exposing the energy device to a coolant. Methods and systems of the invention optionally employ a technique where a signal, such as an electric, magnetic or electromagnetic signal, is generated by the energy device upon development of an abnormality, such as an electrical short circuit or sudden release of current, and the signal is detected by a sensor, such as a pickup coil. Methods and devices of the invention optionally employ a technique where a signal, such as an electric, magnetic or electromagnetic signal, is applied directly or indirectly to the energy device, and an electrical condition of the energy unit that changes in response to the signal is sensed, such as a change in voltage, current, capacitance, inductance, resistance or impedance, to allow for detection of an abnormality in the energy device.

In an embodiment, a method for abnormality detection in an energy unit includes passively detecting an abnormality in an energy unit by detecting electromagnetic radiation generated by the abnormality, the energy unit comprising at least one of an electrical energy unit and an electrochemical energy unit.

In an embodiment, a system for detecting an abnormality in an electrical or electrochemical energy unit includes a sensor for generating a sensor signal in response to electromagnetic radiation and a processing module for processing the sensor signal to isolate a signal feature indicative of the abnormality.

In an embodiment, an energy storage system with abnormality detection capability includes at least one energy storage device for generating electricity from stored energy, wherein the stored energy is at least one of electrical energy and chemical energy, and a sensor for generating a sensor signal in response to electromagnetic radiation generated by an electrical abnormality in the energy storage system.

In an embodiment, a method for detecting an abnormality in an energy unit includes (a) applying a signal to the energy unit, (b) performing a plurality of measurements, at a respective plurality of different locations within the energy unit, of a response of the energy unit to the signal, and (c) processing the plurality of measurements to identify the abnormality.

In an embodiment, a system for detecting an abnormality in an energy unit includes a transmitter unit for applying a signal to the energy unit, a plurality of sensing units for performing a respective plurality of measurements of properties of the energy unit, and a processing module for processing the plurality of measurements to identify the abnormality.

In an embodiment, an energy storage system with abnormality detection capability includes (a) a plurality of energy storage devices for generating electricity from stored energy, the stored energy being at least one of electrical energy and chemical energy, (b) an interface for receiving an electrical signal, and (c) a plurality of electrical sensing units, positioned at a respective plurality of different locations within the energy storage system, for performing measurements of properties of the energy storage system, the electrical measurements indicative of a response to the electrical signal.

In a first aspect, provided are methods for abnormality detection in an energy unit. A method of this aspect comprises the steps of passively detecting an abnormality in an energy unit by detecting electromagnetic radiation generated by the abnormality, the energy unit comprising at least one of an electrical energy unit and an electrochemical energy unit. In an embodiment, the step of detecting electromagnetic radiation comprises generating a sensor signal in response to the electromagnetic radiation; and processing the sensor signal to isolate a signal feature indicative of the abnormality in the energy unit. In an embodiment, the electromagnetic radiation is generated by the abnormality upon occurrence of the abnormality. Optionally, methods of this aspect further comprise measuring properties of the energy unit, such as one or more of temperature, voltage, resistance, current, capacitance, impedance, magnetic susceptibility, pressure, and response of the energy unit to an applied electrical signal, to detect the abnormality. In an embodiment, for example, a method of this aspect comprises passively detecting the abnormality in less than 10 milliseconds after occurrence of the abnormality.

The methods, devices and systems described herein are useful for detection of abnormalities in a variety of systems. In embodiments, for example, each of the electrical energy unit and the electrochemical energy unit comprise at least one of an energy storage system and an energy harnessing system. Optionally, the energy unit comprises at least one of an electrochemical cell, a capacitor cell, an ultra-capacitor cell, a flow battery, and a fuel cell. Optionally, the energy unit comprises a plurality of electrically connected energy storage devices. Optionally, each of the plurality of electrically connected energy storage devices is at least one of an electrochemical cell, a capacitor cell, an ultra-capacitor cell, a flow battery, and a fuel cell. Optionally, the energy unit comprises at least a portion of a battery system in a vehicle.

The methods, devices and systems described herein are useful for detection of a variety of abnormalities. In an embodiment, for example, the step of passively detecting the abnormality comprises passively detecting a short in an energy storage device in the energy unit. In a specific embodiment, the step of passively detecting the abnormality comprises passively detecting a short in an electrical connection in the energy unit. In a specific embodiment, the step of passively detecting the abnormality comprises passively detecting a change in state of health of the energy unit.

The methods, devices and systems described herein optionally include detection of signal features indicative of an abnormality. In a specific embodiment, the signal feature is a single pulse. In another embodiment, the signal feature comprises one or more pulses, each having a duration less than 100 microseconds. In a specific embodiment, the signal feature comprises one or more pulses, each having a duration less than 10 milliseconds. Optionally, the signal feature comprises a non-repetitive signal.

Methods, devices and systems of various embodiments the invention advantageously provide the ability to spatially locate the abnormality. Such a technique offers benefits of being able to selectively determine which of a plurality of energy devices in an energy unit or system is experiencing an abnormality, such as a short or a change in state of health. In certain embodiments, methods of the invention further comprise spatially locating the abnormality. For example, in one embodiment, the step of passively detecting the abnormality comprises sensing electromagnetic radiation at a plurality of different locations to generate a respective plurality measurements; and the step of spatially locating comprises comparing the plurality of measurements. Optionally, the step of spatially locating further comprises utilizing information about configuration of the energy unit. For various embodiments, the step of sensing comprises measuring a magnitude of the electromagnetic radiation at the plurality of different locations. In an exemplary embodiment, the step of sensing comprises measuring, at the plurality of different locations, magnitudes of the electromagnetic radiation; and deducing information about direction of electrical current generating the electromagnetic radiation.

In a specific embodiment, methods of the invention comprising a step of passively detecting the abnormality comprise sensing the electromagnetic radiation at only one location. In an embodiment, for example, the step of sensing comprises sensing the electromagnetic radiation at only one location using a sensor sensitive to electromagnetic radiation generated from electrical current of arbitrary direction.

Methods, devices and systems described herein optionally include components and techniques for generating sensor signals in response to electromagnetic radiation generated by an abnormality. In one embodiment, such a generating step comprises generating an electrical signal induced by the electromagnetic radiation. For example, in one embodiment, the electrical signal is induced by the electromagnetic radiation in at least one pickup coil. Optionally, the electrical signal is induced by the electromagnetic radiation in at least one magnetically sensitive detector.

Advantageously, methods, devices and systems of the invention allow for abnormally operating devices to be located, isolated and/or rendered into a safe configuration, such as a configuration where heat generated within the abnormally operating device does not pose a risk of fire. In a specific embodiment, for example, methods of this aspect comprise steps of communicating detection of the abnormality to a control unit for the energy unit; and invoking a control measure to at least a portion of the energy unit associated with the abnormality, such as a control measure to cool the energy unit, a control measure to take the energy unit off-line or a control measure to discharge the energy unit.

Optionally, methods of this aspect further comprise steps of generating a second sensor signal, in response to the abnormality, using at least one sensor electrically connected with the energy unit. Optionally, a step of processing the sensor signal to isolate a signal feature indicative of the abnormality comprises processing the sensor signal and the second sensor signal to isolate the signal feature.

In another aspect, the present invention provides systems for detecting an abnormality in an energy unit. A specific embodiment of this aspect comprises a sensor for generating a sensor signal in response to electromagnetic radiation; and a processing module for processing the sensor signal to isolate a signal feature indicative of the abnormality. Sensors useful with the systems, devices and methods include sensors that are magnetically sensitive, such that the sensor signal is magnetically induced by electromagnetic radiation generated by an abnormality. In a specific embodiment, the sensor comprises at least one pickup coil. Optionally, the pickup coil comprises a planar pickup coil. Optionally, the pickup coil comprises a non-planar pickup coil. In one embodiment, a non-planar pickup coil is useful for generation of a sensor signal in response to electromagnetic radiation generated from electrical current of arbitrary direction, making such a non-planar pickup coil useful for detection of abnormalities anywhere in an energy unit. Optionally, sensors useful with the systems, devices and methods of the invention comprise at least one toroidal inductor.

For various systems, devices and methods of the invention, a plurality of sensing units are used together to detect signals indicative of an abnormality in an energy unit. In one embodiment, the sensor comprises a plurality of sensing units positioned at a respective plurality of different locations for generation of a respective plurality of components of the sensor signal. In a specific embodiment, for example, the processing module comprises a processor and instructions for, when executed by the processor, analyzing the plurality of components to determine the location of the electrical abnormality. Optionally, the instructions comprise information about a configuration of the energy unit and the sensor, such as a spatial arrangement of components of the energy unit and a spatial arrangement of the sensor(s) relative to the components of the energy unit. Optionally, one or more of the plurality of sensing units comprise a pickup coil. Optionally, one or more of the plurality of sensing units comprise a planar pickup coil. Optionally, one or more of the plurality of sensing units comprise a toroidal inductor.

For various systems, devices and methods of the invention, electrical sensors are used to detect an abnormality in an energy unit. For example, in one embodiment a system of this aspect further comprises an electrical sensor, electrically connected with the energy unit, for detecting an electrical signal generated by the abnormality and generating a second sensor signal in response to detection of the electric signal; and wherein the processing module includes instructions for processing the sensor signal and the second sensor signal to identify the abnormality. Optionally, the sensor comprises a plurality of sensing units positioned at a respective plurality of different locations and the electrical sensor comprises a plurality of electrical sensing units positioned at a respective plurality of different locations, with the processing module comprising instructions for processing the sensor signal and the second sensor signal to locate the abnormality.

In some method, system and device embodiments, transmitter units are utilized to apply a signal, such as electromagnetic radiation, an electric field or a magnetic field, to an energy unit to induce formation of a signal feature, amplify an abnormality or otherwise allow an abnormality to be detected. For example, one system embodiment further comprises a transmitter unit for applying a signal to the energy unit to induce formation of the signal feature. Optionally, the transmitter unit is electrically connected with the energy unit and the signal comprises an electrical signal. Optionally, the transmitter unit comprises an emitter of electromagnetic radiation and the signal comprises electromagnetic radiation. In a specific embodiment, the sensor comprises at least one sensing unit for sensing electromagnetic radiation and the transmitter unit comprises one or more of the sensing units, such as a pickup coil.

Optionally, devices, systems and methods of the invention utilize wireless transmission of data between a sensor signal and a processing module to allow the processing module to be remotely located from an energy unit and/or sensor. For example, a specific system embodiment further comprises circuitry for wirelessly transmitting the sensor signal to the processing module.

In another aspect, the present invention provides an energy storage system with abnormality detection capability. One embodiment of such a system comprises at least one energy storage device for generating electricity from stored energy, the stored energy being at least one of electrical energy and chemical energy; and a sensor for generating a sensor signal in response to electromagnetic radiation generated by an electrical abnormality in the energy storage system. In a specific embodiment, the energy storage system comprises a battery for a vehicle. For example, in one embodiment the energy storage system comprises a lithium ion battery. Optionally, the energy storage device of such an energy storage system comprises an electrolytic battery cell. Optionally, the energy storage system comprises a plurality of energy storage devices with each of the plurality of energy storage devices comprising one or more battery cells. Optionally, the energy storage devices comprise one or more capacitor cells and/or one or more ultra-capacitor cells. In a specific embodiment, each energy storage device independently comprises a plurality of energy storage devices, with each of the plurality of energy storage devices comprising a capacitor cell or an ultra-capacitor cell.

For various systems and devices of the invention, the sensors used to detect abnormalities in an energy device or energy storage system include those capable of detecting electrical and/or magnetic signals. For example, in one energy storage system embodiment, the sensor comprises at least one magnetically sensitive sensing unit, such that the sensor signal is magnetically induced by electromagnetic radiation. For example, in an embodiment, each magnetically sensitive sensing unit independently comprises a pickup coil, such as a planar pickup coil or a non-planar pickup coil. In one embodiment, the pickup coil is non-planar and is useful for generating a sensor signal in response to electromagnetic radiation generated from electrical current of arbitrary direction. Optionally, the pickup coil comprises a planar pickup coil. Optionally, a magnetically sensitive unit is positioned on an energy storage device. Optionally, a magnetically sensitive sensing unit comprises a toroidal inductor.

Optionally, a plurality of magnetically sensitive sensing units is utilized with the devices, systems an methods of the invention. In one embodiment, a plurality of magnetically sensitive sensing units are positioned at a respective plurality of different locations, with the sensor signal comprising spatial location information about the electrical abnormality.

Optionally, energy storage systems of the invention further comprise a housing, with at least a portion of one or more magnetically sensitive sensing units being implemented in the housing. Optionally, least one magnetically sensitive sensing unit is positioned at an energy storage device or system, such as on a surface of the energy storage device or system or on a surface of the housing of the energy storage device or system. Optionally, a magnetically sensitive sensing unit is positioned at an electrical connection to an energy storage device or is positioned in electrical communication with the energy storage device. Optionally, a plurality of magnetically sensitive sensing units comprise a first set of magnetically sensitive sensing units and a second set of magnetically sensitive sensing units, the first set of magnetically sensitive units having different spatial separation than the second set of magnetically sensitive units, such as a greater or lesser spatial separation. Such a configuration advantageously allows for flexibility in the fabrication of the systems and devices of the invention.

Optionally, devices, systems and methods of the invention utilize wireless transmission of data between a sensor signal and a remote system to allow a processing module to be remotely located from the system and/or sensor. For example, a specific system embodiment further comprises circuitry for wirelessly transmitting the sensor signal to a remote system. Optionally, the remote system comprises a processing module for processing the sensor signal to identify the abnormality.

Various embodiments of the systems, methods and devices of the invention utilize electrical sensors electrically connected with an energy storage device for detecting an electrical signal generated by an abnormality. For example, one energy storage system embodiment further comprises an electrical sensor, electrically connected with the at least one energy storage device, for detecting an electrical signal generated by the abnormality. Optionally, a sensor comprises a plurality of sensing units positioned at a respective plurality of different locations and the electrical sensor comprises a plurality of electrical sensing units positioned at a respective plurality of different locations.

In embodiments, an energy storage system further comprises a transmitter, such as a transmitter unit for generating a signal to induce formation of the sensor signal. In one embodiment, the transmitter unit is electrically connected to the energy storage device, and the signal is an electrical signal. Optionally, the transmitter unit comprises an emitter of electromagnetic radiation, and the signal comprises electromagnetic radiation. Optionally, the sensor comprises at least one sensing unit for sensing electromagnetic radiation and the transmitter unit comprises one or more of the sensing units. In an embodiment, for example, an energy storage system further comprises at least one electrical sensing unit, electrically connected with the at least one energy storage device, for measuring an electrical property of the energy storage system.

In another aspect, provided are additional methods for detecting an abnormality, such as an abnormality in an energy unit. A specific method embodiment of this aspect comprises the steps of applying a signal to the energy unit; performing a plurality of measurements, at a respective plurality of different locations within the energy unit, of a response of the energy unit to the signal; and processing the plurality of measurements to identify the abnormality. Optionally, the step of applying comprises applying an electrical signal to the energy unit. Optionally, the step of applying comprises applying electromagnetic radiation to the energy unit. In embodiments, the step of performing a plurality of measurements is performed by a plurality of sensors, and the step of applying is performed by at least one of the plurality of sensors.

A specific method of this aspect further comprises invoking a control measure to at least a portion of the energy unit associated with the abnormality. Control measures useful with the devices, systems and methods of the invention include, but are not limited to measures to take one or more energy units off-line, measures to cool one or more energy units, measures to discharge one or more energy units and control measures to one or more components of an energy unit.

Optionally, for certain method embodiments of this aspect, the step of performing a plurality of measurements comprises performing a plurality of electrical measurements of electrical properties using a respective plurality of sensors electrically connected with portions of the energy unit different from the plurality of sensors. For example, in one embodiment, the step of performing a plurality of measurements further comprises performing at least one measurement selected from the group of temperature, magnetic susceptibility, and pressure.

Optionally, an abnormality is identified in less than 10 milliseconds after occurrence of the abnormality.

In various embodiments, the unit comprises an electrical energy storage system, an electrochemical energy storage system, an electrical energy harnessing system, an electrochemical energy harnessing system, any plurality of these or any combination of these. In specific embodiments, the energy unit comprises one or more of an electrochemical cell, a capacitor cell, an ultra-capacitor cell, a flow battery, a fuel cell, any plurality of these or any combination of these. In an embodiment, the energy unit comprises a plurality of electrically connected energy storage devices, each of the plurality of electrically connected energy storage devices comprising at least one of an electrochemical cell, a capacitor cell, an ultra-capacitor cell, a flow battery, and a fuel cell. In an exemplary embodiment, the energy unit comprises at least a portion of a battery system in a vehicle.

Optionally, the abnormality comprises a short in an energy storage device in the energy unit. Optionally, the abnormality comprises a short in an electrical connection in the energy unit. Optionally, the abnormality comprises a change in state of health of the energy unit.

Methods of this aspect optionally comprise spatially locating the abnormality. For example in one embodiment, the step of processing comprises spatially locating the abnormality. Optionally, the step of spatially locating comprises utilizing information about configuration of the energy unit, such as a spatial arrangement of components of the energy unit or a wiring configuration of components of the energy unit.

In another embodiment, the invention provides systems for detecting an abnormality in an energy unit. A specific embodiment of such a system comprises a transmitter unit for applying a signal to the energy unit; a plurality of sensing units for performing a respective plurality of measurements of electrical properties of the energy unit; and a processing module for processing the plurality of measurements to identify the abnormality. Optionally, the plurality of sensing units comprises a plurality of electrical sensing units, electrically connected with the energy unit, for measuring an electrical property of the energy unit. For example, in one embodiment, the plurality of sensing units further comprises at least one electromagnetic sensing unit for sensing electromagnetic radiation. In one embodiment, for example, the plurality of sensing units comprise at least one electromagnetic sensing unit for sensing electromagnetic radiation. In various embodiments, the transmitter unit is one of the plurality of sensing units.

In some embodiments, the processing module comprises a processor and instructions for, when executed by the processor, analyzing the plurality of measurements to determine the location of the abnormality. Optionally, the instructions comprise information about at least one of configuration of the plurality of sensing units and configuration of the energy unit.

A specific system embodiment further comprises at least one sensor for performing a second measurement of a property of the energy unit, the property being selected from the group of temperature, magnetic susceptibility, and pressure, the processing module comprising instructions for processing the second measurement and the plurality of measurements to identify the abnormality.

Optionally, a system embodiment further comprises a control unit communicatively coupled with the processing module for controlling the energy system at least partially according to abnormality identification by the processing module. In one embodiment, for example, the control unit is communicatively coupled with the transmitter unit for controlling transmission of the signal to the energy unit.

Optionally, devices, systems and methods of the invention utilize wireless transmission of data between a sensing unit and a processing module. One system embodiment, for example, further comprises circuitry for wirelessly transmitting signals from at least a portion of the plurality of electrical sensing units to the processing module.

In another embodiment, an energy storage system with abnormality detection capability comprises a plurality of energy storage devices for generating electricity from stored energy, the stored energy comprising at least one of electrical energy and chemical energy; an interface for receiving an electrical signal; and a plurality of sensing units, positioned at a respective plurality of different locations within the energy storage system, for performing measurements of properties of the energy storage system, the measurements indicative of a response to the electrical signal. In an embodiment, for example, the plurality of sensing units comprise a plurality of electrical sensing units electrically connected with at least a portion of the plurality of energy storage devices, the measurement comprising electrical measurements, and the properties of the energy storage system comprising electrical properties. Optionally, the plurality of electrical sensing units are each capable of independently measuring at least one of current, voltage, and resistance. Optionally, the plurality of sensing units further comprises at least one electromagnetic sensing unit for sensing electromagnetic radiation. Optionally, the plurality of sensing units comprises a plurality of electromagnetic sensing units for sensing electromagnetic radiation.

In embodiments, an energy storage system comprises a battery for a vehicle. In embodiment, an energy storage device comprises one or more lithium ion batteries. In an embodiment, an energy storage device comprising one or more electrolytic battery cells. In an embodiment, an energy storage device comprises one or more capacitor cells. In an embodiment, an energy storage device comprises one or more ultra-capacitor cells.

The present invention further provides additional methods for detecting an abnormality in an energy unit or an energy system or an energy device. A specific method of this aspect comprises the steps of exposing the energy unit, energy system or energy device to an electromagnetic signal; and measuring an electrical signal induced in the energy unit, energy system or energy device by the electromagnetic signal, thereby detecting the abnormality. Optionally, the abnormality comprises a short circuit in the energy unit, energy system or energy device, a state of health of the energy unit, energy system or energy device or a change in state of health of the energy unit, energy system or energy device.

Optionally, the electromagnetic signal comprises one or more of an electric field, a magnetic field or an electromagnetic field. In a specific embodiment, the step of exposing the unit, device or system to an electromagnetic signal comprises passing a current through a transmitter or applying a voltage to a transmitter, the transmitter positioned proximate to the energy unit, device or system for receiving the electromagnetic signal. In a specific embodiment, the transmitter comprises one or more pickup coils. Optionally, the passing step comprises passing one or more current pulses through the transmitter or applying one or more voltage pulses to the transmitter.

In embodiments, a magnitude of the current passed through the transmitter or a magnitude of the voltage applied to the transmitter has a functional dependence on a distance of the transmitter from the energy unit, energy system or energy device. In embodiments, a magnitude of the current passed through the transmitter or a magnitude of the voltage applied to the transmitter has a functional dependence on an electric property of the energy unit, energy system or energy device.

In an exemplary embodiment, the exposing step results in a detectable change in an electrical property of the energy unit, energy system or energy device. For example, in an embodiment, the electrical signal comprises a change in an electrical property of the energy unit, energy system or energy device. Optionally, the electric property of the energy unit, energy system or energy device comprises one or more of an inductance, an impedance, a resistance, a capacitance, a voltage, a permeability and a permittivity.

In an exemplary embodiment, the energy unit, energy system or energy device comprises an electrochemical cell. In a specific embodiment, the abnormality comprises a short circuit between two or more components of the electrochemical cell. Optionally, the abnormality comprises a short circuit between an anode current collector of the electrochemical cell and a cathode current collector of the electrochemical cell. Optionally, the abnormality comprises a short circuit between an anode active material of the electrochemical cell and the cathode current collector. Optionally, the abnormality comprises a short circuit between the anode current collector and a cathode active material of the electrochemical cell. Optionally, the abnormality comprises a short circuit between the anode active material and the cathode active material.

In one embodiment, the measuring step comprising measuring the electrical signal induced in the energy unit, energy system or energy device using one or more of an inductance measuring device, an impedance measuring device, a resistance measuring device, a capacitance measuring device, a voltage measuring device, a permeability measuring device and a permittivity measuring device.

In an exemplary embodiment, the exposing step comprises generating the electromagnetic signal having a frequency selected from the range of 1 kHz to 10 GHz. In one embodiment the measuring step comprises measuring the electrical signal induced in the energy unit in 10 milliseconds or less after the exposing step.

Optionally, the energy unit, energy system or energy device is in an operational condition during the exposing and measuring steps. For example, in an embodiment, the operational condition comprises a condition where the energy unit, energy system or energy device is generating an electric current or receiving an applied electric current.

Optionally, the energy unit, energy system or energy device is in a non-operational condition during the exposing and measuring steps. For example, in an embodiment, the non-operational condition comprises an open circuit condition.

Methods of this aspect are optionally useful during manufacturing of an energy unit, energy system or energy device. In one embodiment, the energy unit, energy system or energy device is in a state of partial manufacture during the exposing and measuring steps. In another embodiment, however, the energy unit, energy system or energy device is in a state of completed manufacture during the exposing and measuring steps.

For various of the above devices, systems and methods, the electromagnetic signals are optionally generated by a second energy unit, energy system or energy device proximate to the energy unit, energy system or energy device that is being investigated for an abnormality. Such a configuration allows for flexibility in the devices systems and methods of the invention, such as by allowing an energy unit, energy system or energy device of known operational, non-abnormal or good state of health to act as a inducer or sensor for other proximate energy units, energy systems or energy devices.

Without wishing to be bound by any particular theory, there can be discussion herein of beliefs or understandings of underlying principles relating to the invention. It is recognized that regardless of the ultimate correctness of any mechanistic explanation or hypothesis, an embodiment of the invention can nonetheless be operative and useful.

DETAILED DESCRIPTION

Figure 1:
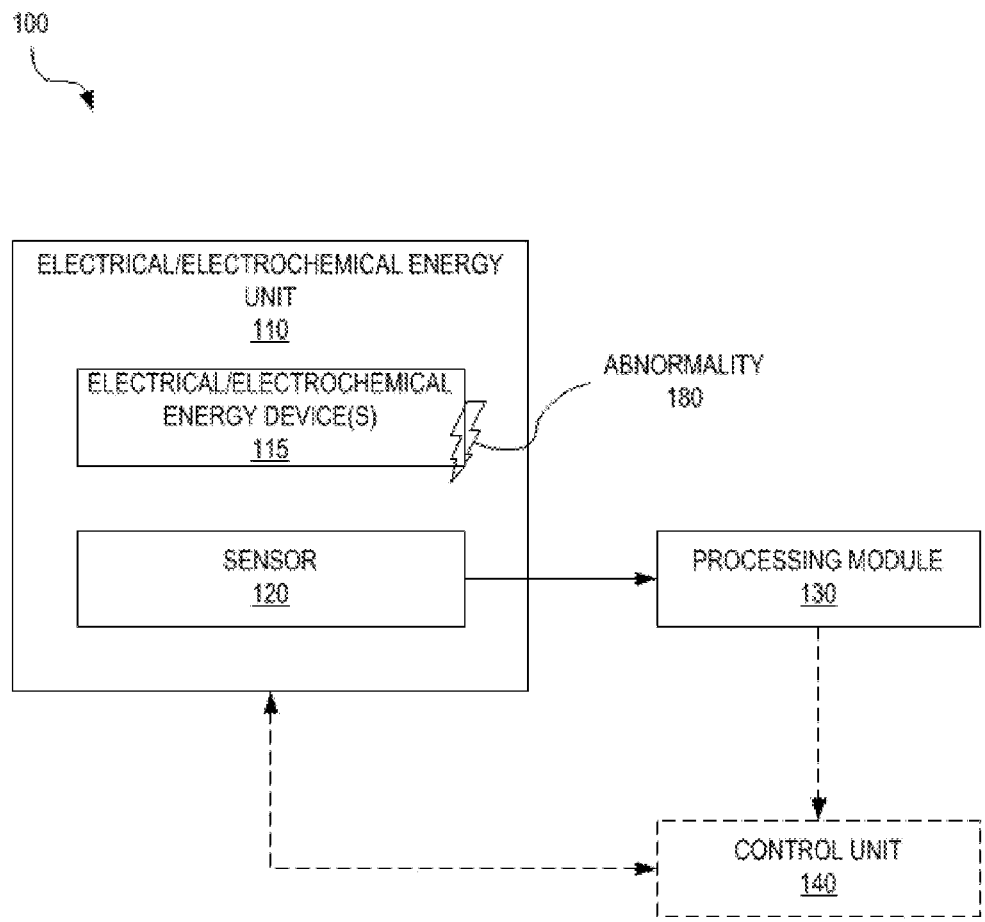
FIG. 1 illustrates an electrical/electrochemical energy system with abnormality detection capability, according to an embodiment.

In general the terms and phrases used herein have their art-recognized meaning, which can be found by reference to standard texts, journal references and contexts known to those skilled in the art. The following definitions are provided to clarify their specific use in the context of the invention.

The terms "electrochemical energy device", "electrochemical energy unit", and "electrochemical energy systems" refer to a device, unit, or system, respectively, capable of converting chemical energy into electrical energy, or electrical energy into chemical energy. Electrochemical energy devices include, but are not limited to, primary batteries, secondary batteries, electrolysis systems, fuels cells, electrochemical capacitors, ultracapacitors, flow batteries, part solid part fluid electrochemical cells, metal-air batteries such as lithium air batteries and zinc-air batteries, and metal-aqueous batteries such as lithium-water batteries and semi-solid batteries. An electrochemical unit or system is a unit or system that includes at least one electrochemical device, and may include a plurality of electrochemical devices, optionally connected in series, parallel, or a combination thereof. Electrochemical devices, units, and systems may be electrochemical devices, units, and systems for providing electrical energy to a vehicle.

The terms "electrical energy device", "electrical energy unit", and "electrical energy systems" refer to a device, unit, or system, respectively, capable of harnessing energy by converting it to electrical energy, and/or storing electrical energy. Electrical energy devices include, but are not limited to, capacitors and photovoltaic devices. An electrical unit or system is a unit or system that includes at least one electrical device, and may include a plurality of electrical devices, optionally connected in series, parallel, or a combination thereof. Electrical devices, units, and systems may be electrical devices, units, and systems for providing electrical energy to a vehicle.

The terms "electrical/electrochemical energy device", "electrical/electrochemical energy unit", and "electrical/electrochemical energy systems" refer to a device, unit, or system, respectively, which includes an electrical energy device and/or an electrochemical energy device.

The terms "energy device", "energy unit", and "energy system" refers to an electrical/electrochemical energy device, an electrical/electrochemical energy unit, and an electrical/electrochemical energy system, respectively.

The term "electromagnetic radiation" refers to a form of radiant energy that propagates through space via electromagnetic waves and/or photons.

The term "magnetically sensitive" refers to being sensitive to magnetic fields or changes, as a function of time, of magnetic fields. Examples of magnetically sensitive devices include, but are not limited to, a pickup coil, a pickup coil including a ferrite core, a copper coil, a closed loop antenna, a magnetic induction device, a toriodal inductor, a magnetometer, a Hall-effect probe, a solenoid, and a high electrical-conductivity spiral.

The term "pickup coil" refers to a two-terminal electrical component capable of producing an electric current when subjected to a magnetic field which changes as a function of time. Pickup coils include an electrically conductive wire shaped to form a loop or a portion of a loop between the two terminals, and an electrically conductive wire shaped to form multiple loops between the two terminals.

The term "signal" refers to a quantity that conveys information about the behavior or attributes of a phenomenon. "Signal" includes a quantity that may provide information about the status of a physical system or convey a message between observers.

The term "system response" refers to the response of system to an applied signal, where the signal may be, for example, electrical, magnetic, or electromagnetic. The term "system response measurement" refers to applying the signal that induces the signal response, and measuring the system response.

The terms "passive detection" and "passively detecting" refer to the performance of measurements that are not system response measurements.

The term "state of health" refers to a figure of merit of the condition of an electrical/electrochemical device or a group of electrical/electrochemical devices for storing energy, compared to its ideal condition. State of health may be determined based on parameter including, but not limited to, resistance, impedance, conductance, capacity, voltage, self-discharge, ability to accept a charge, number of charge-discharge cycles, or a combination thereof.

The term "state of charge" refers to the amount of energy, which may be converted into electrical energy, held by an electrical/electrochemical device or a group of electrical/electrochemical devices for storing energy, compared to its maximum value.

The term "electrical short" refers to a value of electrical resistance that is below a threshold value.

The term "abnormality" refers to a condition that develops in an energy device, unit, or system, that is indicative of non-routine, non-optimal, dangerous or otherwise unexpected or unwanted behavior in the energy device, unit, or system. In an embodiment, an abnormality refers to an electrical cutoff in an energy device, unit or system. In an embodiment, an abnormality refers to an electrical short in an energy device, unit or system. In an embodiment, a short circuit can develop between various components of an electrochemical energy device, such as between an anode current collector and a cathode current collector, or between an anode active material and a cathode active material, or between an anode current collector and a cathode active material or between an anode active material and a cathode current collector. In an embodiment, an abnormality refers to a state of health or change in state of health of an energy device, unit, or system indicative a decrease in operational performance, such as an increase in internal resistance, a capacity loss or an inability to undergo charge cycling.

FIG. 1 illustrates one exemplary electrical/electrochemical energy system 100 with abnormality detection capability. Energy system 100 includes an electrical/electrochemical energy unit 110. Energy unit 110 includes at least one electrical/electrochemical energy device 115 and a sensor 120 for sensing one or more properties of energy unit 110, for example a property of energy device 115. Energy system 100 further includes a processing module 130 for processing a sensor signal generated by sensor 120. Processing module 130 processes the sensor signal generated by sensor 120 to determine if an abnormality 180 within energy unit 110 has occurred or exists. Together, sensor 120 and processing module 130 form a detection system for detecting abnormality 180. Abnormality 180 may occur or exist, for example, in energy device 115 or in electrical connections associated therewith.

In an embodiment, sensor 120 is communicatively coupled with energy device 115. In another embodiment, sensor 120 is communicatively coupled with an electrical connection associated with energy device 115. Sensor 120 may be included in energy unit 110, as illustrated in FIG. 1, be separate therefrom, or include components included in energy unit 110 as well as components separate therefrom, without departing from the scope hereof. For example, sensor 120 may be located externally to energy unit 110 while being communicatively coupled therewith.

Optionally, energy system 100 further includes a control unit 140 communicatively coupled with processing module 130 and energy unit 110, such that appropriate action may be taken upon detection of electrical abnormality 180 by sensor 120 and processing module 130. For example, processing module 130 communicates detection of abnormality 180 to control unit 140 which then invokes a control measure to energy unit 110. Examples of control measures invoked by control unit 140 include, but are not limited to, draining energy device 115, applying coolant to energy device 115, apply fire extinguisher to energy unit 110, disconnecting energy device 115, and disconnecting energy unit 110.

In certain embodiments, sensor 120 includes one or more sensing units sensitive to electromagnetic radiation. This embodiment is particularly useful for detecting the occurrence of abnormality 180. For example, abnormality 180 may be an electrical short in energy device 115 or electrical connections within energy unit 110. Acceleration of charged particles is associated with generation of electromagnetic radiation. Thus, the change in electrical current, associated with occurrence of an electrical short, results in emission of electromagnetic radiation, such as a pulse of electromagnetic radiation, from the electrical short. The electromagnetic radiation generated by abnormality 180 may be one or more pulses of electromagnetic radiation. Sensor 120, or a sensing unit thereof, senses this electromagnetic radiation as a change, as a function of time, of the electromagnetic field at the location of sensor 120, or a sensing unit thereof.

Detection of abnormality 180 through sensing of electromagnetic radiation generated by abnormality 180 is fast compared to conventional methods relying on, for example, temperature measurements. The mode of signal transmission from abnormality 180 is electromagnetic radiation, which propagates at the speed of light, and therefore reaches sensor 120 on a timescale much faster than the typical timescale of, for example, dangerous local temperature increase resulting from abnormality 180. In some embodiments, energy system 100 is capable of detecting an abnormality in less than 10 milliseconds after occurrence of the abnormality. In some embodiments, energy system 100 is capable of detecting an abnormality in less than 100 milliseconds after occurrence of the abnormality. For comparison, it may take up to a minute for the temperature increase resulting from an electrical short inside a battery cell to propagate from the location of the electrical short to a temperature sensor located on the outside of the battery cell.

Sensing of electromagnetic radiation may further be used to detect some forms of abnormality 180 that are not electrical in nature. For example, energy unit 110 generally includes components and/or substances capable of producing electricity. A non-electrical abnormality 180, such as a chemical abnormality, in energy unit 110 is likely to result in an electrical abnormality, which may be sensed by sensor 120 as discussed above.

In certain embodiments, sensor 120 includes a plurality of sensing units located in different positions within energy unit 110 and/or communicatively coupled with different portions of energy unit 110. For example, energy unit 110 may include multiple energy devices 115, each being communicatively coupled with a different sensing unit of sensor 120. The plurality of sensing units facilitates spatial location of abnormality 180, such that processing module 130 may provide a spatial location of abnormality 180 to control unit 140. Control unit 140 may utilize spatial location information about abnormality 180 to invoke a control measure to a portion of energy unit 110. For example, in an embodiment of energy unit 110 including multiple energy devices 115, where abnormality 180 is within a single energy device 115, control unit may invoke a control measure to the energy device 115 having abnormality 180. It may be possible to continue operation of energy devices 115 not affected by abnormality 180. Additionally, the plurality of sensing units may provide increased sensitivity for detection of abnormality 180 in embodiments of energy unit 110 including energy devices 115 coupled in series, as compared to conventional methods relying on the measurement of the terminal voltages of energy unit. The sensing units of sensor 120 may be advantageously arranged to sense occurrence or existence of abnormality 180 within each of a group of sub-portions of energy unit 110. Each such sub-portion of energy unit 110 may include one or more energy devices 115.

Figure 2:
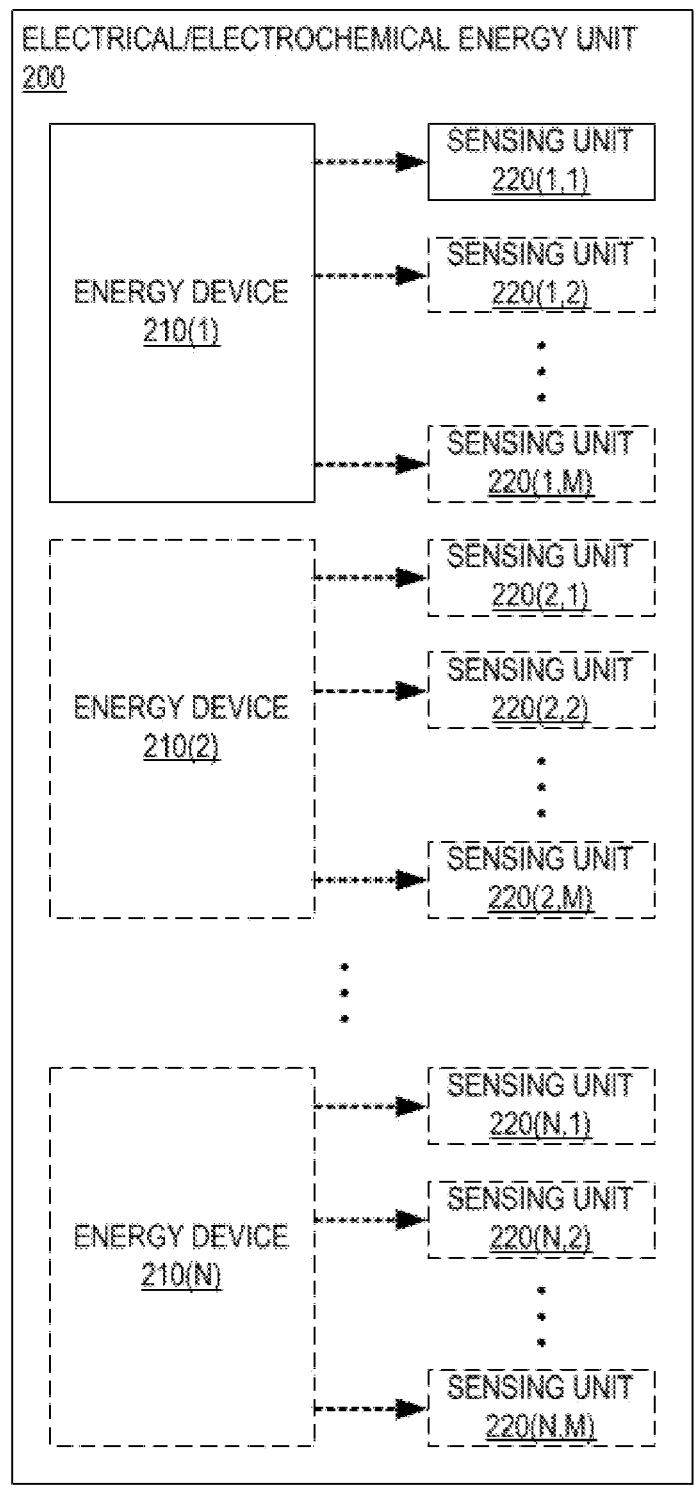
FIG. 2 illustrates an electrical/electrochemical energy unit with sensors for sensing abnormalities in individual electrical/electrochemical energy devices within the electrical/electrochemical energy unit, according to an embodiment.

FIG. 2 illustrates one exemplary electrical/electrochemical energy unit 200 with sensors for sensing abnormalities in individual electrical/electrochemical energy devices within energy unit 200. Energy unit 200 is an embodiment of energy unit 110 of FIG. 1. Energy unit 200 includes one or more energy devices 210, where i is a positive integer. Energy devices 210($i$) are embodiments of energy device 115 (FIG. 1). Some embodiments of energy unit 200 includes only energy device, energy device 210(1), while other embodiments of energy unit 200 includes energy device 210(1) and additional energy devices 210($i$), where i is an integer greater than one. Energy unit 200 further includes a sensing unit 220(1,1) that is communicatively coupled with energy device 210(1). Optionally, energy unit 200 includes a plurality of sensing units 220($i,j$), where each sensing unit 220($i,j$) is communicatively coupled with a respective energy device 210($i$); j is a positive integer. Each sensing unit 220($i,j$) is thus configured for sensing an abnormality, such as abnormality 180 (FIG. 1), in a respective energy device 210($i$). The set of sensing units 220($i,j$) included in energy unit 200 form an embodiment of sensor 120 (FIG. 1). In an embodiment, energy unit 200 includes at least one sensing unit 220($i,j$) for each energy device 210($i$). In an embodiment, energy unit 200 includes a plurality of sensing devices 220($i,j$) for at least a portion of sensing devices 210($i$).

In one embodiment, sensing unit 220($i,j$) is sensitive to electromagnetic radiation. In this embodiment, sensing unit 220($i,j$) need not be electrically connected, or in physical contact, with energy device 220($i$). In another embodiment, sensing unit 220($i,j$) is electrically connected with energy device 210($i$) for measuring an electrical property thereof, such as voltage, current, resistance, capacitance, impedance, complex impedance, and/or a combination thereof. In yet another embodiment, sensing unit 220($i,j$) is configured to measure an environmental property such as temperature, pressure, humidity, or a combination thereof. In a further embodiment, sensing unit 220($i,j$) is configured to measure magnetization, magnetic Curie temperature, state of health, and/or state of charge. The magnetic Curie temperature is the temperature, at which the permanent magnetism of a material changes to induced magnetism. Sensing unit 220($i,j$) may sense this state change of the material when the temperature of the material increases beyond the magnetic Curie temperature. Energy unit 220 may include sensing units 220($i,j$) according to a single embodiment thereof or a combination of sensing units 220($i,j$) of different embodiments, without departing from the scope hereof. In one example, all sensing units 220($i,j$) are configured for sensing electromagnetic radiation. In another example, one portion of sensing units 220($i,j$) are configured for sensing electromagnetic radiation, while another portion of sensing units 220(i,j) are configured for sensing an electrical property.

While each sensing unit 220(i,j) are illustrated as being communicatively coupled with one energy device 210(i), sensing unit 220(i,j) may be sensitive to other energy devices 210(k), where k is different from i, without departing from the scope hereof. For example, in an embodiment where sensing unit 220(i,j) is configured for sensing electromagnetic radiation, sensing unit 220(i,j) may be sensitive to electromagnetic radiation originating from both energy device 210(j) and other energy devices 210(k), however with greater sensitivity to electromagnetic radiation originating energy device 210(k). In another example including sensing units 220(i,j) configured for sensing electrical properties, electrical connections between energy units 210 may produce crosstalk, such that a sensing unit 220(i,j) is sensitive to electrical properties of energy device 220(i) as well as other energy devices 220(k), where k is different from i.

Figure 3:
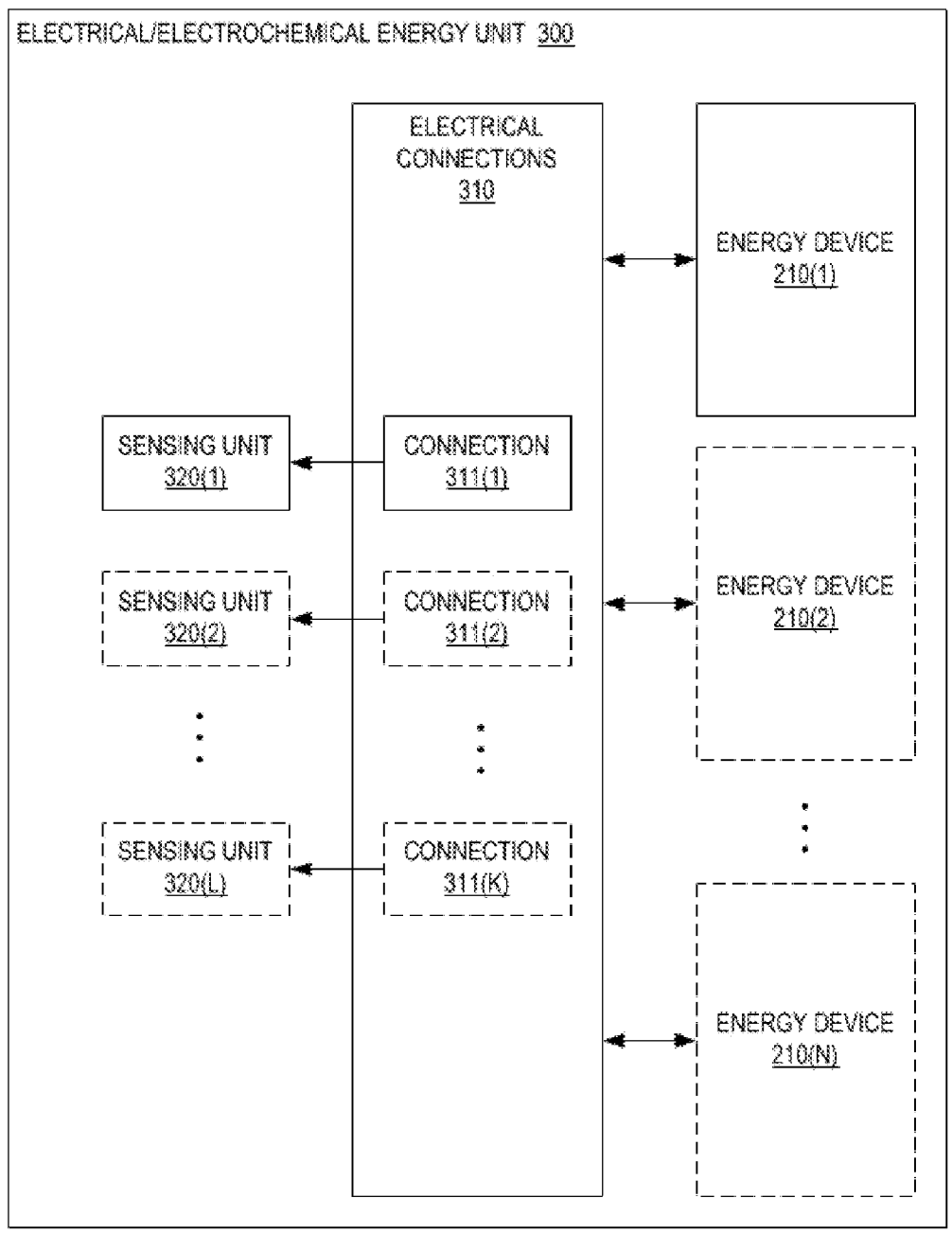
FIG. 3 illustrates an electrical/electrochemical energy unit with abnormality detection sensors communicatively coupled with electrical connections within the electrical/electrochemical energy unit, according to an embodiment.

FIG. 3 illustrates one exemplary electrical/electrochemical energy unit 300 with abnormality detection sensors communicatively coupled with electrical connections within energy unit 300. Energy unit 300 is thus configured for detection of abnormality 180 (FIG. 1). Energy unit 300 is an embodiment of energy unit 110 of FIG. 1. Energy unit 300 includes one or more energy devices 210 (FIG. 2) and electrical connections 310 that are electrically connected with at least one energy device 210. Electrical connections 310 include at least one electrical connection 311. Energy unit 300 further includes at least one sensing unit 320 that is communicatively coupled with a respective connection 311. The set of sensing units 320 included in energy unit 300 forms an embodiment of sensor 120 (FIG. 1). Although illustrated in FIG. 3 as being included in energy unit 300, sensing units 320 may be located externally to energy unit 300, without departing from the scope hereof.

In certain embodiments, sensing units 320 are configured to measure an electrical property of a respective connection 311, such as voltage, current, resistance, capacitance, impedance, complex impedance, and/or a combination thereof. Sensing units 320 may thereby measure an electrical property of one or more energy devices 210. In one example, energy unit 300 includes a plurality of sensing units 320, each electrically connected to a respective connection 311 that is associated with a respective spatial portion of energy unit 300, such as a respective energy device 210.

In certain embodiments, sensing units 320 are configured to sense electromagnetic radiation. For example, sensing units 320 sense electromagnetic radiation associated with an abnormality, such as a short, in connectors 311.

Figure 4:
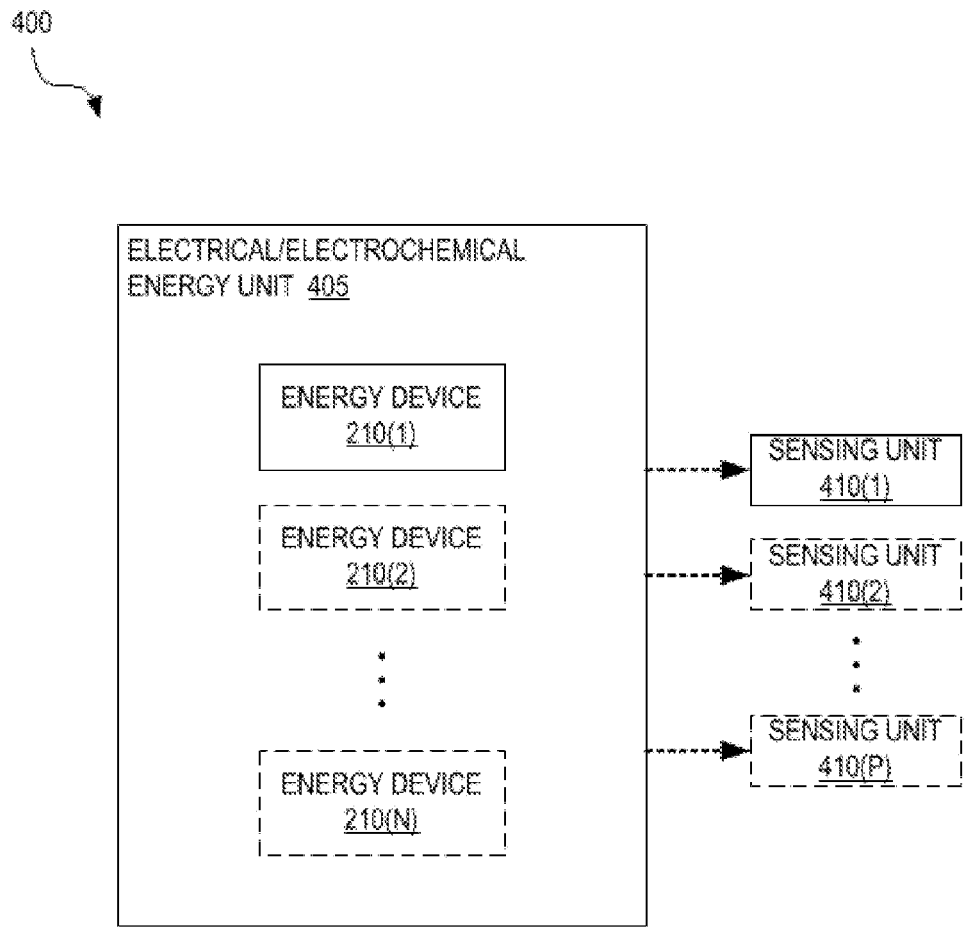
FIG. 4 illustrates an electrical/electrochemical energy system configured for abnormality detection capability, according to an embodiment.

FIG. 4 illustrates one exemplary electrical/electrochemical energy system 400 configured for abnormality detection capability. Energy system 400 is thus configured for detection of abnormality 180 (FIG. 1). Energy system 400 includes an electrical/electrochemical energy unit 405 and at least one sensing unit 410(i) located externally to energy unit 405. Sensing unit 410(i) is communicatively coupled with energy unit 405 for sensing an abnormality, such as abnormality 180 (FIG. 1), of energy unit 405. Energy unit 405 includes one or more energy devices 210(j) (FIG. 2). Energy system 400 is an embodiment of energy unit 110 and sensor 120 of FIG. 1.

In one embodiment, sensing unit 410(i) is sensitive to electromagnetic radiation. In this embodiment, sensing unit 410(i) need not be electrically connected, or in physical contact, with energy unit 405. In another embodiment, sensing unit 410(i) is electrically connected with energy unit 405 for measuring an electrical property thereof, such as voltage, current, resistance, capacitance, impedance, complex impedance, and/or a combination thereof. In yet another embodiment, sensing unit 410(i) is configured to measure an environmental property such as temperature, pressure, humidity, or a combination thereof. In a further embodiment, sensing unit 410(i,j) is configured to measure magnetization, magnetic Curie temperature, state of health, and/or state of charge. Energy system 400 may include sensing units 410(i) according to a single embodiment thereof or a combination of sensing units 410(i) of different embodiments, without departing from the scope hereof. In one example, all sensing units 410(i) are configured for sensing electromagnetic radiation. In another example, one portion of sensing units 410(i) are configured for sensing electromagnetic radiation, while another portion of sensing units 410(i) are configured for sensing an electrical property.

In an embodiment of energy system 400 that includes a plurality of sensing units 410(i) sensitive to electromagnetic radiation, sensing units 410(i) are located in different positions relative to energy unit 405. In this embodiment, sensing units 410(i) may provide spatial information about an abnormality 180 (FIG. 1) within energy unit 405. For example, sensing units 410(i) may be located such that each of sensing units 410(i) is closer to a respective one of a plurality of energy devices 210(j).

Figure 5:
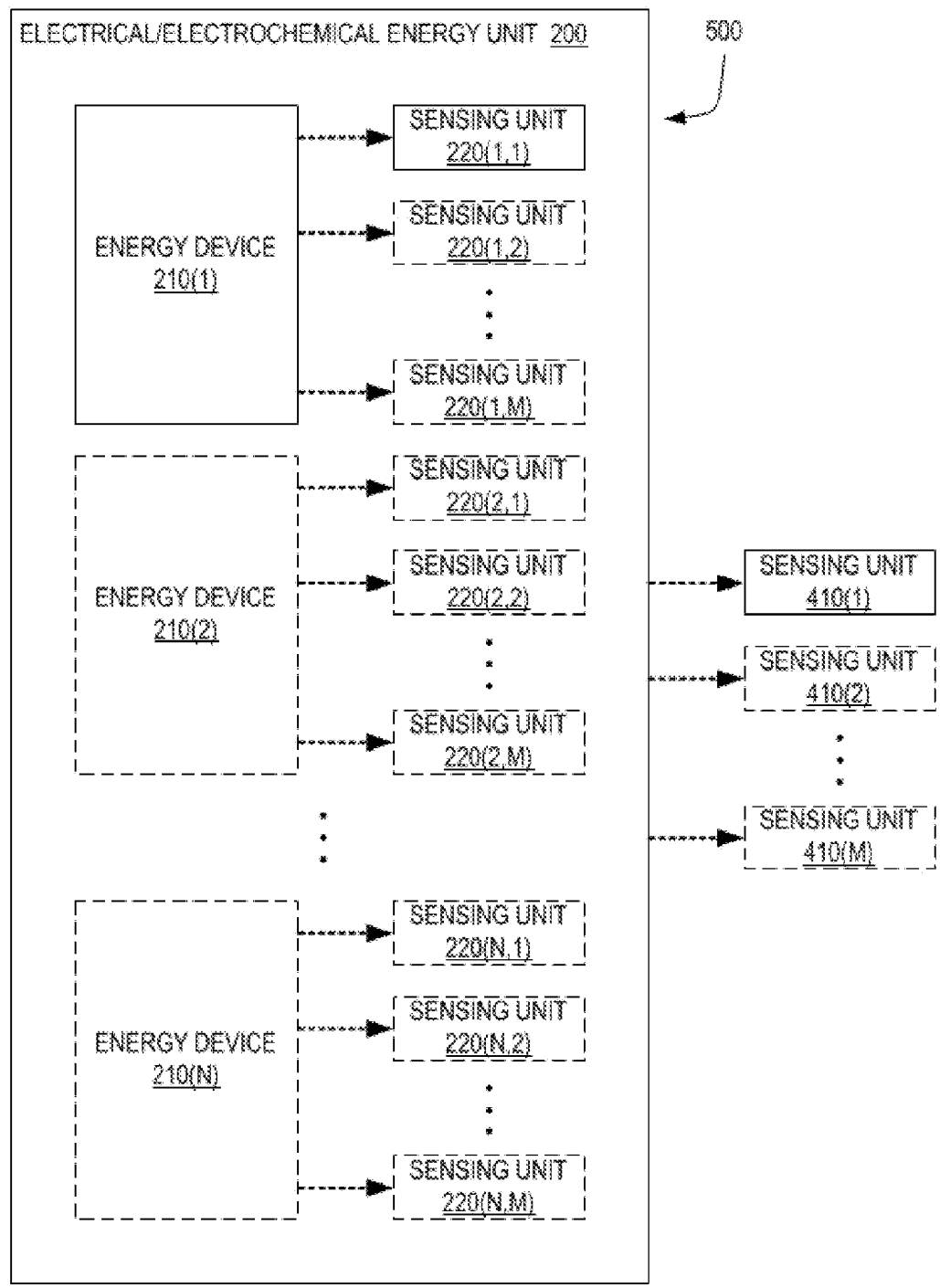
FIG. 5 illustrates an electrical/electrochemical energy system including an electrical/electrochemical energy unit and abnormality detection sensors located both internally and externally to the electrical/electrochemical energy unit, according to an embodiment.

FIG. 5 illustrates one exemplary electrical/electrochemical energy system 500 including an electrical/electrochemical energy unit and abnormality detection sensors located both internally and externally thereto. Energy system 500 is thus configured for detection of abnormality 180 (FIG. 1). Energy system 500 includes electrical/electrochemical energy unit 200 (FIG. 2) and at least one sensing unit 410 (FIG. 4) communicatively coupled therewith, as discussed in connection with FIG. 4 with energy unit 200 implemented as energy unit 405 (FIG. 4).

Figure 6:
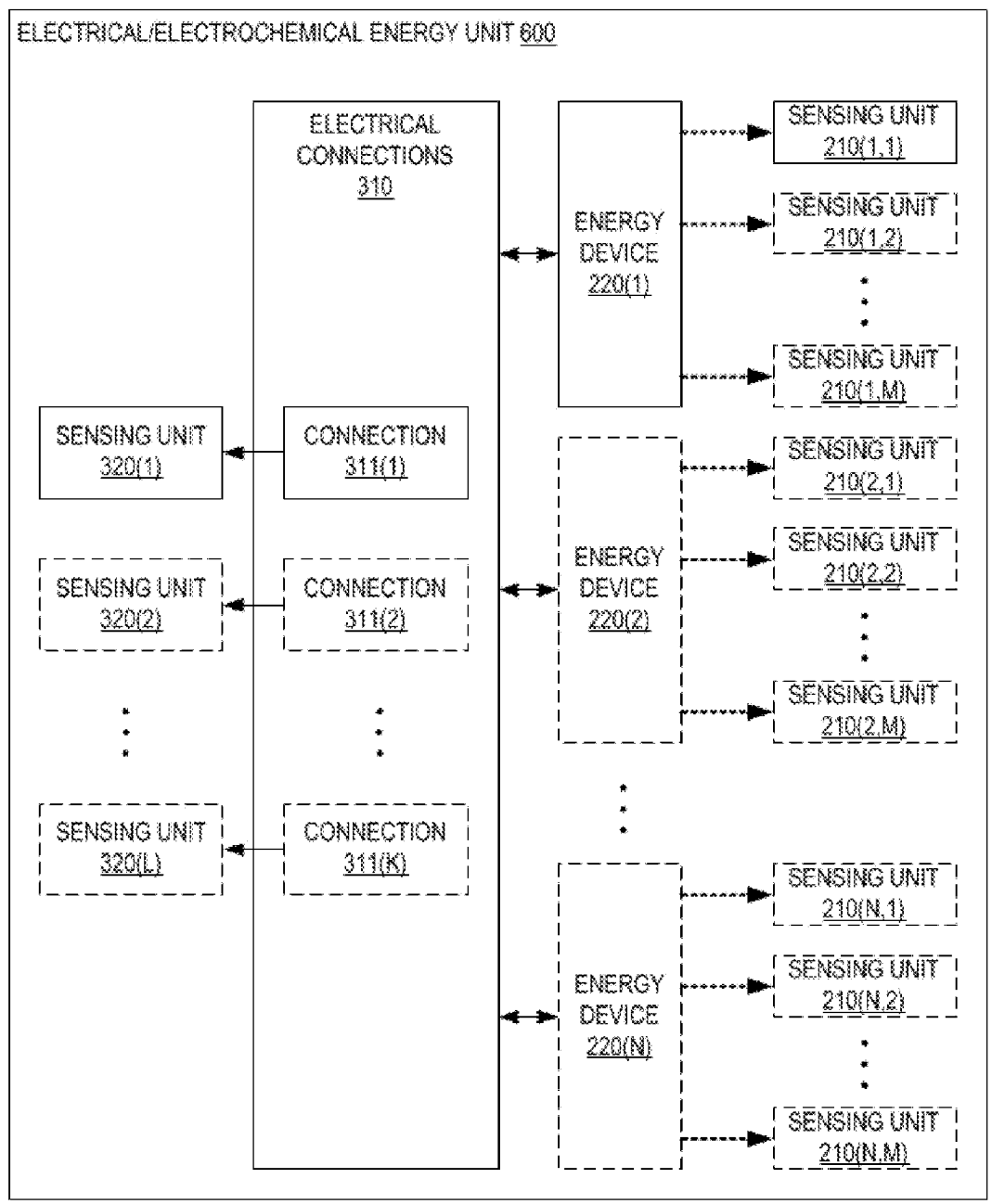
FIG. 6 illustrates an electrical/electrochemical energy unit that includes the abnormality sensing functionality of the electrical/electrochemical energy units of FIGS. 2 and 3, according to an embodiment.

FIG. 6 illustrates one exemplary electrical/electrochemical energy unit 600 that includes the abnormality sensing functionality of energy units 200 of FIGS. 2 and 300 of FIG. 3. Energy unit 600 includes at least one energy device 220 (FIG. 2) and at least one sensing unit 210 (FIG. 2) communicatively coupled therewith, as discussed in connection with FIG. 2. Energy unit 600 further includes electrical connections 310 (FIG. 3), electrically connected with the at least one energy device 220, and at least one sensing unit 320 (FIG. 3) communicatively coupled with electrical connections 310, as discussed in connection with FIG. 3.

Figure 7:
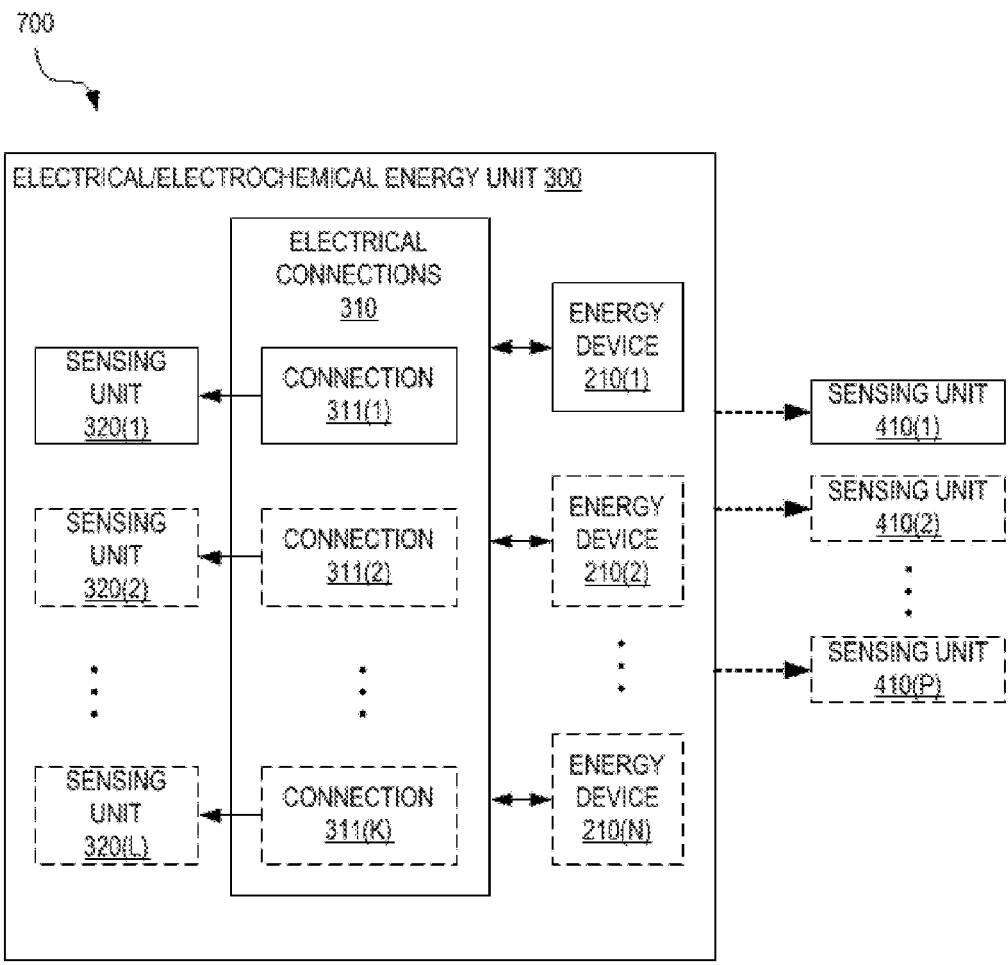
FIG. 7 illustrates an electrical/electrochemical energy system that includes the abnormality sensing functionality of the electrical/electrochemical energy unit of FIG. 3 and the abnormality sensing functionality of the electrical/electrochemical energy system of FIG. 4, according to an embodiment.

FIG. 7 illustrates one exemplary electrical/electrochemical energy system 700 that includes the abnormality sensing functionality of electrical/electrochemical energy unit 300 of FIG. 3 and the abnormality sensing functionality of electrical/electrochemical energy system 400 of FIG. 4. Energy system 700 includes energy unit 300 (FIG. 3) and at least one sensing unit 410 (FIG. 4) communicatively coupled therewith, as discussed in connection with FIG. 4, with energy unit 300 implemented as energy unit 405 (FIG. 4).

Figure 8:
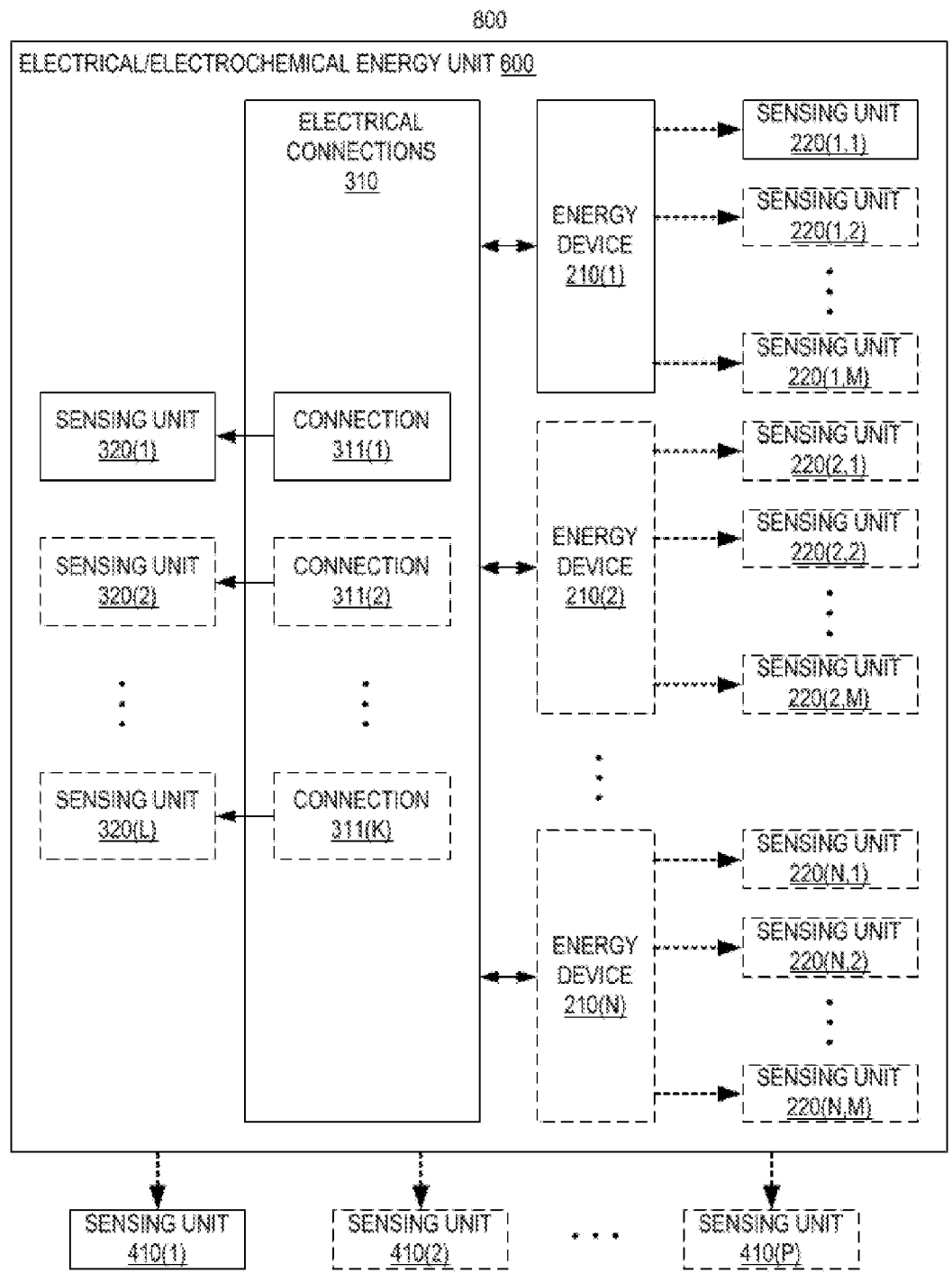
FIG. 8 illustrates an electrical/electrochemical energy system that includes the abnormality sensing functionality of the electrical/electrochemical energy unit of FIG. 6 and the abnormality sensing functionality of the electrical/electrochemical energy system of FIG. 4, according to an embodiment.

FIG. 8 illustrates one exemplary electrical/electrochemical energy system 800 that includes the abnormality sensing functionality of electrical/electrochemical energy unit 600 of FIG. 6 and the abnormality sensing functionality of electrical/electrochemical energy system 400 of FIG. 4. Energy system 800 includes energy unit 600 (FIG. 6) and at least one sensing unit 410 (FIG. 4) communicatively coupled therewith, as discussed in connection with FIG. 4, with energy unit 600 implemented as energy unit 405 (FIG. 4).

Figure 9:
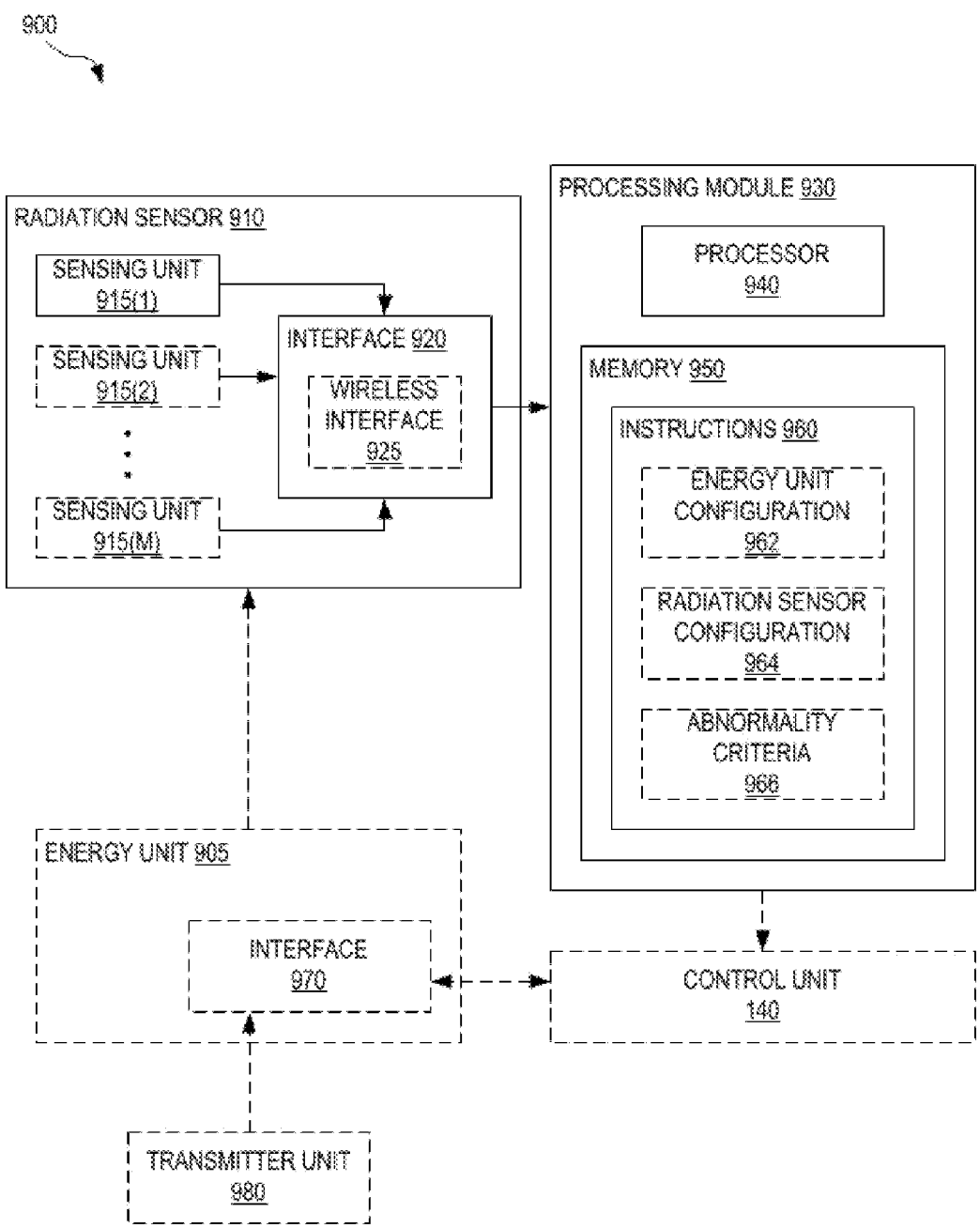
FIG. 9 illustrates an abnormality detection system utilizing electromagnetic radiation sensors to detect an abnormality in an electrical/electrochemical energy device or unit, according to an embodiment.

FIG. 9 illustrates one exemplary abnormality detection system 900 utilizing electromagnetic radiation sensors to detect an abnormality, such as abnormality 180 (FIG. 1), in an electrical/electrochemical energy device or unit. Abnormality detection system 900 includes a radiation sensor 910 and a processing module 930. Radiation sensor is an embodiment of sensor 120 (FIG. 1), and processing module 930 is an embodiment of processing module 130 (FIG. 1). Radiation sensor 910 is configured to sense electromagnetic radiation associated with the occurrence or existence of an abnormality, such as abnormality 180 (FIG. 1), in an electrical/electrochemical energy device or unit. Radiation sensor 910 includes one or more radiation sensing units 915, and an interface 920. Radiation sensing units 915 may be mounted in series, parallel, or a combination thereof. In an embodiment, interface 920 includes a wireless interface 925, such as a radio-frequency transmitter, a Bluetooth communication port, or a Wi-Fi communication port. Wireless interface 925 is useful, for example, when radiation sensor 910 is implemented internally to packaging of an energy unit, or when flexibility in the relative placement of radiation sensor 910 and processing module 930 is required. Processing module 930 includes a processor 940 and memory 950. In certain embodiments, processing module 930 includes an oscilloscope, a network analyzer, or a vector network analyzer. Memory 950 includes machine-readable instructions 960 encoded in a non-volatile portion of memory 950. Sensor 910 and/or processing module 930 may include an amplifier for amplifying signals generated by sensing units 915.

In an embodiment, instructions 960 include one or more of energy unit configuration information 962, radiation sensor configuration information 964, and abnormality criteria 966. Energy unit configuration information 962 includes information about the configuration of an energy unit for which radiation sensor 910 may be used to sense abnormalities. Such configuration information may include the layout of the energy unit and/or operating parameters for the energy unit. Radiation sensor configuration information 964 may include specifications for radiation sensing units 915, such as its physical and geometrical properties, as well as the locations of radiation sensing units 915 in relation to an energy unit for which radiation sensor 910 may be used to sense abnormalities. Abnormality criteria 966 may include requirements to properties of a signal generated by radiation sensing units 915, which must be met in order for the signal to be deemed indicative of an electrical abnormality in an energy unit, as opposed to originating from ambient electromagnetic radiation. Examples of requirements include a threshold signal magnitude, pulse duration, frequency, waveform, and combinations thereof. Instructions 960 may further include physical laws and rules or equations derived therefrom, such as Maxwell's equations, the wave equation, the Larmor formula, and battery equations including thermodynamics and kinetics.

Radiation sensors 915 are sensitive to electromagnetic radiation. Radiation sensor 910 communicates a sensor signal, generated from measurements performed by radiation sensing units 915, to processing module 930 via interface 920. In an embodiment, the sensor signal is an electrical signal. Processor 940 processes the sensor signal according to instructions 960 to determine if the sensor signal is indicative of an abnormality in an energy unit under study. Each of radiation sensing units 915 may be operated as sensing unit 220 (FIG. 2), sensing unit 320 (FIG. 3), or sensing unit 410 (FIG. 4).

In an embodiment, abnormality detection system 900 is a passive abnormality detection system which performs measurements on an energy unit without actively stimulating any portion or aspect of the energy unit. In another embodiment, abnormality detection system 900 actively stimulates the energy unit, to detect abnormalities therein through a system response measurement. In this embodiment, abnormality detection unit 900 includes a transmitter unit 980 for transmitting a signal to an energy unit. Transmitter unit 980 may be configured to transmit an electrical signal to an energy unit. For example, transmitter 980 is configured to transmit a low-power high-frequency electrical signal, optionally of varying frequency, to an energy unit. Transmitter unit 980 may be electrically connected to the terminals of the energy unit. In an alternate example, transmitter unit 980 is configured to transmit a signal in the form of electromagnetic radiation to an energy unit. In another example, transmitter unit 980 is configured to apply a magnetic field to an energy unit. The sensor signal generated by radiation sensor 910 then includes the response of the energy unit to the signal transmitted thereto by transmitter 980. In another embodiment, abnormality detection system 900 is configured to detect abnormalities through a combination of passive detection and system response measurements, where the system response measurements may include operation of transmitter unit 980.

In an embodiment, one or more of sensing units 915 function as transmitter unit 980, such that transmitter unit includes one or more of sensing units 915.

In an embodiment, abnormality detection system 900 includes control unit 140 (FIG. 1), communicatively coupled with processing module 930. Control unit 140 is capable of controlling at least portions of the functionality of an energy unit based upon information received from processing module 930. Such information includes, for example, one or more of detection of an abnormality, lack of detection of an abnormality, and location, magnitude, and type of a detected abnormality. Optionally, control unit 940 includes transmitter unit 980.

In an embodiment, abnormality detection system 900 includes an energy unit 905 communicatively coupled with radiation sensor 910, such that abnormality detection system 900 may detect abnormalities in energy unit 905. In an embodiment, abnormality detection system 900 includes energy unit 905 and transmitter unit 980. In this embodiment, energy unit 905 may include an interface 970 for receiving a signal from transmitter unit 980. In an embodiment, abnormality detection system 900 includes energy unit 905 and control unit 140 communicatively coupled therewith through interface 970. In an embodiment, abnormality detection system 900 includes energy unit 905, control unit 140, and transmitter unit 980. Energy unit 905 may include a plurality of separate energy units 950, without departing from the scope hereof. Optionally, transmitter unit 980 and/or processing module 930 are incorporated in energy unit 905.

Abnormality detection system 900 may be extended to include a plurality of processing modules 930 communicatively coupled with a respective plurality of sensors 910, without departing from the scope hereof. These processing modules may function as secondary control units, all communicatively coupled with control unit 140. For example, such secondary control units may monitor different portions of energy unit 905.

Figure 10:
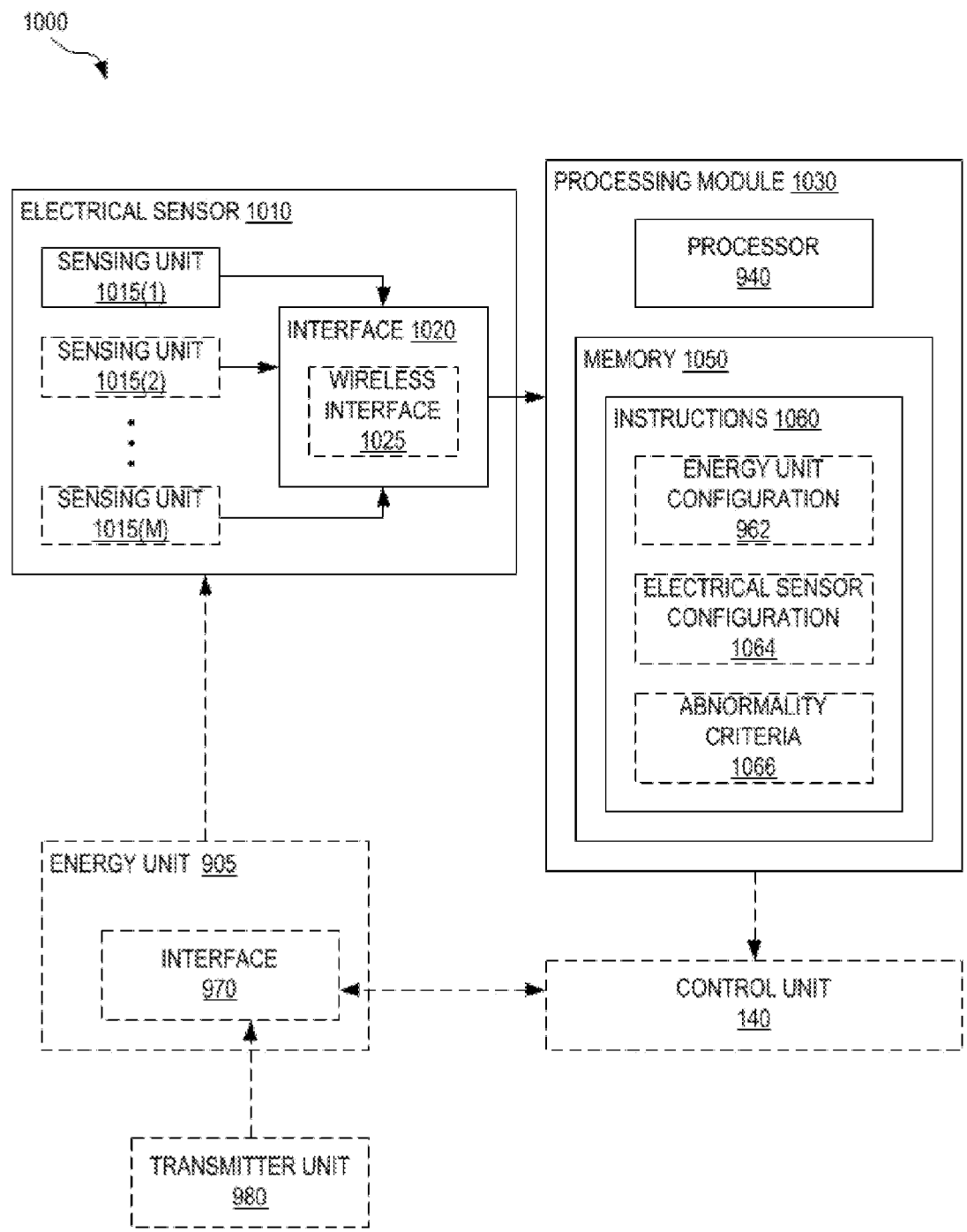
FIG. 10 illustrates an abnormality detection system utilizing electrically connected sensors for detection of an abnormality in an electrical/electrochemical energy unit, according to an embodiment.

FIG. 10 illustrates one exemplary abnormality detection system 1000 utilizing electrically connected sensors for detection of an abnormality, such as abnormality 180 (FIG. 1), in an electrical/electrochemical energy unit. Abnormality detection system 1000 is identical to abnormality detection system 900 (FIG. 9), except that sensing of electromagnetic radiation using radiation sensors is replaced by sensing of electrical properties using sensors that are electrically connected with the energy unit under study. Accordingly, abnormality detection system 1000 includes an electrical sensor 1010 in place of radiation sensor 910 (FIG. 9). Electrical sensor 1010 includes one or more electrically connected sensing units 1015, configured to be electrically connected to an energy unit, and an interface 1020. Interface 1020 is similar to interface 920 (FIG. 9), and optionally includes a wireless interface 1025 that has properties similar to wireless interface 925 (FIG. 9). Each of electrically connected sensing units 1015 is configured to measure an electrical property such as voltage, current, resistance, capacitance, impedance, complex impedance, and/or a combination thereof. Electrical sensing units 1015 may be mounted in series, parallel, or a combination thereof. Each of electrically connected sensing units 1015 may be implemented as sensing unit 220 (FIG. 2), sensing unit 320 (FIG. 3), or sensing unit 410 (FIG. 4). As compared to abnormality detection system 900 (FIG. 9), processing module 930 (FIG. 9) is replaced by processing module 1030.

Processing module 1030 is similar to processing module 930 (FIG. 9). Processing module 1030 includes processor 940 (FIG. 9) and memory 1050. In certain embodiments, processing module 1030 includes an oscilloscope, a network analyzer, and/or a vector network analyzer. Memory 1050 includes machine-readable instructions 1060, which are encoded in a non-volatile portion of memory 1050 and include energy unit configuration information 962 (FIG. 9), electrical sensor configuration information 1064, and abnormality criteria 1066. Electrical sensor configuration information 1064 and abnormality criteria 1066 have properties similar to electrical sensor configuration information 964 (FIG. 9) and abnormality criteria 966 (FIG. 9), but tailored to the specific properties of electrical sensor 1010. Instructions 1060 may further include physical laws and rules or equations derived therefrom, such as Ohm's law Kirchhoff's circuit laws, and battery equations including thermodynamics and kinetics. In an embodiment, one of more of sensing units 1015 function as transmitter unit 980 (FIG. 9), such that transmitter unit 980 includes one or more of sensing units 1015. Sensor 1010 and/or processing module 1030 may include an amplifier for amplifying signals generated by sensing units 1015.

Figure 11:
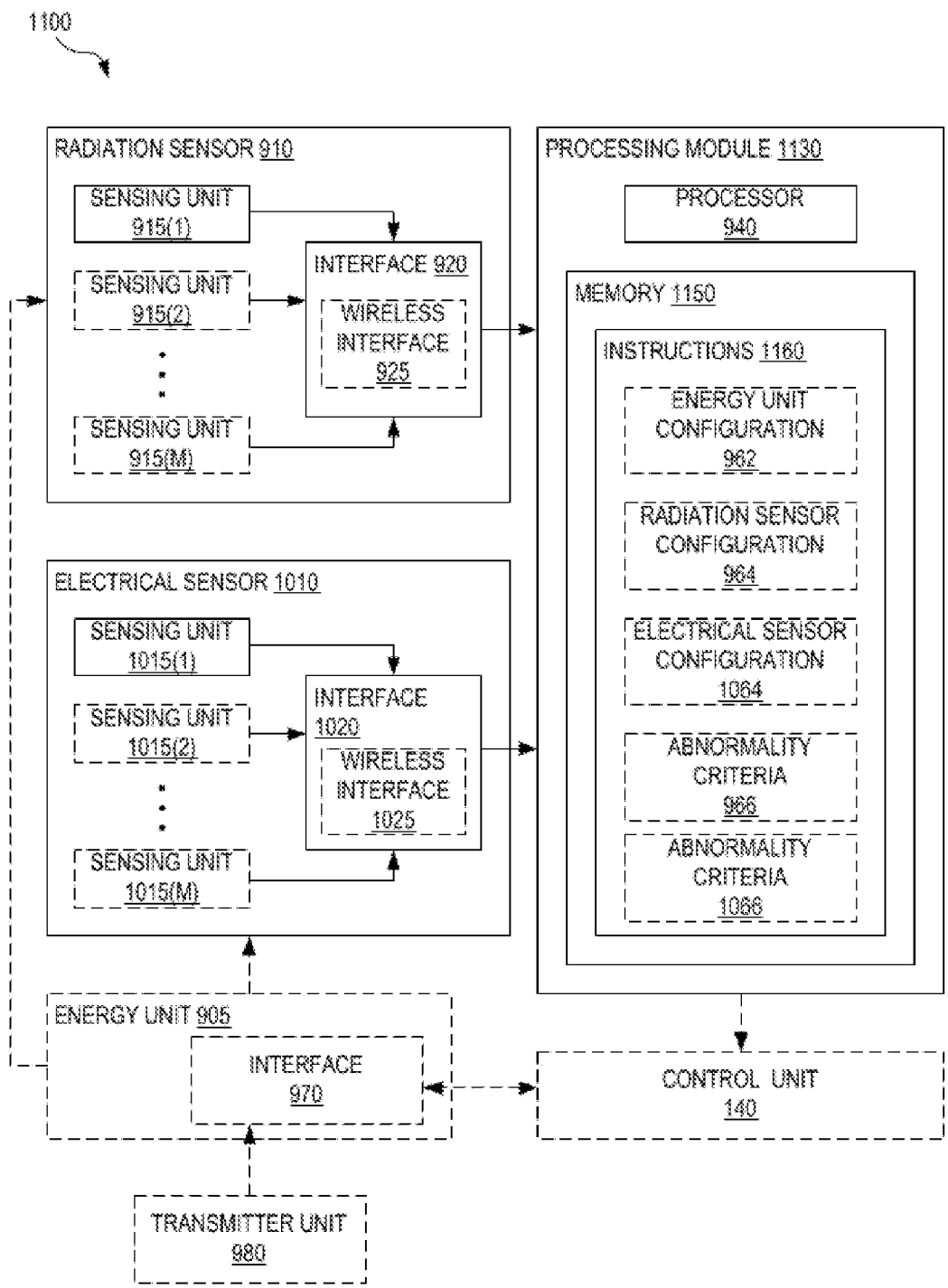
FIG. 11 illustrates an abnormality detection system utilizing electromagnetic radiation sensors and electrically connected sensors for detection of an abnormality in an electrical/electrochemical energy unit, according to an embodiment.

FIG. 11 illustrates one exemplary abnormality detection system 1100 utilizing electromagnetic radiation sensors and electrically connected sensors for detection of an abnormality, such as abnormality 180 (FIG. 1), in an electrical/electrochemical energy unit. Abnormality detection system 1100 thus combines the detection functionality of abnormality detection systems 900 (FIG. 9) and 1000 (FIG. 10). In comparison to abnormality detection system 900 (FIG. 9), abnormality detection system 1100 further includes electrical sensor 1010 (FIG. 10) implemented as discussed in connection with FIG. 10. Processing module 930 (FIG. 9) is replaced by a similar processing module 1130. Processing module 1030 includes processor 940 (FIG. 9) and memory 1150. In certain embodiments, processing module 1130 includes an oscilloscope, a network analyzer, and/or a vector network analyzer. Memory 1150 includes machine-readable instructions 1160, which are encoded in a non-volatile portion of memory 1150 and include energy unit configuration information 962 (FIG. 9), radiation sensor configuration information 964 (FIG. 9), electrical sensor configuration information 1064 (FIG. 10), abnormality criteria 966 (FIG. 9), and abnormality criteria 1066 (FIG. 10). Instructions 1160 may further include physical laws and rules or equations derived therefrom, such as Maxwell's equations, the wave equation, the Larmor formula, Ohm's law, Kirchhoff's circuit laws, and battery equations including thermodynamics and kinetics. In an embodiment, one or more of sensing unit 915 and 1015 function as transmitter unit 980 (FIG. 9), such that transmitter unit 980 includes one or more of sensing units 915 and 1015. Processing module 1130 may include an amplifier for amplifying signals generated by sensing units 915 and/or 1015.

Figure 12:
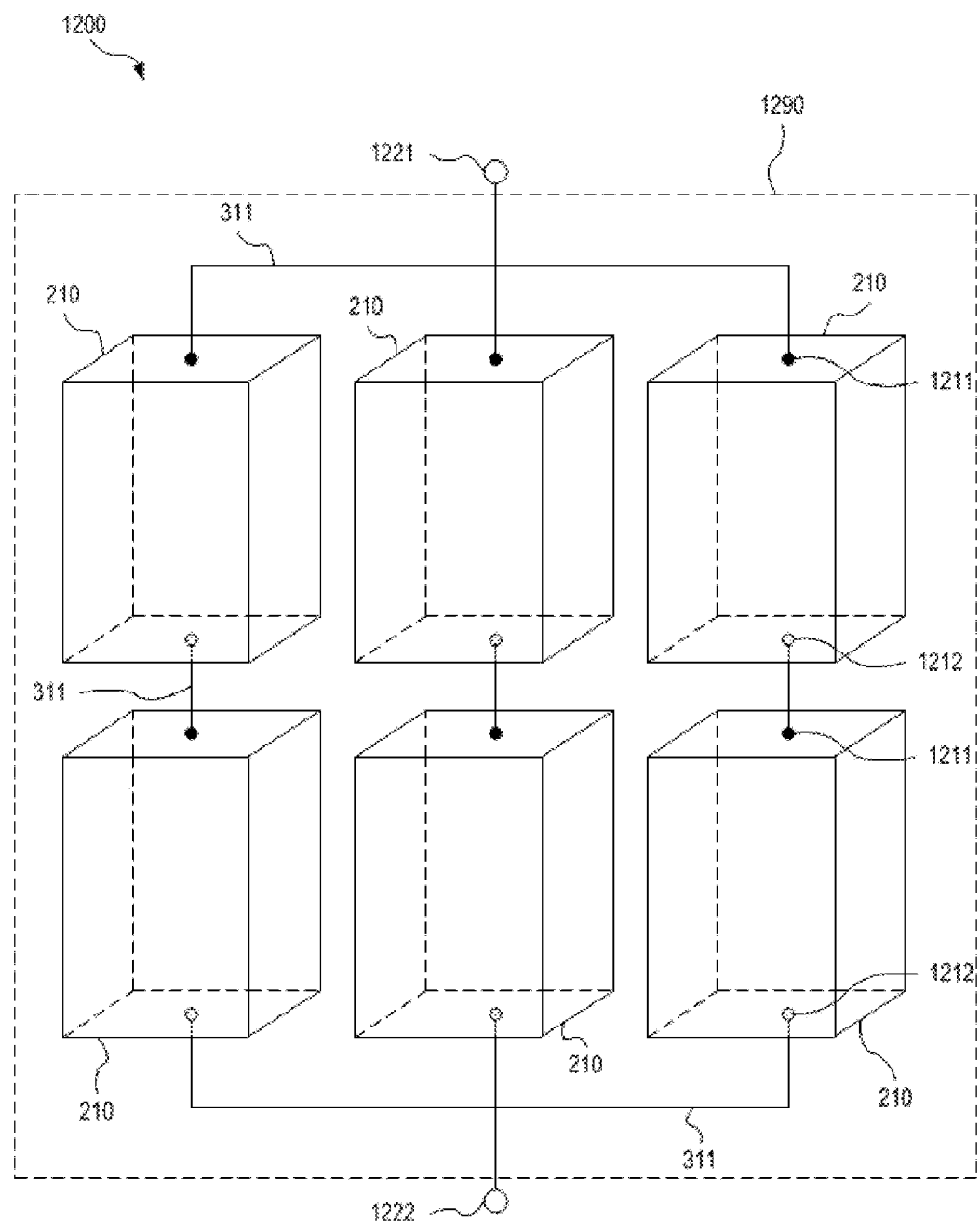
FIG. 12 schematically illustrates the configuration of an electrical/electrochemical energy unit including at least one electrical/electrochemical device, according to an embodiment.

FIG. 12 schematically illustrates the configuration of one exemplary electrical/electrochemical energy unit 1200 including at least one electrical/electrochemical device. Energy unit 1200 includes one or more energy devices 210 (FIG. 2) and terminals 1221 and 1222. Each energy device 210 has terminals 1211 and 1212. For clarity of illustration, not all terminals 1211 and 1212 are labeled in FIG. 12. In one embodiment, energy unit 1200 includes only a single energy device 210 with terminals 1211 and 1212 connected to terminals 1221 and 1222 through electrical connections 311 (FIG. 3). In another embodiment, energy unit 1200 includes a plurality of energy devices 210 with terminals 1211 and 1212 connected to terminals 1221 and 1222 through electrical connections 311 (FIG. 3), and optionally, through connections between individual energy devices 210. For example, energy unit 1200 includes a plurality of energy devices 210 connected in series, parallel, or a combination thereof, via electrical connections 311. For clarity of illustration, not all electrical connections 311 are labeled in FIG. 12.

Optionally, energy unit 1200 includes an enclosure 1290 for enclosing at least a portion of energy unit 1200. For example, enclosure 1290 encloses energy devices 210, electrical connections 311, while allowing for access to terminals 1221 and 1222.

Although FIG. 12 illustrates energy unit 1200 as including six energy devices 210 arranged in three pairs of serially connected energy devices, with the three pairs connected in parallel, energy unit 1200 may include a different number of energy devices 210 connected in series, parallel, or a combination thereof, without departing from the scope hereof. Additionally, energy devices 210 may have shape and physical location different from that illustrated in FIG. 12, without departing from the scope hereof. For example, energy devices 210 may be substantially cylindrical in shape and/or be positioned on a different grid, such as along a single line. Furthermore, energy unit 1200 may include different types of energy devices 210, without departing from the scope hereof. For example, a plurality of energy devices 210 may include energy storage devices of different capacity, and/or include a combination of energy storage and energy harnessing devices.

Figure 13:
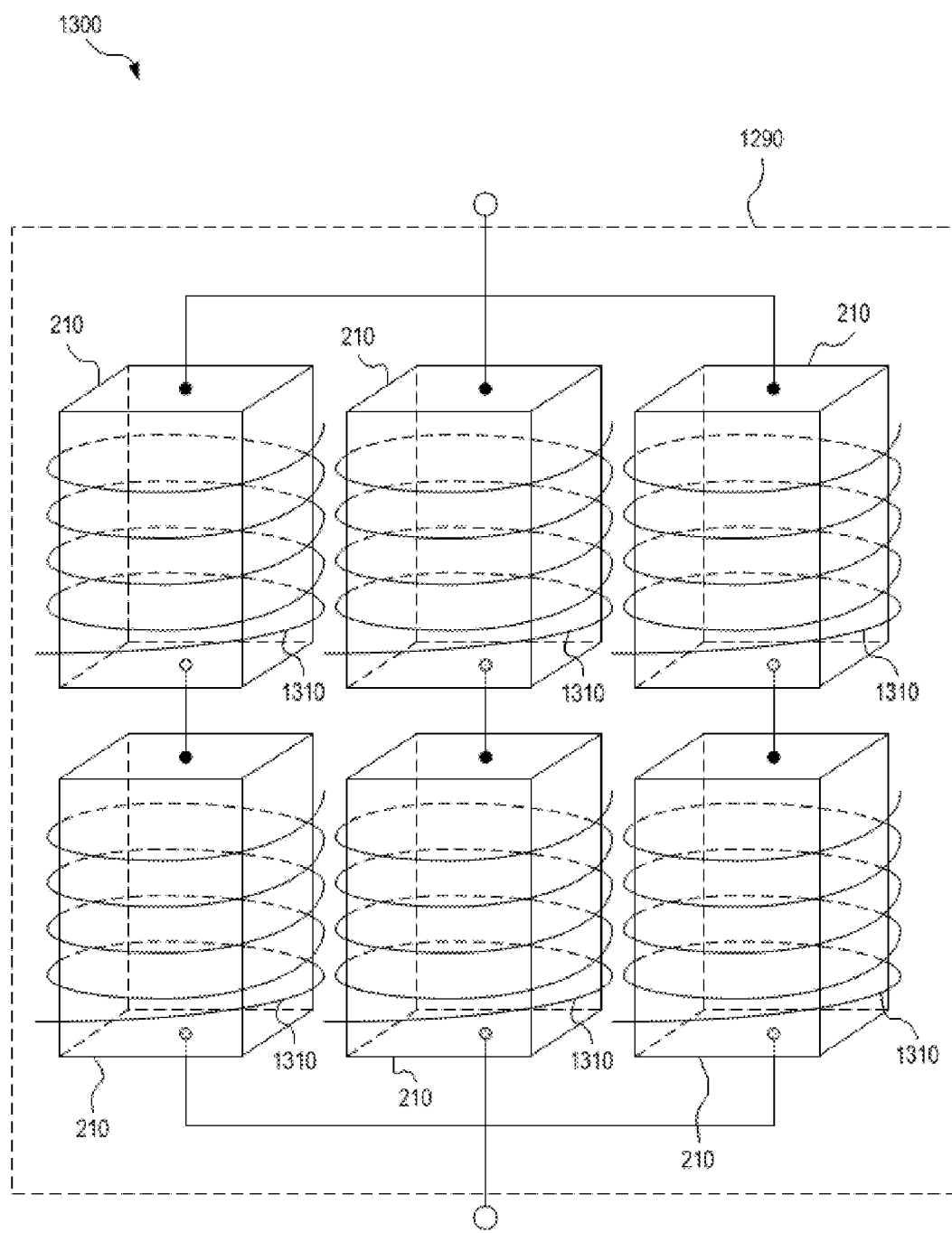
FIG. 13 illustrates an electrical/electrochemical energy unit configured for abnormality detection based upon sensing of electromagnetic radiation, using pickup coils wound around individual electrical/electrochemical energy devices, according to an embodiment.

FIG. 13 illustrates one exemplary electrical/electrochemical energy unit 1300 configured for abnormality detection based upon sensing of electromagnetic radiation, using pickup coils wound around individual electrical/electrochemical energy devices. Electrical/electrochemical energy unit 1300 is thus configured for detection of abnormality 180 (FIG. 1). Electrical/electrochemical energy unit 1300 includes energy unit 1200 (FIG. 12) and at least one radiation sensing unit 1310 located at a respective energy device 210 (FIGS. 2 and 12). Radiation sensing unit 1310 is a pickup coil wound around energy device 210, and is thus magnetically sensitive. Electromagnetic radiation generation within energy device 210 is associated with a change, as a function of time, in magnetic field within energy device 210, which in turn induces a current in radiation sensing unit 1310. Radiation sensing unit 1310 may be mounted directly onto energy device 210, be included in energy device 210, for example as part of packaging of energy device 210, or be mounted at a distance from energy device 210.

The orientation of windings of a pickup coil has implications for detection of electromagnetic radiation generated by accelerating charges. As discussed in connection with FIG. 1, an accelerating electrical charge generates electromagnetic radiation. The magnetic field associated with the electromagnetic radiation is, under ideal conditions, wherein the electromagnetic field is not directionally affected by other interactions, oriented orthogonal to the direction of movement of the accelerating electrical charges. A planar winding is sensitive to magnetic field changes, as a function of time, having a component that is perpendicular to the plane of the winding. Therefore, in the case of detection of electromagnetic radiation generated by accelerating charges, a planar winding is most sensitive to electromagnetic radiation generated by accelerating charges moving in a direction parallel to the plane of the winding, and least sensitive to electromagnetic radiation generated by accelerating charges moving in a direction orthogonal to the plane of the winding.

In one embodiment, the windings of radiation sensing unit 1310 are wound around a straight, common axis, with individual windings being substantially in a plane orthogonal to this axis. In this embodiment, radiation sensing unit 1310 is more sensitive to electromagnetic radiation generated by electrical current propagating perpendicularly to this axis than to electromagnetic radiation generated by electrical current propagating along this axis. In another embodiment, the windings of radiation sensing unit 1310 are wound around a two- or three-dimensional axis such that radiation sensing unit 1310 is sensitive to electromagnetic radiation generated from change in electrical current of any propagation direction. In yet another embodiment, radiation sensing unit 1310 includes a plurality of pickup coils wound around energy device 210 in a plurality of orientations.

Radiation sensing unit 1310 is an embodiment of sensing unit 220 (FIG. 2). Energy unit 1300 is an embodiment of energy unit 200 (FIG. 2). In one embodiment, energy unit 1300 includes a radiation sensing unit 1310 for each energy device 210 included in energy unit 1300. In another embodiment, only a portion of energy devices 210 are associated with respective radiation sensing units 1310.

Figure 14:
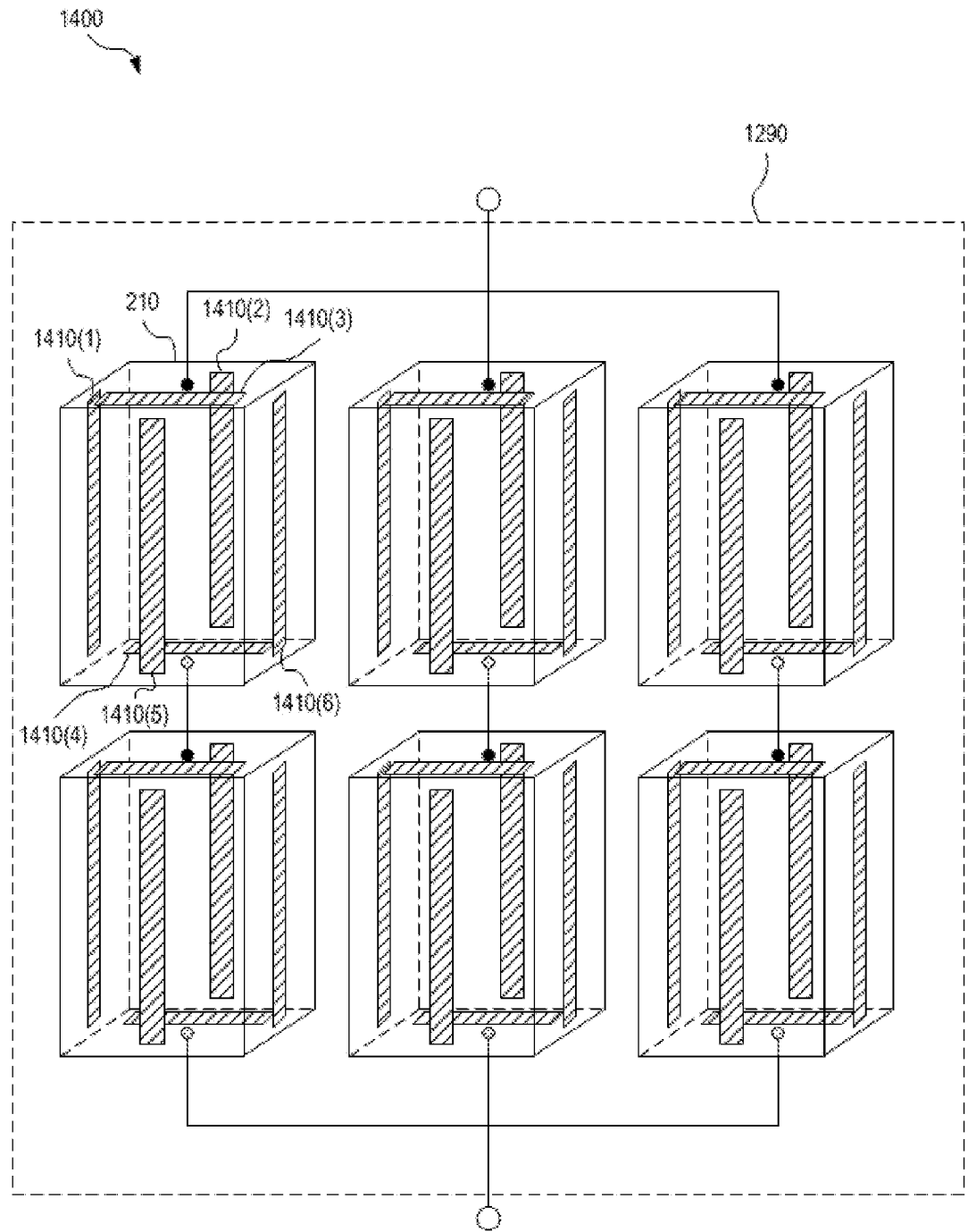
FIG. 14 illustrates an electrical/electrochemical energy unit configured for abnormality detection based upon sensing of electromagnetic radiation, using elongated pickup coils placed the sides of individual electrical/electrochemical energy devices, according to an embodiment.

FIG. 14 illustrates one exemplary electrical/electrochemical energy unit 1400 configured for abnormality detection based upon sensing of electromagnetic radiation, using elongated pickup coils placed the sides of individual electrical/electrochemical energy devices. Electrical/electrochemical energy unit 1400 is thus configured for detection of abnormality 180 (FIG. 1). Electrical/electrochemical energy unit 1400 includes energy unit 1200 (FIG. 12) and one or more radiation sensing units 1410. Radiation sensing unit 1410 is an elongated pickup coil. Radiation sensing unit 1410 is an embodiment of sensing unit 220 (FIG. 2). Energy unit 1400 is an embodiment of energy unit 200 (FIG. 2). For clarity of illustration, not all radiation sensing units 1410 are labeled in FIG. 14.

Figure 15:
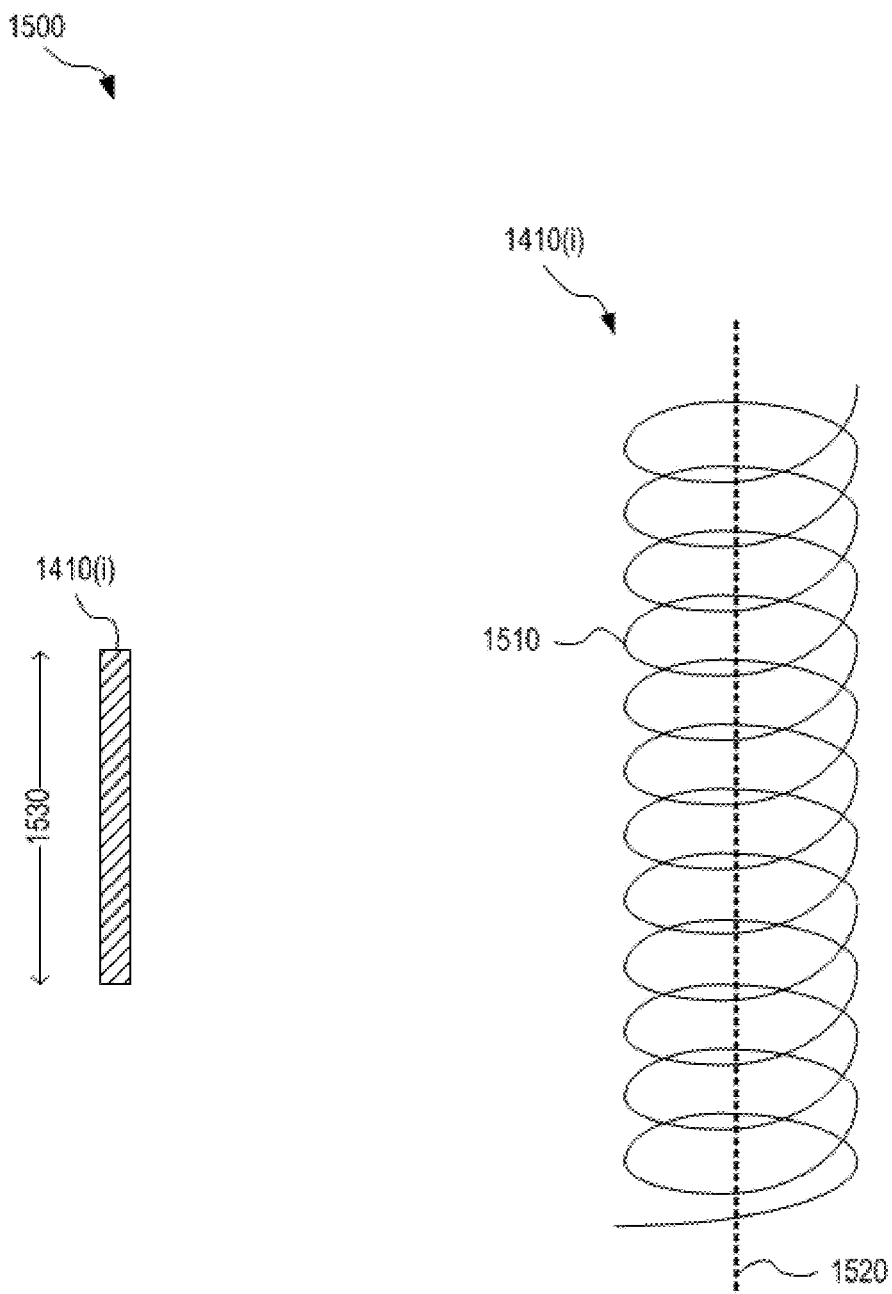
FIG. 15 is a diagram that schematically illustrates the radiation sensing unit of FIG. 14, according to an embodiment.

FIG. 15 is a diagram 1500 that schematically illustrates one exemplary radiation sensing unit 1410 (FIG. 14). Radiation sensing unit 1410 has windings 1510 wound around a substantially straight axis 1520. Axis 1520 is parallel to a longer dimension 1530 of radiation sensing unit 1410. Thus, radiation sensing unit 1410 is more sensitive to electromagnetic radiation propagating along dimension 1530.

Referring to FIG. 14, energy unit 1400 is similar to energy unit 1300 (FIG. 13) except for radiation sensing units 1310 (FIG. 13) being replaced by radiation sensing units 1410. Radiation sensing unit 1410 may be mounted directly onto energy device 210, be included in energy device 210, for example integrated in packaging of energy device 1410, or be mounted at a distance from energy device 210. In one embodiment, an energy device 210 in energy unit 1400 is associated with only a single radiation sensing unit 1410. In another embodiment, an energy device 210 included in energy unit 1400 is associated with a plurality of radiation sensing units 1410. As indicated in FIG. 14, the plurality of radiation sensing units 1410 may include radiation sensing units 1410 with respective longer dimensions 1530 of different orientations. According to the discussion of directional sensitivity of pickup coil windings, this provides improved sensitivity to electromagnetic radiation generated from change in electrical current having arbitrary propagation direction. Additionally, signals from a plurality of sensing units 1410 with respective longer dimensions 1530 of different orientations may be processed to obtain information about the direction of the electrical current giving rise to the signals.

Figure 16:
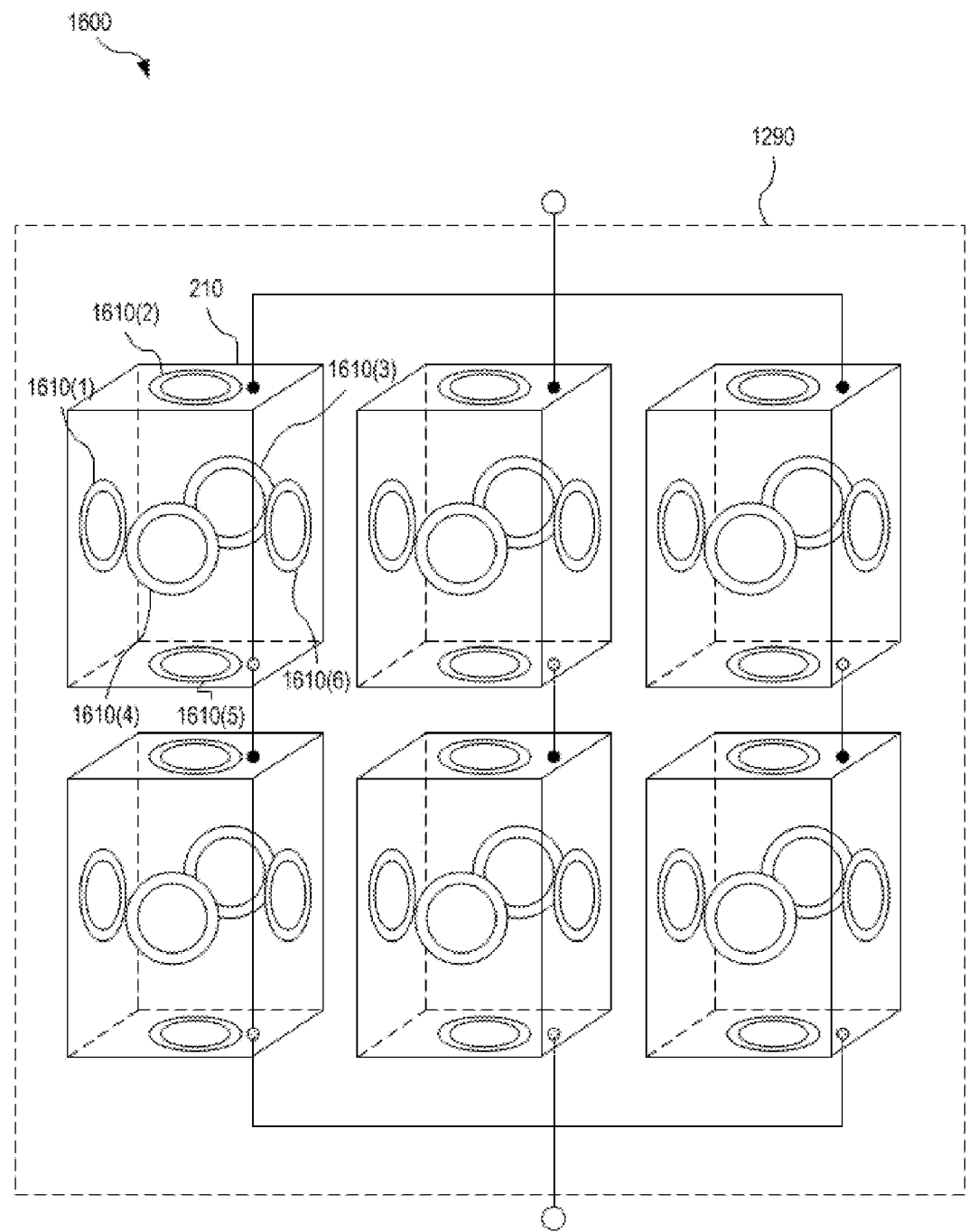
FIG. 16 illustrates an electrical/electrochemical energy unit configured for abnormality detection based upon sensing of electromagnetic radiation, using planar pickup coils placed the sides of individual electrical/electrochemical energy devices, according to an embodiment.

FIG. 16 illustrates one exemplary electrical/electrochemical energy unit 1600 configured for abnormality detection based upon sensing of electromagnetic radiation, using planar pickup coils placed the sides of individual electrical/electrochemical energy devices. Electrical/electrochemical energy unit 1600 is thus configured for detection of abnormality 180 (FIG. 1). Electrical/electrochemical energy unit 1600 includes energy unit 1200 (FIG. 12) and one or more radiation sensing units 1610. Radiation sensing unit 1610 is a substantially planar pickup coil. Radiation sensing unit 1610 is an embodiment of sensing unit 220 (FIG. 2). Energy unit 1600 is an embodiment of energy unit 200 (FIG. 2). For clarity of illustration, not all radiation sensing units 1610 are labeled in FIG. 16.

Figure 17:
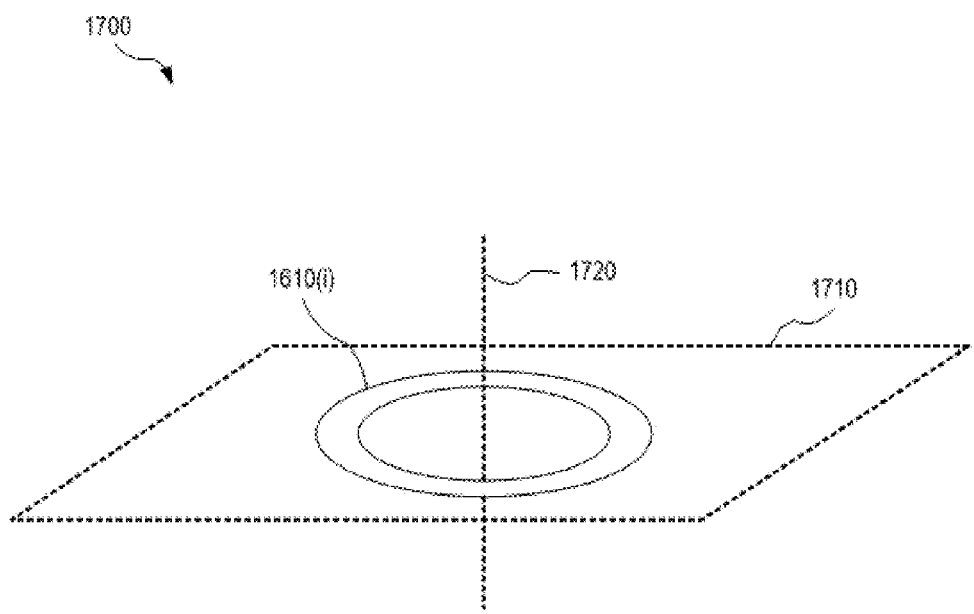
FIG. 17 is a diagram that schematically illustrates the radiation sensing unit of FIG. 16, according to an embodiment.

FIG. 17 is a diagram 1700 that schematically illustrates one exemplary radiation sensing unit 1610 (FIG. 16). Radiation sensing unit 1610 is substantially parallel to a plane 1710 and has at least one winding wound around an axis 1720 that is orthogonal to plane 1710. Thus, radiation sensing unit 1410 is more sensitive to electromagnetic radiation propagating orthogonally to plane 1710.

Referring to FIG. 16, energy unit 1600 is similar to energy unit 1500 (FIG. 15) except for radiation sensing units 1510 (FIG. 15) being replaced by radiation sensing units 1610. Radiation sensing unit 1610 may be mounted directly onto energy device 210, be included in energy device 210, for example integrated in packaging of energy device 1610, or be mounted at a distance from energy device 210. In one embodiment, an energy device 210 in energy unit 1600 is associated with only a single radiation sensing unit 1610. In another embodiment, an energy device 210 included in energy unit 1600 is associated with a plurality of radiation sensing units 1610. As indicated in FIG. 16, the plurality of radiation sensing units 1610 may include radiation sensing units 1610 of different orientations. This provides improved sensitivity to electromagnetic radiation generated from change in electrical current having arbitrary propagation direction. Additionally, signals from a plurality of sensing units 1610 of different orientations may be processed to obtain information about the direction of the electrical current giving rise to the signals.

Figure 18:
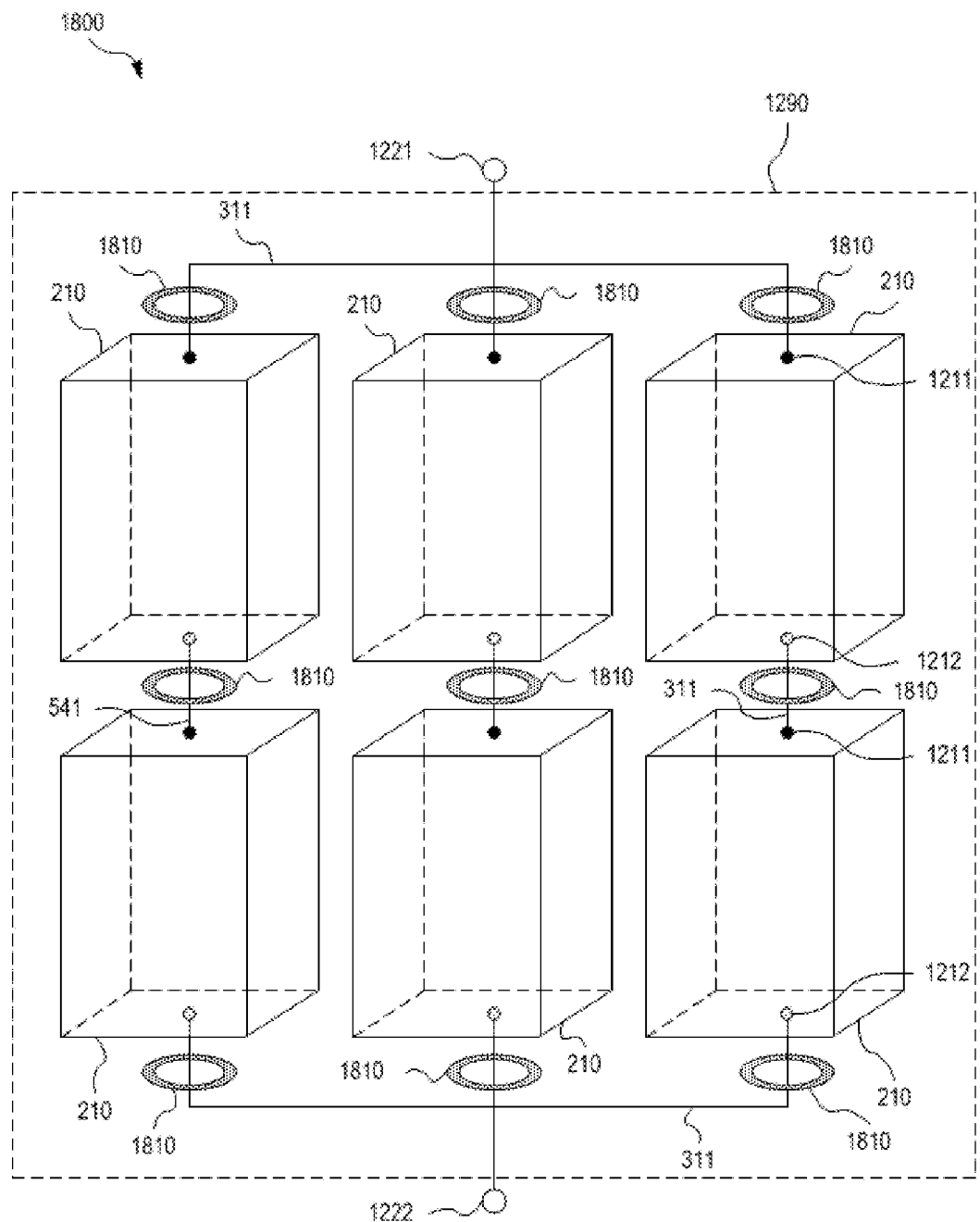
FIG. 18 illustrates an electrical/electrochemical energy unit configured for abnormality detection based upon sensing of electromagnetic radiation, using magnetic induction sensors placed around individual electrical connections within the electrical/electrochemical energy unit, according to an embodiment.

FIG. 18 illustrates one exemplary electrical/electrochemical energy unit 1800 configured for abnormality detection based upon sensing of electromagnetic radiation, using magnetic induction sensors placed around individual electrical connections within the electrical/electrochemical energy unit. Electrical/electrochemical energy unit 1800 is thus configured for detection of abnormality 180 (FIG. 1).

Electrical/electrochemical energy unit 1800 includes energy unit 1200 (FIG. 12) and one or more radiation sensing units 1810 placed around electrical connections 311 (FIGS. 3 and 12). Radiation sensing unit 1810 is an embodiment of sensing unit 320 (FIG. 3). Energy unit 1600 is an embodiment of energy unit 300 (FIG. 3). For clarity of illustration, not all radiation sensing units 1610 are labeled in FIG. 16. Radiation sensing unit 1810 is a magnetic induction sensor, such as a toroidal inductor. Radiation sensing unit 1810 is therefore sensitive to changes in current passing through the corresponding electrical connection 311, through its coupling with the electromagnetic field associated with electrical connection 311. In other words, a change in current passing through electrical connection 311 produces electromagnetic radiation which is sensed by radiation sensing unit 1810. The change in current may be caused by an abnormality in electrical connection 311, such as a short or break, or be caused by an abnormality in an energy device 210 that is either directly or indirectly connected with electrical connection 311. Accordingly, radiation sensors 1810 may detect abnormalities in electrical connections 311 and/or energy devices 210.

Figure 19A:
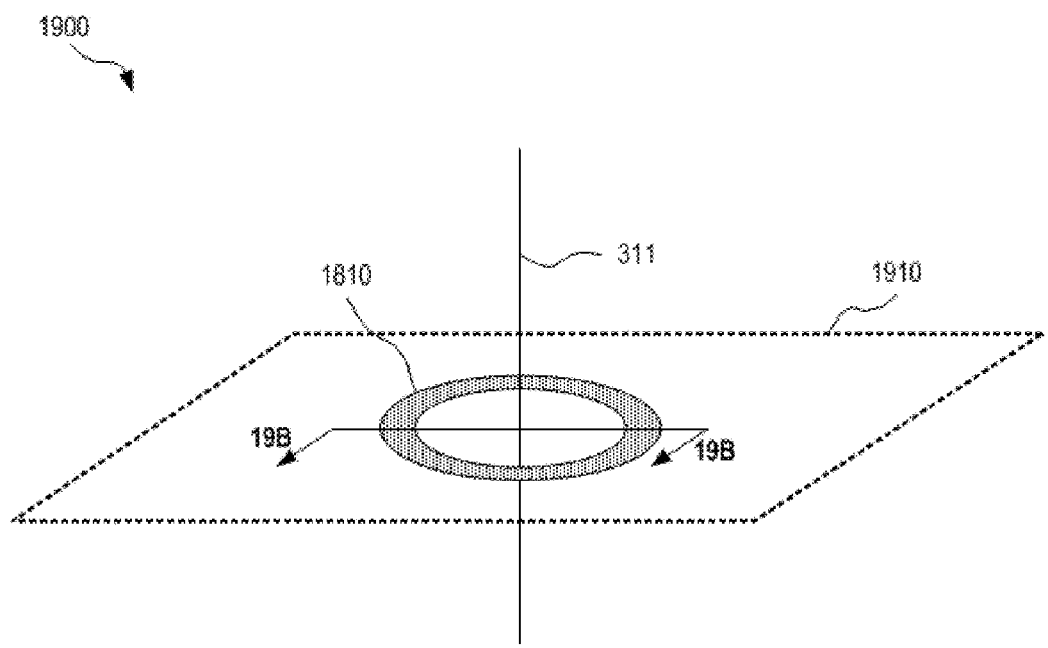
FIGS. 19A and 19B schematically illustrate the radiation sensing unit of FIG. 18, according to an embodiment.
Figure 19B:
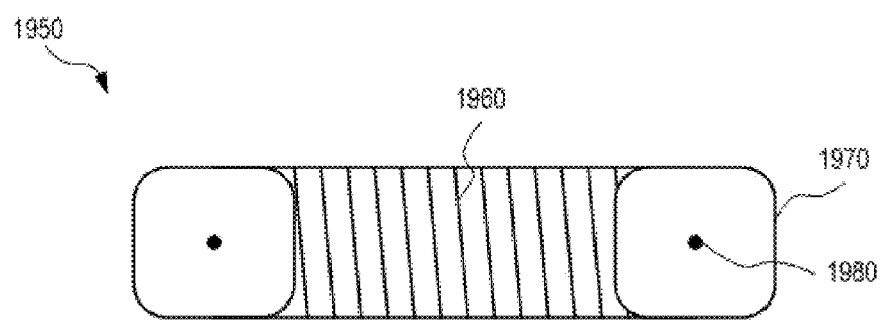

FIGS. 19A and 19B schematically illustrate an exemplary embodiment of radiation sensing unit 1810 (FIG. 18). FIG. 19A is a diagram 1900 showing radiation sensing unit 1810 in perspective view. Radiation sensing unit 1810 is substantially parallel to a plane 1910 that is orthogonal to a portion of electrical connection 311 (FIGS. 3, 12, and 18).

FIG. 19B illustrates one exemplary toroidal inductor 1950 which is an embodiment of radiation sensor 1810 (FIG. 18). FIG. 19B shows a cross sectional view of toroidal inductor 1950, where the cross section is taken along line 19B-19B of FIG. 19A. Toroidal inductor 1950 includes windings 1960 wound around a core 1970 that follows a closed-loop path 1980. For example, closed-loop path 1980 may be circular, oval, rectangular, square or have another substantially planar shape, such that closed-loop path 1980 is substantially parallel to plane 1910 (FIG. 19A). In an embodiment, core 1970 includes a ferromagnetic material for providing increased sensitivity of magnetically induced current in windings 1960 to changes in electrical current through electrical connection 311.

Referring to FIG. 18, energy unit 1800 may include one or more radiation sensors 1810. Although illustrated with a radiation sensor 1810 for every individual electrical connection 311 connected to an energy device 210, energy unit may include fewer or more radiation sensors 1810, and energy devices 210, than shown in FIG. 18, without departing from the scope hereof.

Figure 20:
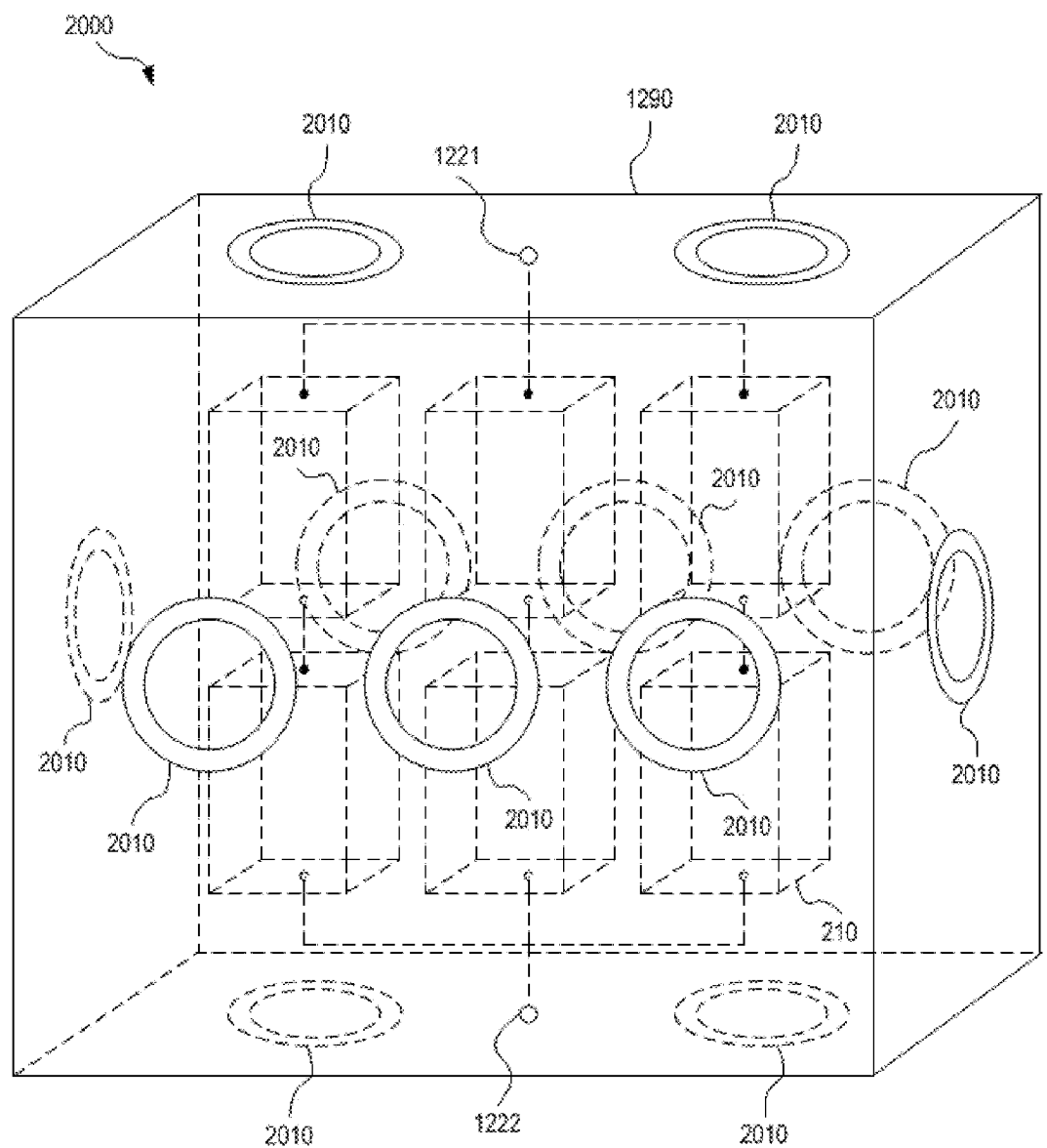
FIG. 20 illustrates an electrical/electrochemical energy unit configured for abnormality detection based upon electromagnetic radiation sensing using sensing units located on the exterior of the electrical/electrochemical energy unit, according to an embodiment.

FIG. 20 illustrates one exemplary electrical/electrochemical energy unit 2000 configured for abnormality detection based upon electromagnetic radiation sensing using sensing units located on the exterior of electrical/electrochemical energy unit 2000. Electrical/electrochemical energy unit 2000 is thus configured for detection of abnormality 180 (FIG. 1). Electrical/electrochemical unit 2000 includes energy unit 1200 (FIG. 12) and an enclosure 1290. Enclosure 1290 includes at least one radiation sensing unit 2010. Radiation sensing unit 2010 is an embodiment of sensing unit 410 (FIG. 4). Energy unit 2000 is an embodiment of energy system 400 (FIG. 4). Radiation sensing unit 2010 may be located externally to enclosure 1290 or inside enclosure 1290, without departing from the scope hereof. In an embodiment, radiation sensing unit is a pickup coil such as radiation sensing unit 1410 (FIGS. 14 and 15) or radiation sensing unit 1610 (FIGS. 16 and 17).

In an embodiment, energy unit 2000 includes a plurality of radiation sensing units 1610. In an embodiment, energy unit 2000 includes a plurality of directionally sensitive radiation sensing units 1610 of different orientations, to improve sensitivity to detection of electromagnetic radiation generated by electrical current of arbitrary propagation direction. In an embodiment, energy unit 2000 includes a single radiation sensing unit 2010. In an embodiment, energy unit 2000 includes a single radiation sensing unit 2010 that is sensitive to electromagnetic radiation generated by electrical current of arbitrary propagation direction.

One or more of the embodiments illustrated in FIGS. 13 through 20 may be combined as discussed in connection with FIGS. 5 through 8, without departing from the scope hereof. While the radiation sensing unit embodiments of FIGS. 13, 14, 15, 16, 17, and 20 are discussed as being pickup coils, these radiation sensing units may be other sensing devices sensitive to magnetic field changes as a function of time, such as a Hall-effect probe, an inductor, a high electrical-conductivity spiral, a pickup coil including a ferrite core, or a toroidal inductor, without departing from the scope hereof.

Figure 21:
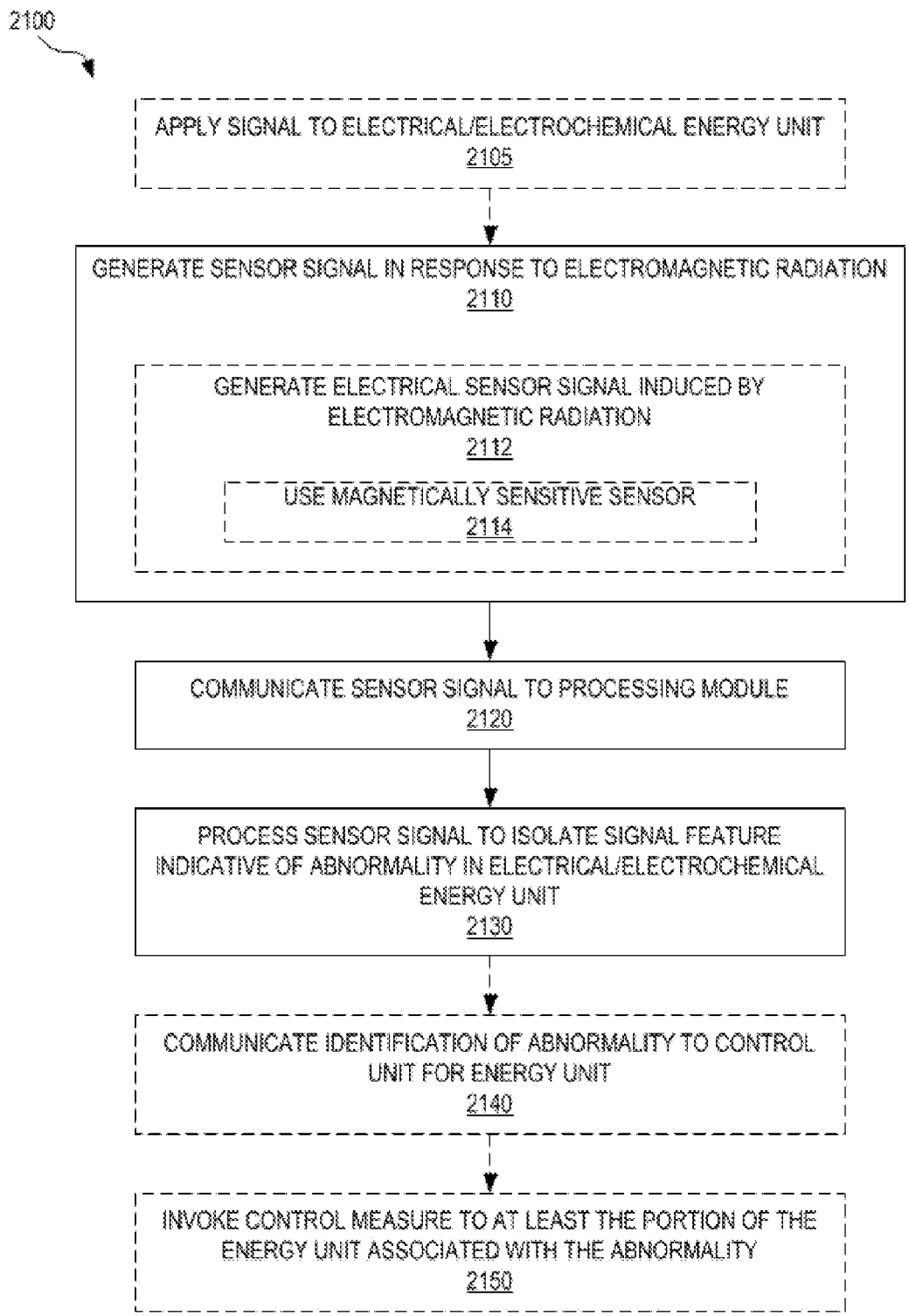
FIG. 21 illustrates a method for detecting an abnormality in an electrical/electrochemical energy device or unit utilizing sensing of electromagnetic radiation generated by the abnormality, according to an embodiment.

FIG. 21 illustrates one exemplary method 2100 for detecting an abnormality, such as abnormality 180 (FIG. 1), in an electrical/electrochemical energy device or unit utilizing sensing of electromagnetic radiation generated by the abnormality. Method 2100 is performed, for example, by abnormality detection system 900 (FIG. 9) or by abnormality detection system 1100 (FIG. 11).

In a step 2110, a sensor signal is generated in response to electromagnetic radiation. For example, radiation sensor 910 of abnormality detection system 900 (FIG. 9) generates a sensor signal in response to electromagnetic radiation sensed by one or more sensing units 915 (FIG. 9). In an embodiment, step 2110 includes a step 2112, wherein an electrical sensor signal is induced by electromagnetic radiation. For example, radiation sensor 910 (FIG. 9) generates an electrical signal that is induced by electromagnetic radiation in one or more sensing units 915 (FIG. 9). Optionally, step 2112 includes a step 2114 of using a sensor that is sensitive to at least changes, as a function of time, in magnetic field. For example, radiation sensor 910 (FIG. 9) includes, for generating an electrical signal that is induced by electromagnetic radiation, at least one sensing unit 915 (FIG. 9) implemented according to one or more of the embodiments specified by sensing unit 1310 (FIG. 13), sensing unit 1410 (FIGS. 14 and 15), sensing unit 1610 (FIGS. 16 and 17), and sensing unit 1810 (FIGS. 18 and 19). In another example, radiation sensor 910 (FIG. 9) includes, for generating an electrical signal that is induced by electromagnetic radiation, at least one sensing unit 915 (FIG. 9) implemented as a Hall-effect probe, an inductor, a pickup coil including a ferrite core, or a high electrical-conductivity spiral.

In a step 2120, the sensor signal generated in step 2110 is communicated to a processing module. For example, radiation sensor 910 (FIG. 9) communicates a sensor signal to processing module 930 via interface 920. In an embodiment, the sensor signal is communicated to the processing module using a wireless interface. For example, radiation sensor 910 (FIG. 9) communicates a sensor signal to processing module 930 via wireless interface 925. In a step 2130, the sensor signal is processed to isolate a signal feature indicative of an abnormality in an electrical/electrochemical energy unit under consideration. For example, processor 940 (FIG. 9) processes the sensor signal received in step 2120 according to instructions 960 (FIG. 9) to isolate the signal feature. Optionally, processor 940 (FIG. 9) utilizes abnormality criteria 966 (FIG. 9) to isolate the signal feature from other features of the sensor signal. Isolation of signal features is further discussed below in connection with FIG. 27. In certain embodiments, step 2130 includes filtering the sensor signal to reduce components of the sensor signal not associated with the abnormality. For example, step 2130 may include filtering out frequencies outside a frequency range of interest and/or Wiener filtering. In certain embodiments, method 2100 is capable of isolating the signal feature, and thus detect the abnormality associated therewith, in less than 10 milliseconds after occurrence of the abnormality.

In an embodiment, method 2100 further includes a step 2140, wherein identification of an abnormality in an electrical/electrochemical energy unit is communicated to a control unit associated with the electrical/electrochemical energy unit. For example, processor 930 (FIG. 9) communicates to control unit 140 (FIGS. 1 and 9) that a signal feature indicative of an abnormality in energy unit 905 (FIG. 9) has been identified. In an embodiment, method 2100 further includes a step 2150, wherein a control measure is invokes to at least a portion of an electrical/electrochemical energy unit associated with the abnormality. For example, control unit 140 (FIGS. 1 and 9) invokes a control measure, as discussed in connection with FIG. 1, to at least a portion of energy unit 905 (FIG. 9) associated with the abnormality.

In one embodiment, method 2100 is executed as a passive abnormality detection method, wherein no signals are applied to the electrical/electrochemical energy unit or device to induce generation of the electromagnetic radiation of step 2110. In another embodiment, method 2100 is executed as a system response based abnormality detection method. In this embodiment, method 2100 further includes a step 2105 performed prior to step 2110, wherein a signal is applied to the electrical/electrochemical energy unit or device. The signal may be, for example, an electrical signal, a low-power high-frequency signal with frequency in the range between 1 kilohertz and 10 gigahertz, a low-power high-frequency signal with frequency in the range between megahertz and 10 gigahertz, a current in the range between 1 milliampere and 1 ampere, a signal with time-dependent frequency, electromagnetic radiation, a magnetic field, or a chemical interaction. For example, transmitter unit 980 (FIG. 9) applies a signal, as discussed in connection with FIG. 9, to electrical/electrochemical energy unit 905 (FIG. 9) to induce generation of a sensor signal having the signal feature discussed in connection with step 2130.

Figure 22:
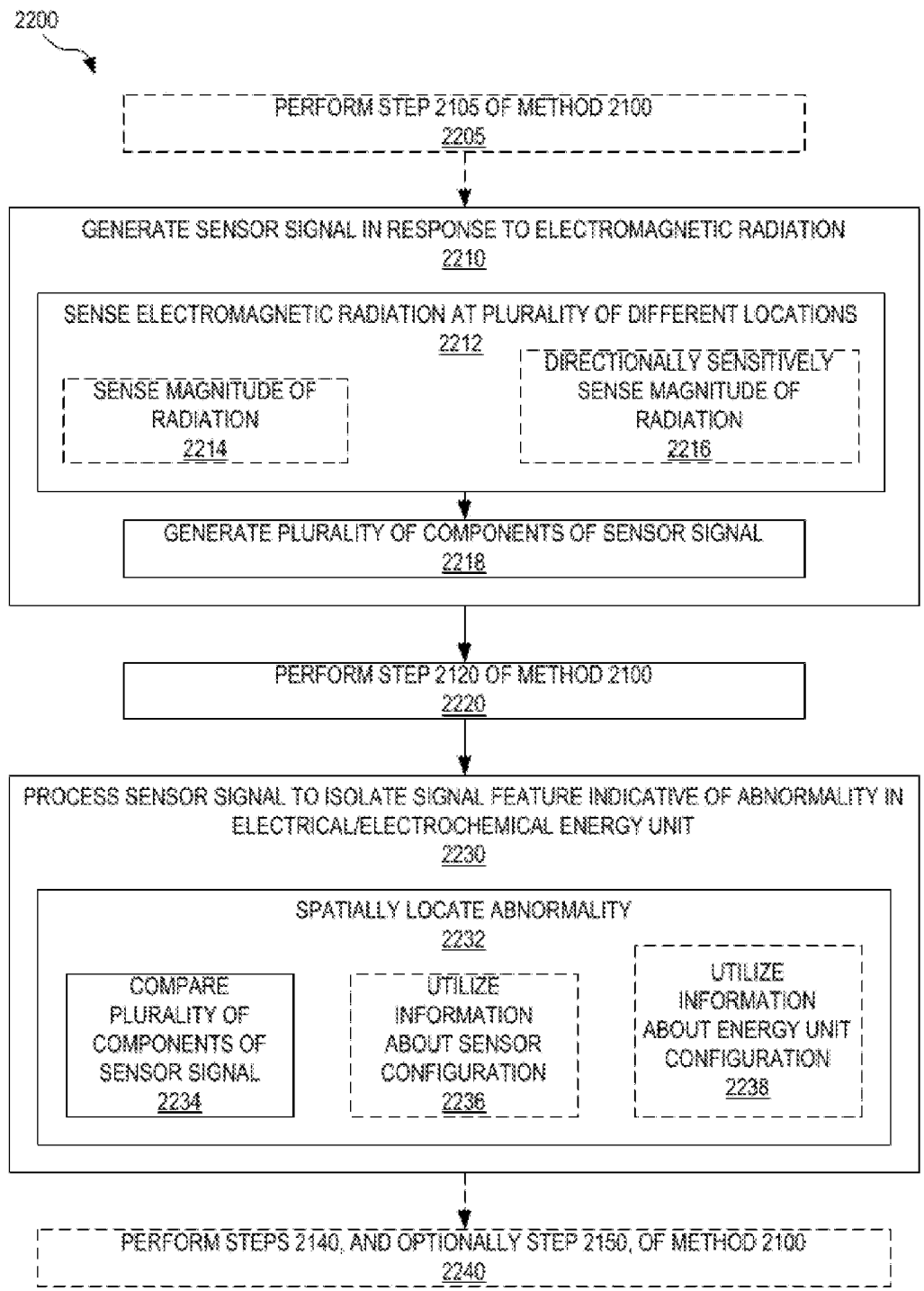
FIG. 22 illustrates a method that utilizes sensing of electromagnetic radiation to detect and spatially locate an abnormality in an electrical/electrochemical energy unit or device, according to an embodiment.

FIG. 22 illustrates one exemplary method 2200 that utilizes sensing of electromagnetic radiation to detect and spatially locate an abnormality, such as abnormality 180 (FIG. 1), in an electrical/electrochemical energy unit or device. Method 2200 is performed, for example, by abnormality detection system 900 (FIG. 9) or by abnormality detection system 1100 (FIG. 11). Method 2200 is an embodiment of method 2100 (FIG. 21).

In a step 2210, a sensor signal is generated in response to electromagnetic radiation. Step 2210 is an embodiment of step 2110 of method 2100 (FIG. 21), which includes steps 2212 and 2218. In step 2212, electromagnetic radiation is sensed in a plurality of different locations. For example, radiation sensor 910 (FIG. 9) senses electromagnetic radiation using a plurality of sensing units 915 (FIG. 9) located in a respective plurality of different locations with respect to electrical/electrochemical energy unit 905 (FIG. 9). FIGS. 13, 14, 16, 18, and 20, and combinations thereof, provide examples of spatial configurations of sensing units 915 (FIG. 9). In an embodiment, step 2212 includes a step 2214, wherein the magnitude of electromagnetic radiation is sensed. For example, each of a plurality of sensing units 915 (FIG. 9) senses magnitude of electromagnetic radiation at the location of the sensing unit 915. In an embodiment, step 2212 includes a step 2216, wherein the magnitude of electromagnetic radiation is sensed with directional sensitivity, such that information about direction of electrical current responsible for generating the electromagnetic radiation may be deduced. For example, each of a plurality of sensing units 915 (FIG. 9) are implemented as a directionally sensitive magnetic induction device, such as sensing unit 1310 (FIG. 13), sensing unit 1410 (FIGS. 14 and 15), sensing unit 1610 (FIGS. 16 and 17), or sensing unit 18 (FIGS. 18 and 19). Alternatively, each of a plurality of sensing units 915 (FIG. 9) may be implemented as a Hall-effect probe. In step 2218, a sensor signal, having a plurality of sensor signal components, is generated. For example, each of a plurality of sensing units 915 (FIG. 9) generates, from sensing of electromagnetic radiation, a respective component of a sensor signal. Sensor signal components may be zero or empty, representative of sensing no electromagnetic radiation, without departing from the scope hereof. In a step 2220, method 2200 performs step 2120 of method 2100 (FIG. 21).

In a step 2230, the sensor signal generated in step 2210 is processed to isolate a signal feature indicative of an abnormality in an electrical/electrochemical energy unit or device. Step 2230 is an embodiment of step 2130 of method 2100 (FIG. 21), which further includes a step 2232. In step 2232, the abnormality is spatially located. For example, processor 940 (FIG. 9) processes, according to instructions 960 (FIG. 9), the sensor signal generated in step 2210 to spatially located the abnormality. Step 2232 includes a step 2234, and, optionally, one or both of steps 2236 and 2238. In step 2234, the plurality of sensor signal components generated in step 2218 are compared. In optional step 2236, information about the configuration of sensors used in step 2210 is utilized. In optional step 2238 information about the configuration of the electrical/electrochemical energy unit or device under consideration is utilized. For example, processor 940 (FIG. 9) compares, according to instructions 960 (FIG. 9), the plurality of sensor signal components generated in step 2218 to spatially locate an abnormality in electrical/electrochemical energy unit 905 (FIG. 9). Processor 940 (FIG. 9) may retrieve one or more of Maxwell's equations, the wave equation, the Larmor formula, and battery equations including thermodynamics and kinetics from instructions 960 (FIG. 9), to deduce the spatial location of the abnormality from the sensor signal components. Optionally, processor 940 (FIG. 9) retrieves one or both radiation sensor configuration 964 (FIG. 9) and energy unit configuration 962 (FIG. 9) to account for spatial configurations and other properties of one or more of sensor 910 (FIG. 9) and electrical/electrochemical energy unit 905 (FIG. 9), respectively. In certain embodiments, method 2200 is capable of isolating the signal feature, and thus detect the abnormality associated therewith, as well as spatially locating the abnormality in less than 10 milliseconds after occurrence of the abnormality.

In an embodiment, method 2200 further includes a step 2240. In step 2240, method 2200 performs step 2140, and optionally step 2150, of method 2100 (FIG. 21). In one embodiment, method 2200 is executed as a passive abnormality detection method, wherein no signals are applied to the electrical/electrochemical energy unit or device to induce generation of the electromagnetic radiation of step 2210. In another embodiment, method 2200 is executed as a system response based abnormality detection method. In this embodiment, method 2200 further includes a step 2205 performed prior to step 2210, wherein method 2200 performs step 2105 of method 2100 (FIG. 21).

Figure 23:
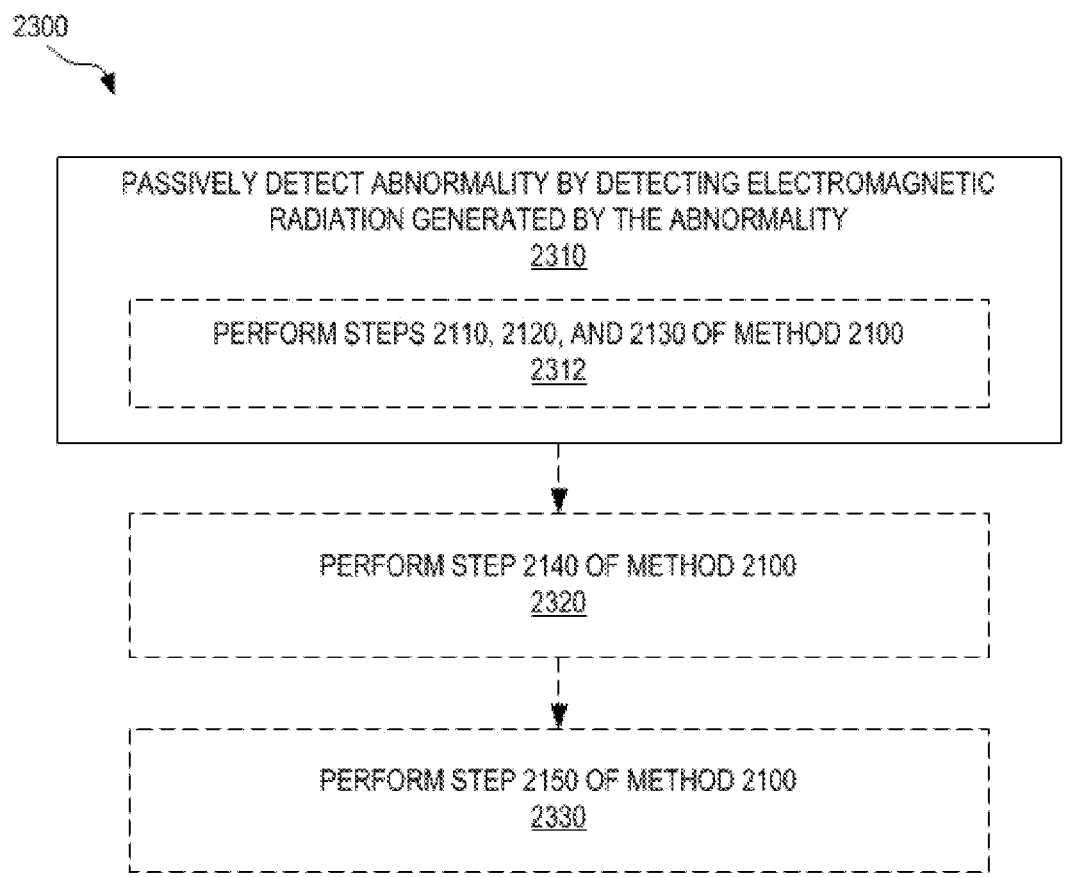
FIG. 23 illustrates a method for passively detecting an abnormality in an electrical/electrochemical energy unit using sensing of electromagnetic radiation, according to an embodiment.

FIG. 23 illustrates one exemplary method 2300 for passively detecting an abnormality, such as abnormality 180 (FIG. 1), in an electrical/electrochemical energy unit using sensing of electromagnetic radiation. Method 2300 is performed, for example, by abnormality detection system 900 (FIG. 9) or abnormality detection system 1100 (FIG. 11), without using transmitter unit 980 (FIG. 9) to induce generation of the electromagnetic radiation. In a step 2310, electromagnetic radiation generated by an abnormality is passively detected. For example, sensor 910 and processing module 930 of abnormality detection system 900 (FIG. 9) cooperate to passively detect electromagnetic radiation generated by an abnormality in electrical/electrochemical energy unit 905 (FIG. 9). The electromagnetic radiation is generated by the abnormality without using externally applied signals to deliberately induce generation of the electromagnetic radiation. In certain embodiments, method 2300 is capable of detecting the abnormality in less than 10 milliseconds after occurrence of the abnormality.

In an embodiment, step 2310 includes a step 2312, wherein method 2300 performs steps 2110, 2120, and 2130 of method 2100 (FIG. 21). In certain embodiments, method 2300 further includes a step 2320 and, optionally, a step 2330. In step 2320, method 2300 performs step 2140 of method 2100 (FIG. 21). In step 2330, method 2300 performs step 2150 of method 2100 (FIG. 21).

Figure 24:
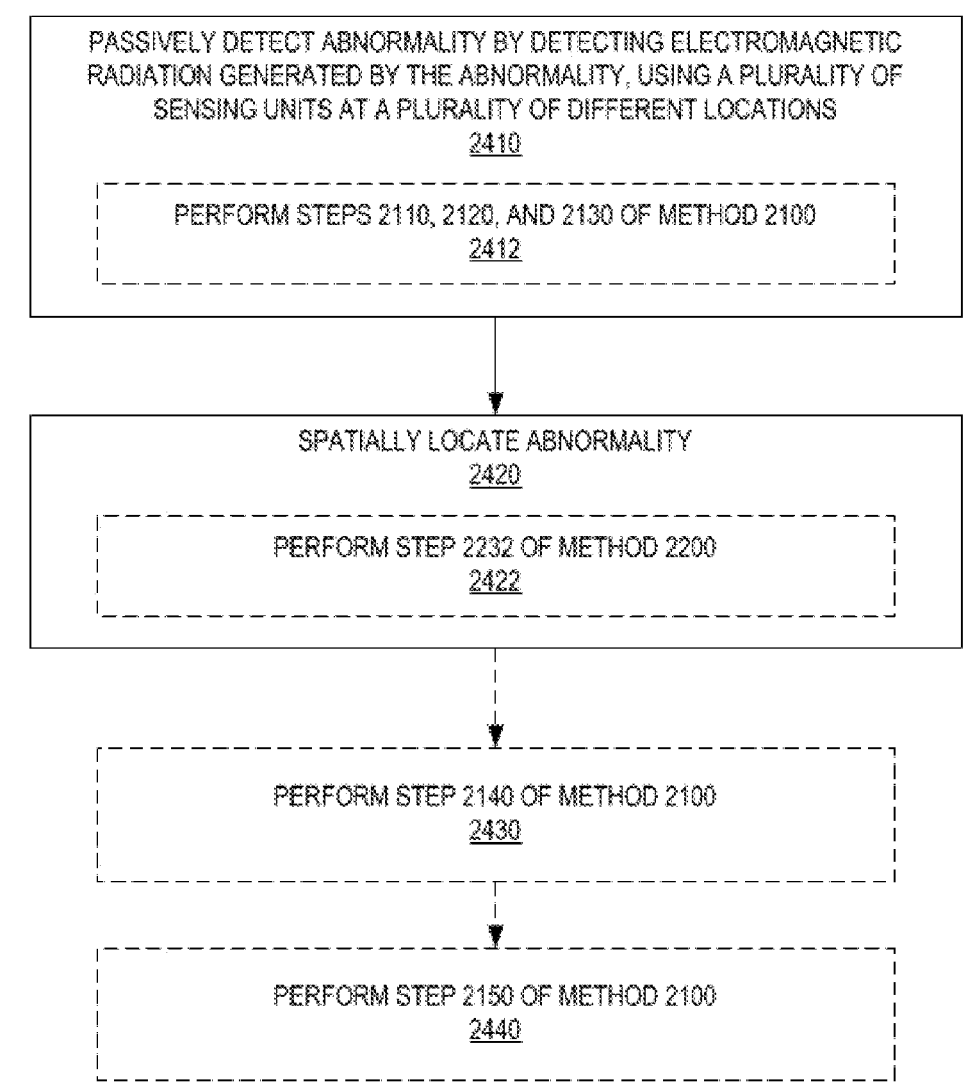
FIG. 24 illustrates a method for passively detecting and spatially locating an abnormality in an electrical/electrochemical energy unit or device using sensing of electromagnetic radiation, according to an embodiment.

FIG. 24 illustrates one exemplary method 2400 for passively detecting and spatially locating an abnormality in an electrical/electrochemical energy unit or device using sensing of electromagnetic radiation. Method 2400 is performed, for example, by abnormality detection system 900 (FIG. 9) or abnormality detection system 1100 (FIG. 11).

In a step 2410, an abnormality in an electrical/electrochemical energy unit or device is passively detected, using a plurality of sensing units located in a respective plurality of different locations to sense electromagnetic radiation generated by the abnormality. The electromagnetic radiation is generated by the abnormality without using externally applied signals to deliberately induce generation of the electromagnetic radiation. For example, sensor 910, using a plurality of sensing units 915 located in a respective plurality of different locations, and processing module 930 of abnormality detection system 900 (FIG. 9) cooperate to passively detect electromagnetic radiation generated by an abnormality in electrical/electrochemical energy unit 905 (FIG. 9). In an embodiment, step 2410 includes a step 2412, wherein method 2400 performs steps 2110, 2120, and 2130 of method 2100 (FIG. 21).

In a step 2420, the abnormality is spatially located. For example, processing module 930 (FIG. 9) processes passive measurements performed by a plurality of sensing units 915 (FIG. 9), positioned in plurality of different locations, to spatially locate the abnormality. In an embodiment, step 2420 includes a step 2422, wherein method 2400 performs step 2232 of method 2200 (FIG. 22). In certain embodiments, method 2400 is capable of detecting and spatially locating the abnormality in less than 10 milliseconds after occurrence of the abnormality. In certain embodiments, method 2400 further includes a step 2430 and, optionally, a step 2440. In step 2430 method 2400 performs step 2140 of method 2100 (FIG. 21). In step 2440, method 2400 performs step 2150 of method 2100 (FIG. 21).

Figure 25:
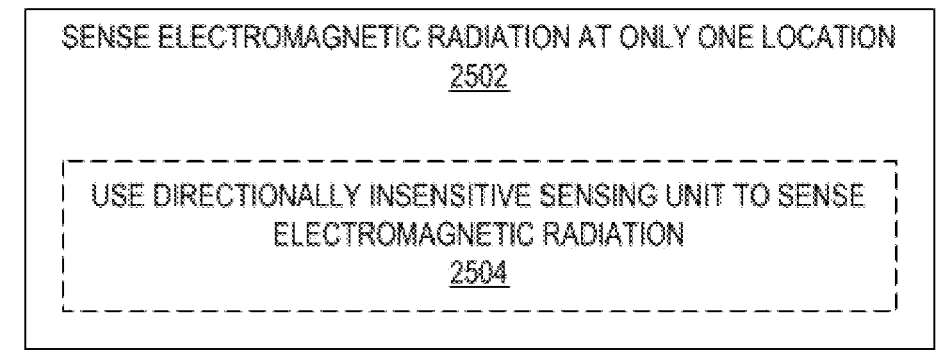
FIG. 25 illustrates a method for generating a sensor signal in the method of FIG. 21.

FIG. 25 illustrates one exemplary method 2500 for performing step 2110 of method 2100 (FIG. 21). When performing method 2100 (FIG. 21) with method 2500 implemented as step 2110 (FIG. 21), an abnormality in an electrical/electrochemical energy unit or device is detected using only a single sensing unit. Method 2500 is performed, for example, by sensor 910 of abnormality detection system 900 (FIG. 9). In a step 2502, electromagnetic radiation is sensed in only a single location. For example, sensor 910 (FIG. 9) includes only a single sensing unit 915 (FIG. 9), which senses electromagnetic radiation.

In an embodiment, step 2502 includes a step 2504. In step 2504, a directionally insensitive sensing unit is used to sense the electromagnetic radiation. This helps ensure detection of abnormalities associated with electrical current of arbitrary propagation direction. For example, sensor 910 (FIG. 9) includes only a single sensing unit 915 (FIG. 9), which is directionally insensitive. This sensing unit may be, for example, a pickup coil with windings wound around a two- or three-dimensional axis. Alternatively, the single sensing unit includes a plurality of directionally sensitive sensing units, such as a pickup coil with windings would around a one-dimensional axis, having a respective plurality of different orientations.

Figure 26:
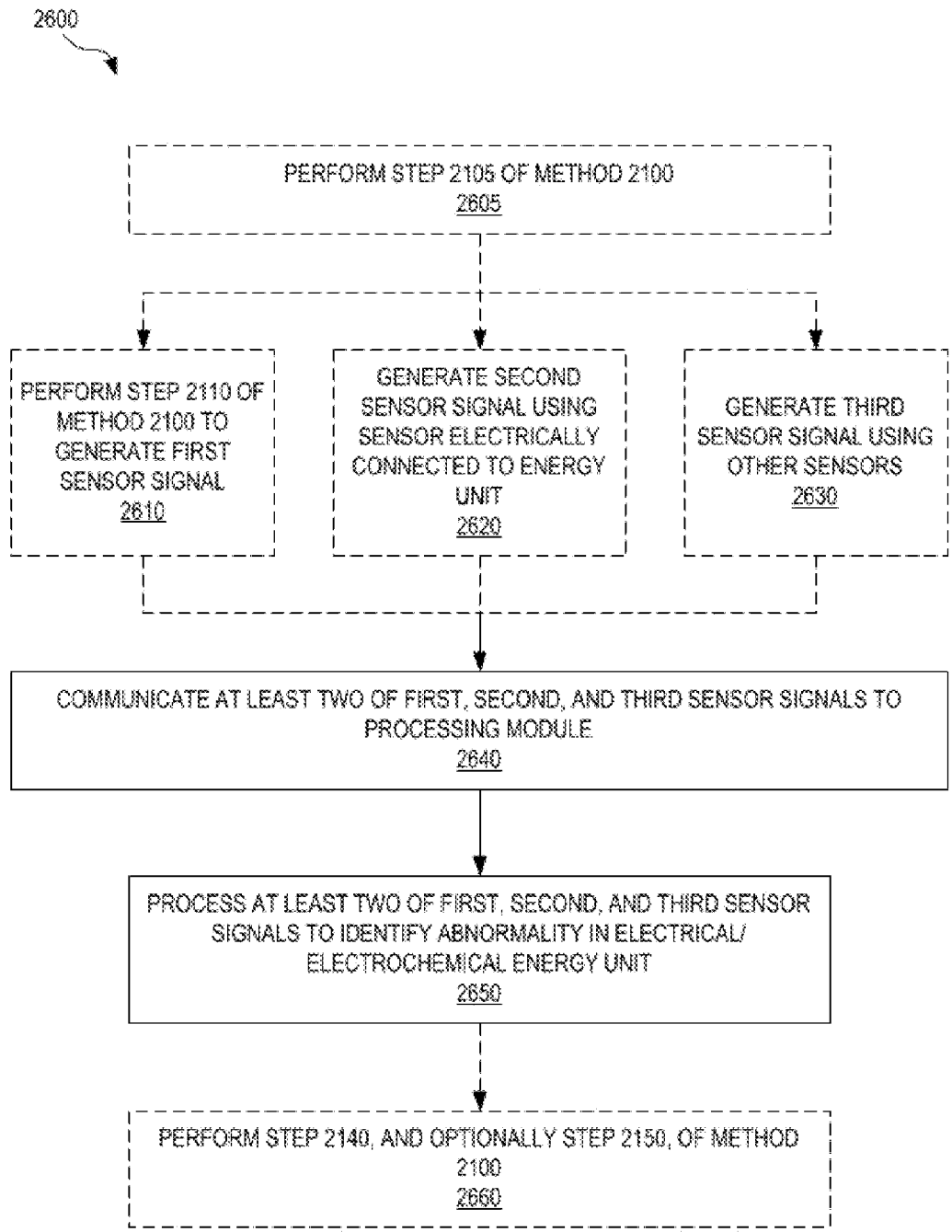
FIG. 26 illustrates a method for detecting an abnormality in an electrical/electrochemical energy unit or device using a plurality of different detection methodologies, according to an embodiment.

FIG. 26 illustrates one exemplary method 2600 for detecting an abnormality, such as abnormality 180 (FIG. 1), in an electrical/electrochemical energy unit or device using a plurality of different detection methodologies. Method 2600 may be performed, for example, by abnormality detection system 1100 (FIG. 11) utilizing both sensing of electromagnetic radiation and electrical properties. In another example, method 2600 is performed by abnormality detection system 900 (FIG. 9) in combination with sensors for measuring other properties such as temperature, pressure, humidity, magnetization, magnetic Curie temperature, state of health, state of charge, and/or a combination thereof. In yet another example, method 2600 is performed by abnormality detection system 1000 (FIG. 10) in combination with sensors for measuring other properties such as temperature, pressure, humidity, magnetization, magnetic Curie temperature, state of health, state of charge, and/or a combination thereof.

Method 2600 includes at least two of steps 2610, 2620, and 2630. Method 2600 may perform a combination of steps 2610, 2620, and 2630 in series, parallel, or a combination thereof. In a step 2610, method 2600 performs step 2110 of method 2100 (FIG. 21) to generate a first sensor signal. In a step 2620, a second sensor signal is generated using a sensor that is electrically connected to the electrical/electrochemical energy unit or device under investigation. For example, sensor 1010 (FIGS. 10 and 11) generates a second sensor signal. In a step 2630, a third sensor signal is generated using sensors for sensing properties such as temperature, pressure, humidity, magnetization, magnetic Curie temperature, state of charge, state of health, another state variable (physical, chemical, or physical-chemical), a performance metric, and/or a combination thereof. For example, the third sensor signal is generated by one or more sensors, selected from the group of temperature sensors, pressure sensors, humidity sensors, magnetization sensors, state of health sensors, and/or state of charge sensors, communicatively coupled with processing module 1130 of abnormality detection system 1100 (FIG. 11).

In a step 2640, at least two of the first, second, and third sensor signals are communicated to a processing module. For example, at least two of radiation sensor 910 (FIGS. 9 and 11), electrical sensor 1010 (FIGS. 10 and 11), and one or more sensors, selected from the group of temperature sensors, pressure sensors, humidity sensors, magnetization sensors, state of health sensors, and/or state of charge sensors, communicated sensor signals to processing module 1130 (FIG. 11). In a step 2650, at least two of the first, second, and third sensor signals are processed to identify occurrence, existence, and/or properties of an abnormality in the electrical/electrochemical energy unit or device under investigation. For example, processor 940 (FIGS. 9 and 11) processes at least two of the first, second, and third sensor signals, according to instructions 1160 (FIG. 11), to identify occurrence, existence, and/or properties of an abnormality in electrical/electrochemical energy unit 905 (FIGS. 9 and 11). In certain embodiments, method 2600 is capable of identifying an abnormality in less than 10 milliseconds after occurrence of the abnormality.

In an embodiment, method 2600 includes a step 2660. In step 2660, method 2600 performs step 2140 and, optionally step 2150 of method 2100 (FIG. 21). In one embodiment, method 2600 is executed as a passive abnormality detection method, wherein no signals are applied to the electrical/electrochemical energy unit or device to induce generation of the first, second, and third sensor signals. In another embodiment, method 2600 is executed as a system response based abnormality detection method. In this embodiment, method 2600 further includes a step 2605 performed prior to step 2610, wherein method 2600 performs step 2105 of method 2100 (FIG. 21). The signal may be, for example, an electrical signal, a low-power high-frequency signal with frequency in the range between 1 kilohertz and 10 gigahertz, a magnetic field, or a chemical interaction. For example, transmitter unit 980 (FIGS. 9 and 11) applies a signal to electrical/electrochemical energy unit 905 (FIG. 9) to induce generation of one of more of the first, second, and third sensor signals.

Methods 2100 (FIG. 21), 2200 (FIG. 22), and 2600 (FIG. 26) may be performed according to a combination of passive abnormality detection and system response based abnormality detection, without departing from the scope hereof. In certain embodiments, abnormality detection system 900 (FIG. 9), abnormality detection system 1000 (FIG. 100), and abnormality detection system 1100 (FIG. 11) may utilize transmitter unit 980 (FIG. 9) to perform continuous or regular system response based abnormality detection, while also performing passive abnormality detection. For example, some sensing units may be configured for system response based abnormality detection, while other sensing units are configured for passive abnormality detection. In another example, the same set of sensing units are used for both system response based abnormality detection and passive abnormality detection.

Figure 27:
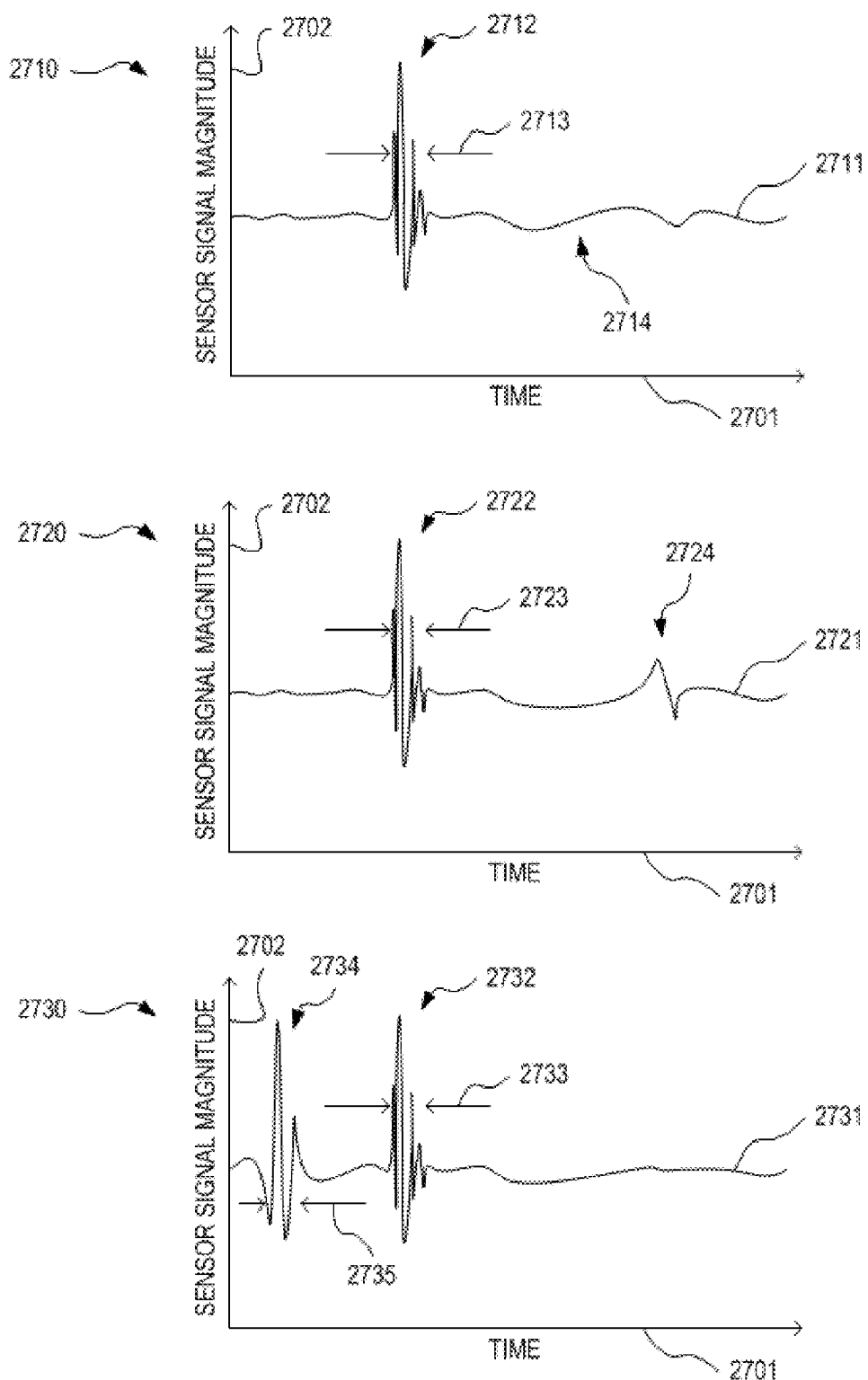
FIG. 27 illustrates isolation of a signal feature indicating the occurrence or existence of an abnormality in an electrical/electrochemical energy unit or device, according to an embodiment.

FIG. 27 illustrates, through exemplary sensor signals, isolation of a signal feature indicating the occurrence or existence of an abnormality in an electrical/electrochemical energy unit or device. Thus, FIG. 27 illustrates an element of step 2130 (FIG. 21) and of step 2650 (FIG. 26).

Diagram 2710 illustrates a sensor signal 2711, plotted as magnitude (2702) of sensor signal 2711 as a function of time (2701). Sensor signal 2711 includes a signal feature 2712, associated with an abnormality in an electrical/electrochemical energy unit or device, and other signal features such as a signal feature 2714. Signal feature 2712 has duration 2713, which is shorter than the duration of signal feature 2714. Additionally, signal feature 2712 spans a relatively large magnitude range and reaches a relatively large absolute magnitude, as compared to other signal features, such as signal feature 2714. Thus signal feature 2712 may be isolated from other signal features, such as signal feature 2714, using criteria such as duration, magnitude, magnitude range, and a combination thereof. In an embodiment, abnormality criteria 966 (FIG. 9) includes such criteria. The criteria may be, for example, a signal strength of at least 2 volts and a pulse duration less than 1 millisecond, less than 10 milliseconds, or less than 100 milliseconds.

Diagram 2720 illustrates a sensor signal 2721, plotted as magnitude (2702) of sensor signal 2721 as a function of time (2701). Sensor signal 2721 includes a signal feature 2722, associated with an abnormality in an electrical/electrochemical energy unit or device, and other signal features such as a signal feature 2724. Signal feature 2722 has duration 2723, which is similar to the duration of signal feature 2724. However, signal feature 2722 spans a relatively large magnitude range and reaches a relatively large absolute magnitude, as compared to other signal features, such as signal feature 2724. Thus signal feature 2722 may be isolated from other signal features, such as signal feature 2724, using criteria such as magnitude, magnitude range, and a combination thereof. In an embodiment, abnormality criteria 966 (FIG. 9) includes such criteria.

Diagram 2730 illustrates a sensor signal 2731, plotted as magnitude (2702) of sensor signal 2731 as a function of time (2701). Sensor signal 2731 includes two signal features 2732 and 2734, associated with an abnormality in an electrical/electrochemical energy unit or device, and other signal features not labeled in FIG. 27. Signal feature 2732 has duration 2733, and signal feature 2734 has duration 2735 which is similar to duration 2733. Both of signal features 2732 and 2734 span a relatively large magnitude range and reach a relatively large absolute magnitude, as compared to other signal features. Thus signal features 2732 and 2734 may be isolated from other signal features using criteria such as magnitude, magnitude range, and a combination thereof. In an embodiment, abnormality criteria 966 (FIG. 9) includes such criteria.

Other criteria for isolating a signal feature associated with an abnormality in an electrical/electrochemical energy unit or device may be used and/or included in abnormality criteria 966 (FIG. 9) without departing from the scope hereof. For example, criteria may include one or more of frequency of high-frequency modulation within a feature, number or repetitive features, the feature being non-repetitive, waveform of feature, rise-time, sign, and/or a combination thereof.

Figure 28:
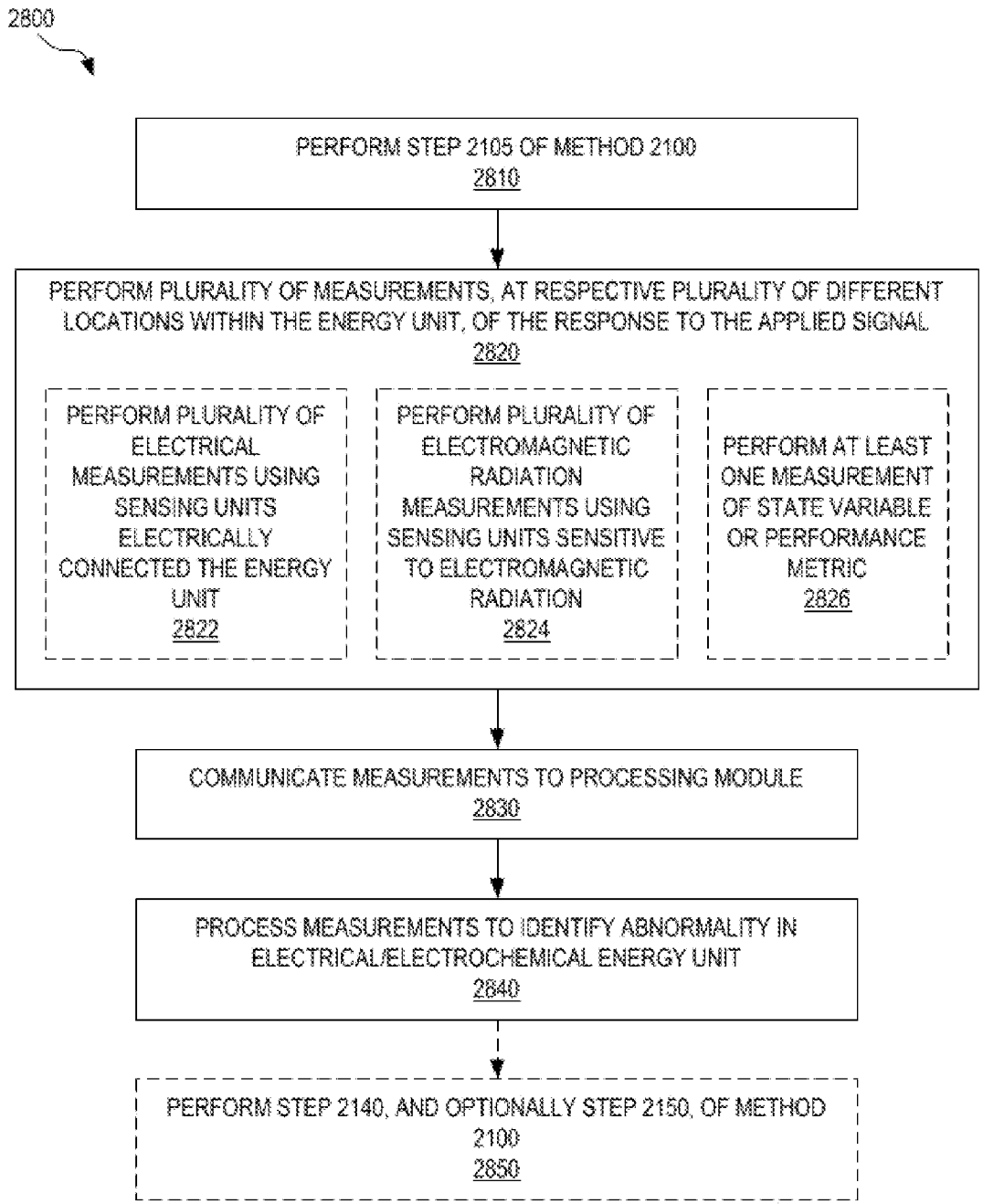
FIG. 28 illustrates a method for detecting an abnormality in an electrical/electrochemical energy unit or device, utilizing a plurality of sensors to perform a system response measurement, according to an embodiment.

FIG. 28 illustrates one exemplary method 2800 for detecting an abnormality, such as abnormality 180 (FIG. 1), in an electrical/electrochemical energy unit or device, utilizing a plurality of sensors to perform a system response measurement. Method 2800 is performed, for example, by abnormality detection system 900 (FIG. 9), abnormality detection system 1000 (FIG. 10), or abnormality detection system 1100 (FIG. 11).

In a step 2810, method 2800 performs step 2105 of method 2100 (FIG. 21). In one example, transmitter unit 980 (FIG. 9) transmits an electrical signal to an electrical/electrochemical energy unit or device. In another example, transmitter unit 980 (FIG. 9) transmits a signal in form of electromagnetic radiation to an electrical/electrochemical energy unit or device. In a step 2820, a plurality of measurements, of the response to the signal applied in step 2810, are performed at a plurality of different locations within the electrical/electrochemical energy unit or device. For example, abnormality detection system 1100 (FIG. 11) performs a plurality of system response measurements using sensing units 915 (FIGS. 9 and 11) and or sensing units 1015 (FIGS. 10 and 11) position in a plurality of different locations within electrical/electrochemical energy unit 905 (FIGS. 9 and 11). Optionally, abnormality detection system 1100 (FIG. 11) further utilizes sensors for measuring temperature, pressure, humidity, magnetization, magnetic Curie temperature, state of health, state of charge, and/or a combination thereof. In certain embodiments of method 2800, step 2810 is performed by at least a portion of the sensors or sensing units used to perform step 2820. This embodiment corresponds to transmitter unit 980 (FIGS. 9, 10, and 11) including one or more of sensing units 915 (FIGS. 9 and 11) and 1015 (FIGS. 10 and 11).

In one embodiment, step 2820 includes a step 2822, wherein a plurality of electrical measurements are performed, using sensing units electrically connected to the energy unit. For example, abnormality detection system 1000 (FIG. 10) performs a plurality of system response measurements using sensing units 1015 (FIG. 10) position in a plurality of different locations within electrical/electrochemical energy unit 905 (FIGS. 9 and 10). In this embodiment, all of method 2800 may be performed by abnormality detection system 1000 (FIG. 10). In another embodiment, step 2820 includes a step 2824, wherein a plurality of measurements of electromagnetic radiation is performed using sensing units sensitive to electromagnetic radiation. For example, abnormality detection system 900 (FIG. 9) performs a plurality of system response measurements using sensing units 915 (FIG. 9) position in a plurality of different locations within electrical/electrochemical energy unit 905 (FIG. 9). In this embodiment, all of method 2800 may be performed by abnormality detection system 900 (FIG. 9). In yet another embodiment, step 2820 includes a step 2826 in addition to one or both of steps 2822 and 2824. In step 2826, at least one measurement of a state variable and/or performance metric of the energy unit is performed. The state variable and/or performance metric includes, for example, temperature, pressure, humidity, magnetization, magnetic Curie temperature, state of charge, state of health, and/or a combination thereof. For example, such measurements may be performed by one or more sensors, selected from the group of temperature sensors, pressure sensors, humidity sensors, magnetization sensors, state of health sensors, and/or state of charge sensors, communicatively coupled with processing module 1130 of abnormality detection system 1100 (FIG. 11). In yet another embodiment, step 2820 includes an embodiment of step 2826, wherein the at least one measurement is a plurality of measurements. In a further embodiment, step 2820 includes one or more of steps 2822, 2824, and 2826. In this embodiment, all of method 2800 may be performed by abnormality detection system 1100 (FIG. 11).

In a step 2830, measurements performed in step 2820 are communicated to a processing module. For example, sensor 1010 (FIGS. 10 and 11) communicates the measurements to processing module 1030 (FIG. 10) or processing module 1130 (FIG. 11) via interface 1020 (FIGS. 10 and 11). In a step 2840, the measurements generated in step 2820 are processed to identify occurrence, existence, and/or properties of an abnormality in an electrical/electrochemical energy unit or device. For example, processor 940 (FIGS. 9, 10, and 11) processes the measurement according to instructions 960 (FIG. 9), 1060 (FIG. 10), or 1160 (FIG. 11) to identify occurrence, existence, and/or properties of an abnormality in electrical/electrochemical energy unit 905 (FIGS. 9, 10, and 11). In certain embodiments, method 2800 is capable of identifying an abnormality in less than 10 milliseconds after occurrence of the abnormality. In an embodiment, method 2800 further includes a step 2850, wherein method 2800 performs step 2140, and optionally step 2150, of method 2100 (FIG. 21).

Figure 29:
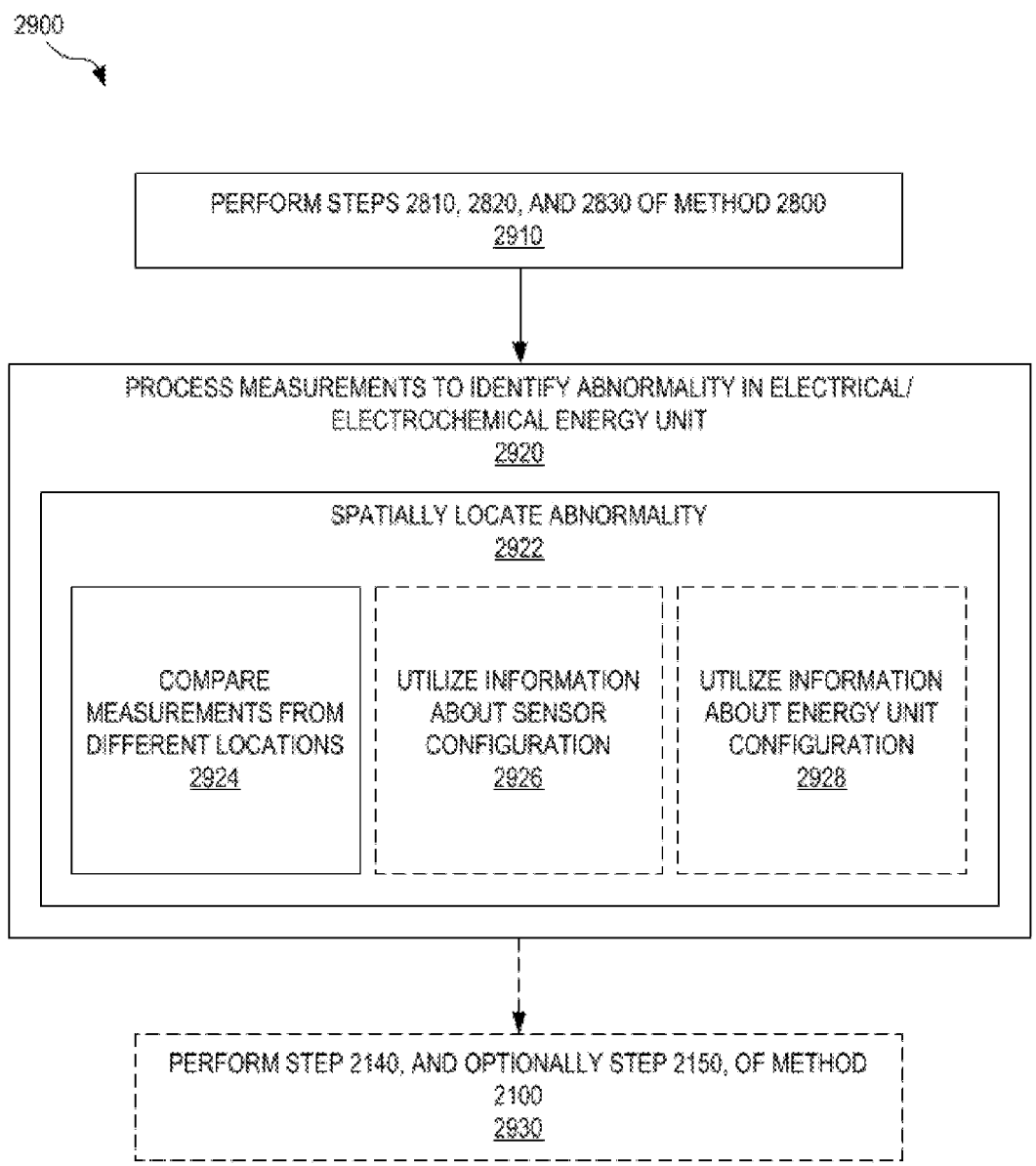
FIG. 29 illustrates a method for detecting and spatially locating an abnormality in an electrical/electrochemical energy unit or device, utilizing a plurality of sensors to perform a system response measurement, according to an embodiment.

FIG. 29 illustrates one exemplary method 2900 for detecting and spatially locating an abnormality, such as abnormality 180 (FIG. 1), in an electrical/electrochemical energy unit or device, utilizing a plurality of sensors to perform a system response measurement. Method 2900 is performed, for example, by abnormality detection system 900 (FIG. 9), abnormality detection system 1000 (FIG. 10), or abnormality detection system 1100 (FIG. 11). In a step 2910, method 2900 performs steps 2810, 2820, and 2830 of method 2800 (FIG. 28).

In a step 2920, the measurements generated in step 2910 are processed to identify occurrence, existence, and/or properties of an abnormality in an electrical/electrochemical energy unit or device. Step 2920 is an embodiment of step 2840 of method 2800 (FIG. 28), which further includes a step 2922. In step 2922, the abnormality is spatially located. For example, processor 940 (FIGS. 9 and 10) processes, according to instructions 1060 (FIG. 9), the sensor signal generated in step 2910 to spatially located the abnormality. In an embodiment, step 2922 includes at a step 2924, and, optionally, one or both of steps 2926 and 2928. In step 2924, measurements performed in different locations in step 2910 are compared. In optional step 2926, information about the configuration of sensors used in step 2910 is utilized. In optional step 2928 information about the configuration of the electrical/electrochemical energy unit or device under consideration is utilized. For example, processor 1040 (FIG. 10) compares, according to instructions 1060 (FIG. 10), measurements associated with different locations and generated in step 2910 to spatially locate an abnormality in electrical/electrochemical energy unit 905 (FIGS. 9 and 10). Processor 940 (FIGS. 9 and 10) may retrieve one or more of Maxwell's equations, the wave equation, the Larmor formula, Ohm's law, Kirchhoff's circuit laws, and battery equations including thermodynamics and kinetics from instructions 960 (FIG. 9), to deduce the spatial location of the abnormality. Optionally, processor 940 (FIGS. 9 and 10) retrieves one or both electrical sensor configuration 1064 (FIG. 10) and energy unit configuration 962 (FIGS. 9 and 10) to account for spatial configurations and other properties of one or more of sensor 1010 (FIG. 10) and electrical/electrochemical energy unit 905 (FIGS. 9 and 10), respectively. In certain embodiments, method 2900 is capable of identifying and spatially locating an abnormality in less than 10 milliseconds after occurrence of the abnormality.

In an embodiment, method 2900 further includes a step 2930, wherein method 2900 performs step 2140, and optionally step 2150, of method 2100 (FIG. 21).

Methods 2100 (FIG. 21), 2200 (FIG. 22), 2300 (FIG. 23), 2400 (FIG. 24), 2500 (FIG. 25), 2600 (FIG. 26), 2800 (FIG. 28), and 2900 (FIG. 29) may be performed, for example, during operation, manufacture, or testing of an electrical/electrochemical energy device, unit, or system.

The invention may be further understood by the following non-limiting examples.

EXAMPLE 1

Electromagnetic Emission from Battery Cells

Figure 30:
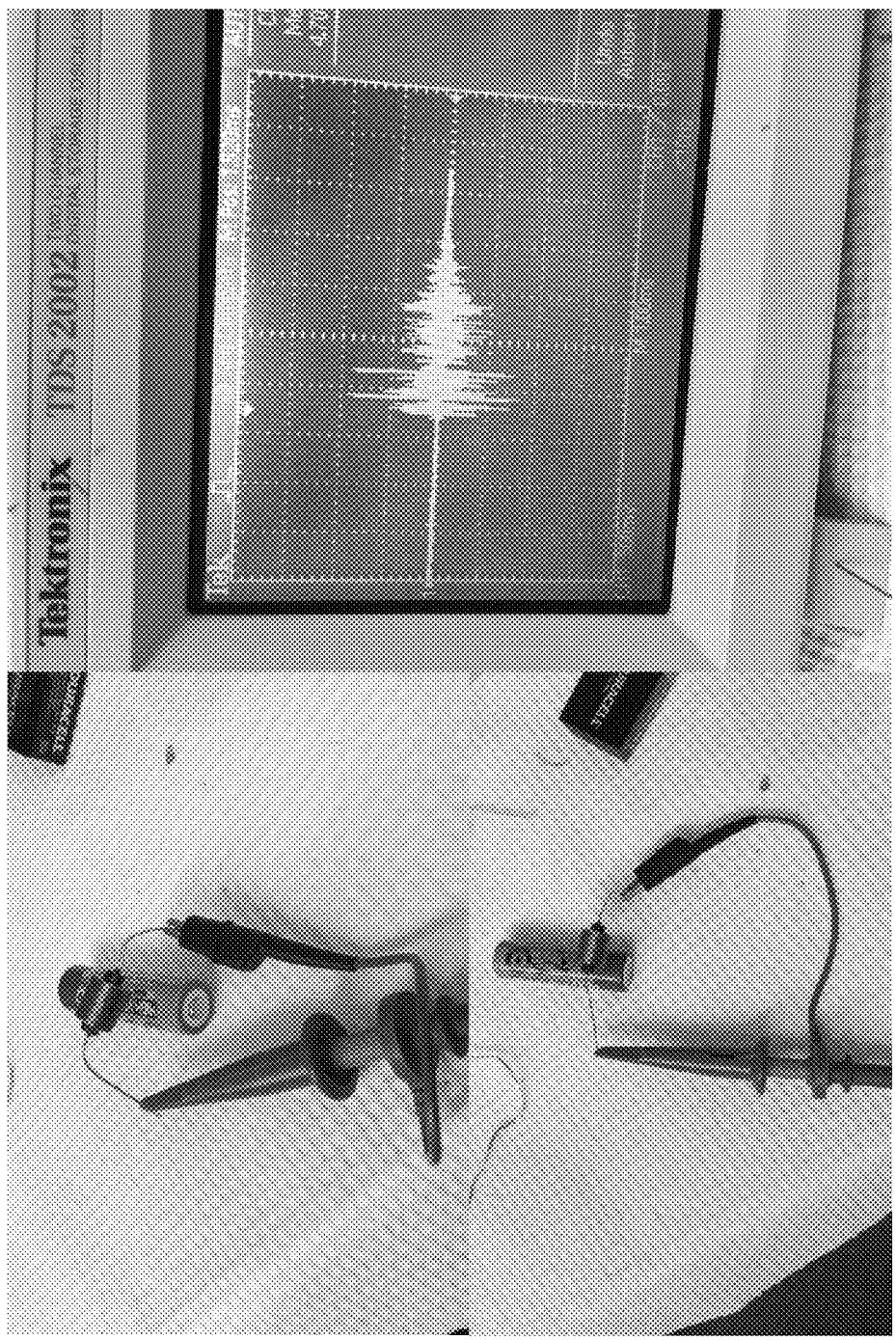
FIG. 30 depicts photographs showing experimental conditions and observations using methods of the invention.

Experiment 1. A nickel zinc (NiZn) battery was positioned adjacent to a single inductor with the inductor's terminals connected to an oscilloscope (FIG. 30, left panels). A short was created in the battery cell between the anode and the cathode and signals detected by the inductor were visualized using the oscilloscope (FIG. 30, right panel). A series of peaks were detected over a duration of less than 10 milliseconds.

Figure 31:
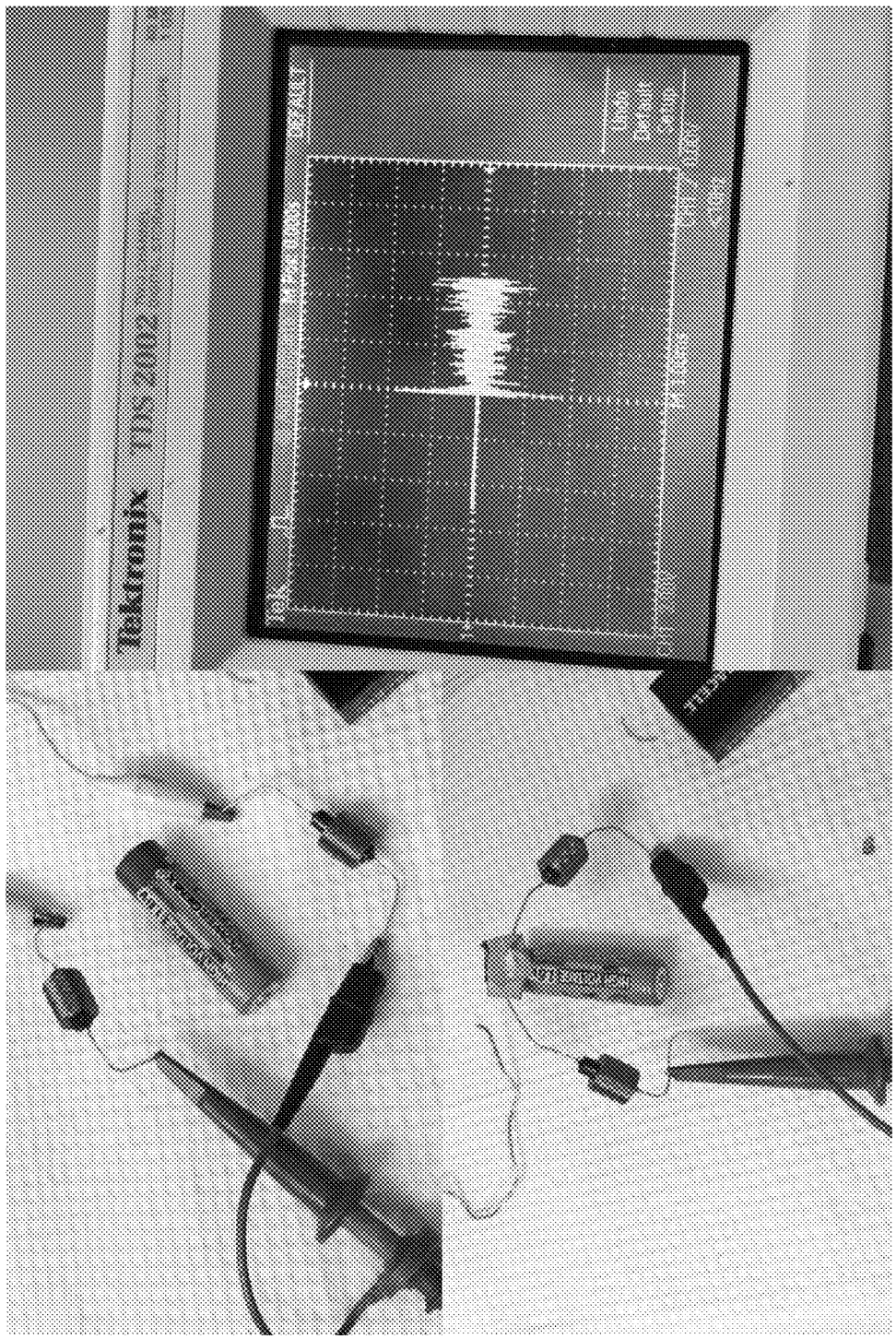
FIG. 31 depicts photographs showing experimental conditions and observations using methods of the invention.

Experiment 2. A nickel zinc (NiZn) battery was positioned adjacent to two inductors wired in series with the terminal ends of the inductor series connected to an oscilloscope (FIG. 31, left panels). A short was created in the battery cell between the anode and the cathode and signals detected by the inductors were visualized with the oscilloscope (FIG. 31, right panel). A series of peaks were detected over a duration of less than 5 milliseconds.

Figure 32:
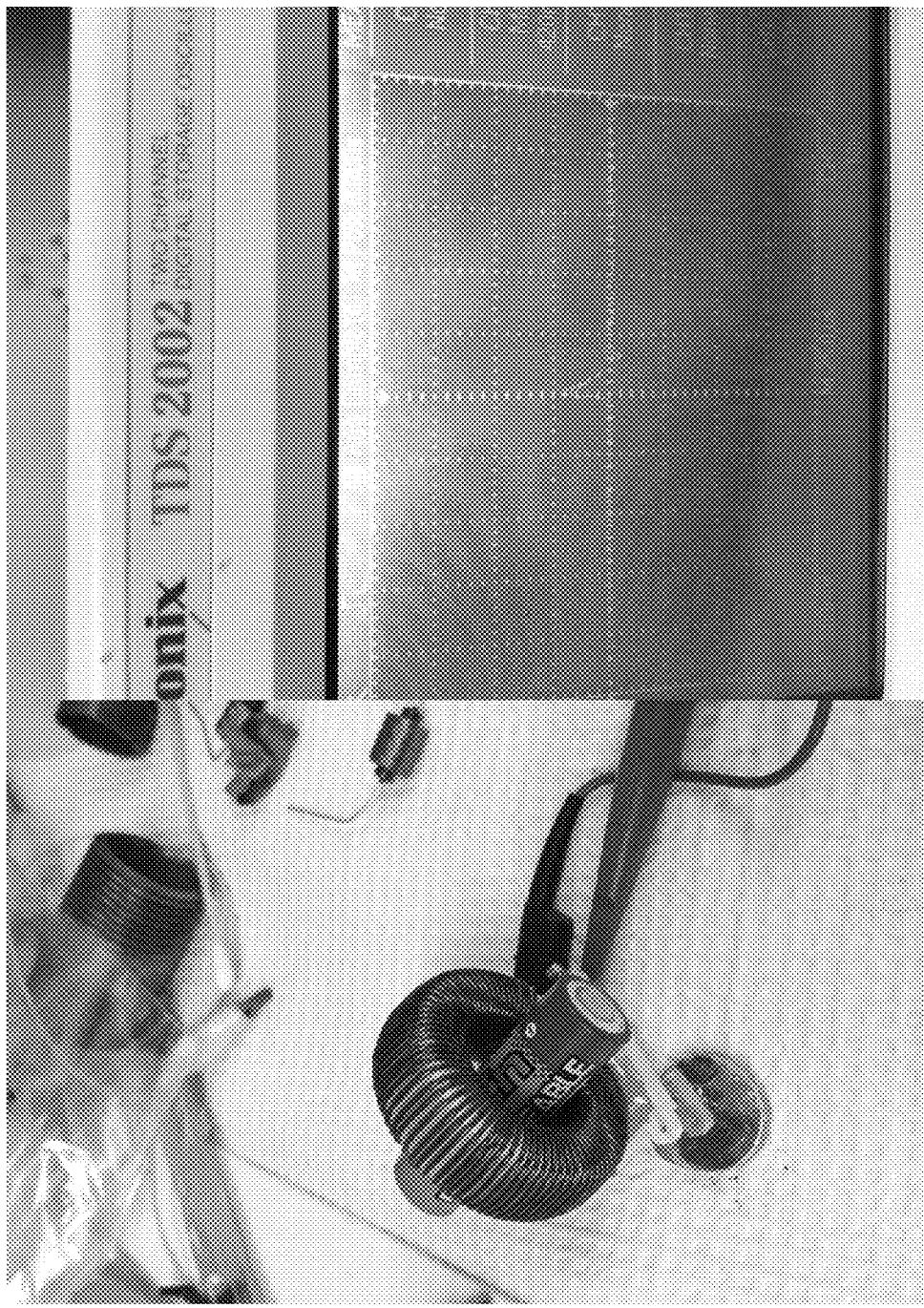
FIG. 32 depicts photographs showing experimental conditions and observations using methods of the invention.

Experiment 3. A nickel zinc (NiZn) battery was positioned inside the center of a wound toroid with the toroid terminals connected to an oscilloscope (FIG. 32, left panel). A short was created in the battery cell between the anode and the cathode and signals detected by the toroid were visualized with the oscilloscope (FIG. 32, right panel). Signals were detected over a duration of less than 25 microseconds.

Figure 33:
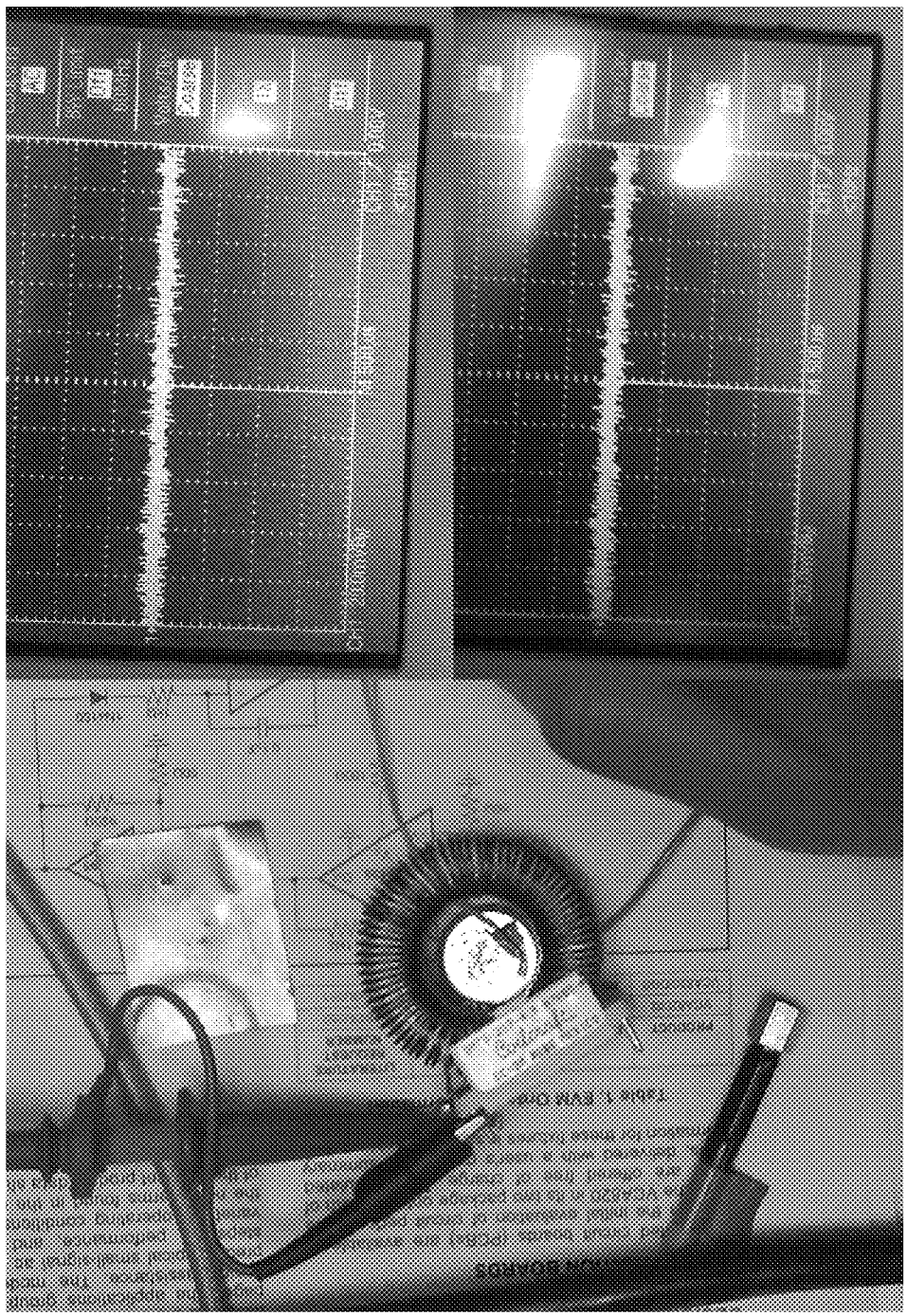
FIG. 33 depicts photographs showing experimental conditions and observations using methods of the invention.

Experiment 4. A coin cell battery was positioned inside the center of a wound toroid with the toroid terminals connected to an oscilloscope (FIG. 33, left panel). A short was created in the battery cell between the anode and the cathode and signals detected by the toroid were visualized with the oscilloscope (FIG. 33, right panels). Signals were detected over a duration of less than 0.5 milliseconds.

Figure 34:
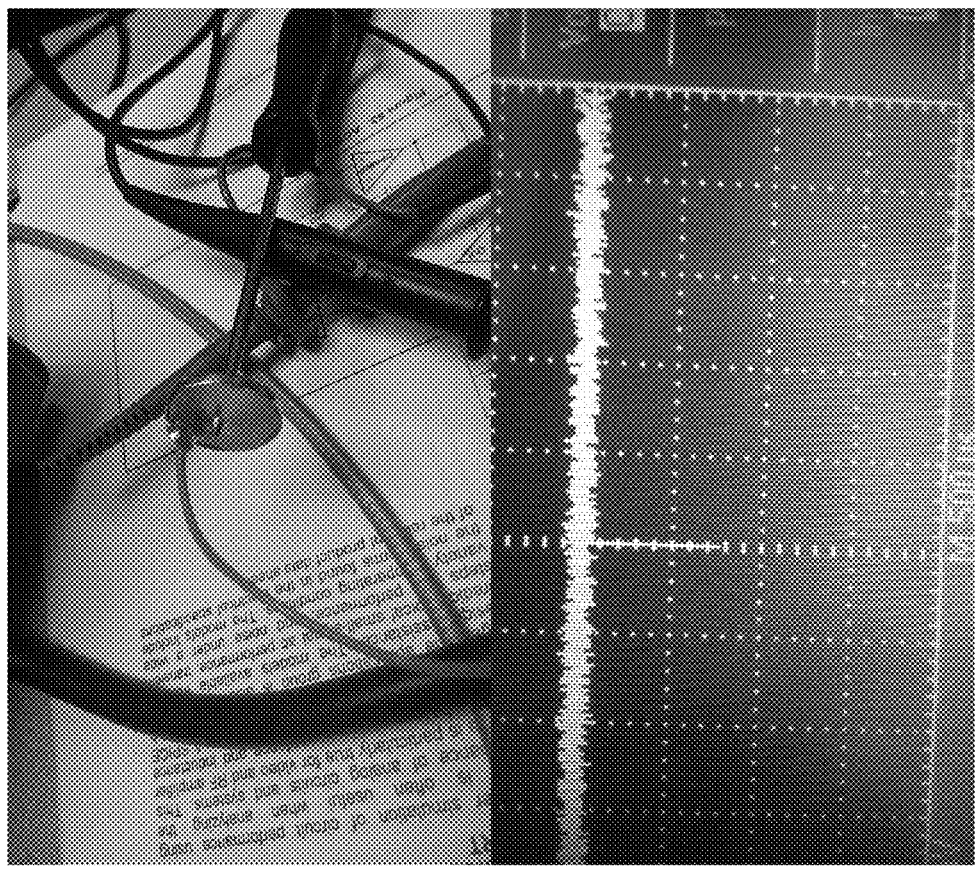
FIG. 34 depicts photographs showing experimental conditions and observations using methods of the invention.

Experiment 5. A coin cell battery was positioned adjacent to an inductor with the inductor terminals connected to an oscilloscope (FIG. 34, top panel). An internal short was created in the coin cell by puncturing the cell and the signals detected by the inductor were visualized with the oscilloscope (FIG. 34, bottom panel). Signals were detected over a duration of less than 0.5 milliseconds.

EXAMPLE 2

Detection of Shorts in Electrical Equipment

This example describes detection of shorts in electrical equipment, such as circuits or wires or other electronics, or in electrochemical systems, such as batteries such as lithium based batteries or alkaline batteries or zinc batteries or nickel batteries or electrochemical capacitors or capacitors, by means of measuring changes in voltage, electromagnetic field or current by time (dVolt/dtime, dAmp/dtime). The time of change can be very short such as a few milliseconds or shorter even microseconds. The changes in the fields can be large such as 100% or more. In some cases voltage changes as large as twice the normal voltage in a millisecond can be observed due to an electronic short, a good example is a small short between two layers of electrodes in an 18650 lithium ion cell. The observed voltage change or current change can show also in the form of change in electromagnetic field in the environment, for example a conductive coil such as copper coil located a meter away from an 18650 lithium ion cell can show induced voltage of up to 10 volts for a about a millisecond. A device to measure changes of the voltage, current or electromagnetic field in milliseconds or shorter, even if not directly connected to the electrochemical or electrical system can help identify an electronic short. For example, a detector outside of a battery pack/module whether electronically connected or not to the battery pack/module can help identify a small short in one or more of the battery cells in the pack/module, and thus give enough time to the battery management unit or the user to safely control the situation, for example by draining the specified cell or cells or by applying coolants or fire extinguishers or $CO_2$ gas or other measures to the pack/module.

Different types of shorts can occur in a battery cell. The most dangerous short usually happens between the current collectors in a large cell. As an example a short between aluminum cathode current collector and copper anode current collector in a 20 Ah prismatic li-ion cell can result in a short of resistance R~10 mOhm and the short current of I~300 A, and the temperature may rise to up to 800 Celsius in just 10 seconds. On the other hand a short between anode and cathode in the same cell results in R~20 ohms and I~0.2 A, and the temperature rises to only 5 Celsius in 20 minutes. A short between aluminum current collector and the anode will be R~2 ohms and I~2 A, and the temperature rises to 250 Celsius in one hour. Thus, one of the most dangerous cases of shorting happens between the opposite current collectors and is very difficult to detect by conventional direct methods such as looking at the total current and voltage of the cell or the temperature on the outside of the cell. As an example, in the a 20 Ah cell, it may take up to one minute for the temperature of the cell to reach the temperature of the shorted area, several hundreds of Celsius degrees, which is clearly too late to prevent the possible catastrophic failure.

Instead of just a short, a detectable abnormality can also be a major change in the state of health. A battery that is dying responds very differently to an electric signal, which shows itself in the induced electromagnetic radiation, and can be detected by the electromagnetic sensors described herein. On the other hand, state of art methods can't detect the location or even presence of a cell having a low or degrading state of health in a system because the parallel and series connections to other healthy cells compensate the response. This is a major advantage of using the methods disclosed herein. As an example, in one embodiment an electric signal is sent in the network, directly; then the response on the direct measuring unit may not show any measurable abnormality, as the healthy cells provide the extra voltage or current. But the signal generates an electromagnetic radio, when passing through the unhealthy cell that has a different signature from healthy cells and can be detected. Detection of the presence of unhealthy cells in the system results in longer cycle life and better safety. In addition to the indirect methods described herein using sensors, such as pickup coils, to detect electromagnetic radiation emitted by electric and electromagnetic devices and systems, such as those comprising electrochemical cells or other power generation devices, direct methods can be applied where the terminals of an electric or electromagnetic device is monitored as an external signal is applied to the device. In one example, an external signal is applied radiatively to a device, such as by a transmitter. In another example, an external signal is applied directly to a device, such as by applying a voltage or current across the terminals of the device. For embodiments where the terminals of a device are directly monitored, time domain reflectrometry can be utilized for analyzing the signals generated by the devices in response to an applied signal. In addition to monitoring temperature and electrical properties, magnetic properties of the electric and electromagnetic devices and systems can also be monitored, such as the magnetic susceptibility and/or magnetic Curie temperature, in order to detect abnormalities in the devices.

EXAMPLE 3

Detection of Abnormality in Electric Vehicle Power Systems

This example describes use of the methods and devices of the invention for monitoring and detecting abnormalities in Electric Vehicle Power Systems. In general, electric vehicles utilize battery packs comprising individual battery cells or modules wired in series and/or in parallel. In this example, the entire battery pack of the vehicle is considered as a network. In one method embodiment of the invention, electromagnetic field meters, such as inductors are placed in two series: one series of larger receivers are placed in a three dimensional array between or around, in the case of a toroid inductor, individual prismatic batteries or modules of cells, such as modules comprising a plurality of 18650 cells; a second series of receivers are placed on the 6 sides of each of box-shaped battery cells. This latter series of inductors optionally comprise one or more inductor coils on each surface of each battery cell to allow further refinement and characterization of the battery systems.

STATEMENTS REGARDING INCORPORATION BY REFERENCE AND VARIATIONS

All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

All patents and publications mentioned in the specification are indicative of the levels of skill of those skilled in the art to which the invention pertains. References cited herein are incorporated by reference herein in their entirety to indicate the state of the art, in some cases as of their filing date, and it is intended that this information can be employed herein, if needed, to exclude (for example, to disclaim) specific embodiments that are in the prior art. For example, when a compound is claimed, it should be understood that compounds known in the prior art, including certain compounds disclosed in the references disclosed herein (particularly in referenced patent documents), are not intended to be included in the claim.

When a group of substituents is disclosed herein, it is understood that all individual members of those groups and all subgroups and classes that can be formed using the substituents are disclosed separately. When a Markush group or other grouping is used herein, all individual members of the group and all combinations and subcombinations possible of the group are intended to be individually included in the disclosure. As used herein, "and/or" means that one, all, or any combination of items in a list separated by "and/or" are included in the list; for example "1, 2 and/or 3" is equivalent to "'1' or '2' or '3' or '1 and 2' or '1 and 3' or '2 and 3' or '1, 2 and 3'".

Every formulation or combination of components described or exemplified can be used to practice the invention, unless otherwise stated. Specific names of materials are intended to be exemplary, as it is known that one of ordinary skill in the art can name the same material differently. One of ordinary skill in the art will appreciate that methods, device elements, starting materials, and synthetic methods other than those specifically exemplified can be employed in the practice of the invention without resort to undue experimentation. All art-known functional equivalents, of any such methods, device elements, starting materials, and synthetic methods are intended to be included in this invention. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

We claim:

1. A method for abnormality detection in an energy unit, comprising:
    passively detecting an abnormality in an energy unit by detecting with at least one pickup coil an electromagnetic signal generated by the abnormality, the energy unit comprising at least one of an electrical energy unit and an electrochemical energy unit.

2. The method of claim 1, the step of detecting the electromagnetic signal comprising:
    generating, in the at least one pickup coil, a sensor signal in response to the electromagnetic signal; and
    processing the sensor signal to isolate a signal feature indicative of the abnormality in the energy unit.

3. The method of claim 1,
    the electromagnetic signal being generated by the abnormality upon occurrence of the abnormality; or
    the step of passively detecting the abnormality comprising passively detecting the abnormality in less than 10 milliseconds after occurrence of the abnormality.

4. The method of claim 1, each of the electrical energy unit and the electrochemical energy unit comprising at least one of an energy storage system and an energy harnessing system.

5. The method of claim 1, the energy unit comprising at least one of an electrochemical cell, a capacitor cell, an ultra-capacitor cell, a flow battery, and a fuel cell.

6. The method of claim 1, the step of passively detecting the abnormality comprising passively detecting a short in an energy storage device in the energy unit.

7. The method of claim 2, the signal feature being one or more pulses, each having duration less than 10 milliseconds.

8. The method of claim 1,
the at least one pickup coil being a plurality of pickup coils at a plurality of respective different locations;
the step of passively detecting the abnormality comprising sensing electromagnetic signals with the plurality of pickup coils at the plurality of respective different locations to generate a respective plurality measurements; and
the method further comprising spatially locating the abnormality by comparing the plurality of measurements.

9. The method of claim 8, the step of sensing comprising measuring magnitude of the electromagnetic signals at the plurality of different locations.

10. The method of claim 1, further comprising:
communicating detection of the abnormality to a control unit for the energy unit; and
invoking a control measure to at least a portion of the energy unit associated with the abnormality.

11. An energy storage system with abnormality detection capability, comprising:
at least one energy storage device for generating electricity from stored energy, the stored energy being at least one of electrical energy and chemical energy; and
a least one pickup coil for generating a sensor signal in response to an electromagnetic signal passively generated by an electrical abnormality in the energy storage system.

12. The method of claim 1, the step of passively detecting comprising using at least one planar pickup coil to detect the electromagnetic signal.

13. The method of claim 1, the step of passively detecting comprising detecting the electromagnetic signal using a plurality of pickup coils cooperatively sensitive to electromagnetic signal generated from electrical current of arbitrary direction.

14. The method of claim 13, the step of passively detecting comprising using at least one non-planar pickup coil to detect the electromagnetic signal.

15. The method of claim 1, the step of passively detecting comprising detecting the electromagnetic signal via magnetic induction in the at least one pickup coil.

16. The method of claim 1, the pickup coil including a two-terminal electrical component, the electromagnetic signal including a temporally varying magnetic field, the step of passively detecting comprising detecting the electromagnetic signal via detection of an electrical current produced in the two-terminal electrical component when subject to the temporally varying magnetic field.

17. The method of claim 16, the two-terminal electrical component including an electrically conductive wire shaped to form at least a portion of a loop between the two terminals.

18. The method of claim 17, the electrically conductive wire being shaped to form at least one complete loop between the two terminals.

19. The method of claim 18, the electrically conductive wire being shaped to form a plurality of loops between the two terminals.

* * * * *